United States Patent [19]
Matsuyama et al.

[11] Patent Number: 6,072,117
[45] Date of Patent: Jun. 6, 2000

[54] PHOTOVOLTAIC DEVICE PROVIDED WITH AN OPAQUE SUBSTRATE HAVING A SPECIFIC IRREGULAR SURFACE STRUCTURE

[75] Inventors: Jinsho Matsuyama, Kyoto-fu; Koichi Matsuda, Nara, both of Japan

[73] Assignee: Canon Kabushiki Kaisha, Tokyo, Japan

[21] Appl. No.: 08/806,315

[22] Filed: Feb. 26, 1997

[30] Foreign Application Priority Data

Feb. 27, 1996 [JP] Japan .................................. 8-039856

[51] Int. Cl.⁷ .................................................. H01L 25/00
[52] U.S. Cl. ........................................................ 136/256
[58] Field of Search ............................................. 136/256

[56] References Cited

U.S. PATENT DOCUMENTS

| | | | |
|---|---|---|---|
| 4,532,372 | 7/1985 | Nath et al. | 136/256 |
| 4,571,448 | 2/1986 | Barnett | 136/256 |
| 4,598,306 | 7/1986 | Nath et al. | 357/30 |

FOREIGN PATENT DOCUMENTS

| | | | |
|---|---|---|---|
| 59-0043101 | 10/1984 | Japan . | |
| 60-84888 | 5/1985 | Japan . | H01L 31/04 |
| 60-0041878 | 9/1985 | Japan . | |
| 62-0147883 | 7/1987 | Japan . | |
| 3-0205879 | 9/1991 | Japan . | |

OTHER PUBLICATIONS

The 3rd Photovoltaic Science and Engineering Conference in Japan 1982; Japanese Journal of Applied Physics, vol. 21 (1982), Supplement 21–2, pp. 287–290, T. Fukatsu et al., "Effects of Substrate Surface Condition on a–Si Photovoltaic Characteristics".

Sixteenth IEEE Photovoltaic Specialists Conference–1982, Sep. 27–30, 1982, pp. 1423–1424, T. Tiedje et al., "Enhanced Optical Absorpiton Produced By Light Trapping In Amorphous Silicon Films".

Sixteenth IEEE Photovoltaic, Specialists Conference–1982, Sep. 27–30, 1982, pp. 1425–1426, H. Deckman et al., "Optical Enhancement Of a–Sih Solar Cells".

Applied Physics Letters, vol. 43, No. 7, Oct. 1, 1983, Y. Hamakawa et al., "New Types Of High Efficiency Solar Cells Based On a–Si", pp. 644–646.

*Primary Examiner*—Mark Chapman
*Attorney, Agent, or Firm*—Fitzpatrick, Cella, Harper & Scinto

[57] ABSTRACT

A photovoltaic device comprising an opaque substrate having an irregular surface structure comprising a plurality of linear irregularities or recesses arranged therein and a photoelectric conversion layer formed on said irregular surface structure of said substrate, wherein said plurality of linear irregularities or recesses have a center line average roughness Ra(X) of 15 nm to 300 nm when scanned in a direction parallel to the linear irregularities or recesses, a center line average roughness Ra(Y) of 20 nm to 600 nm when scanned in a direction perpendicular to the linear irregularities or recesses, and a Ra(X)/Ra(Y) ratio of 0.8 or less.

43 Claims, 9 Drawing Sheets

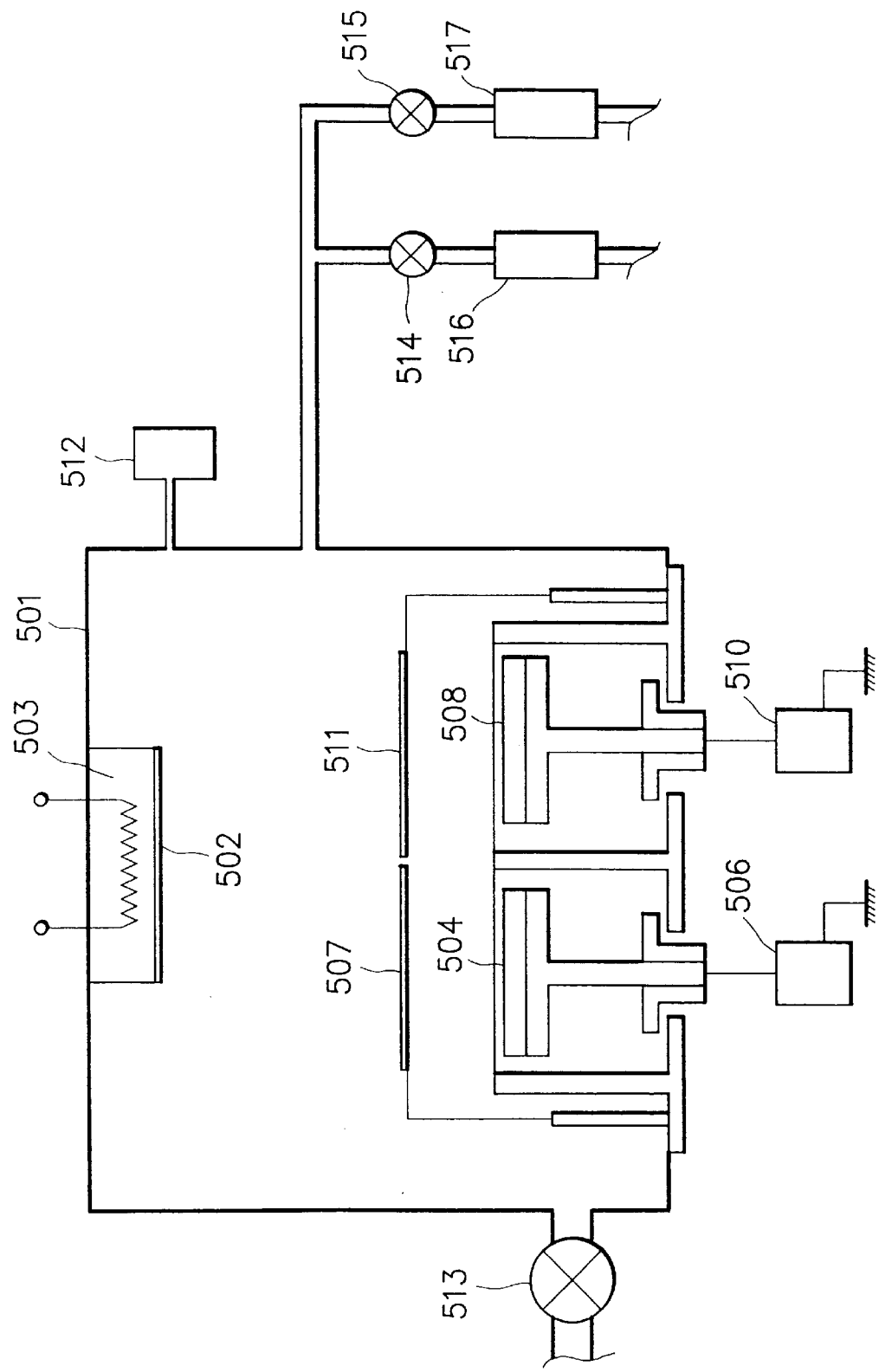

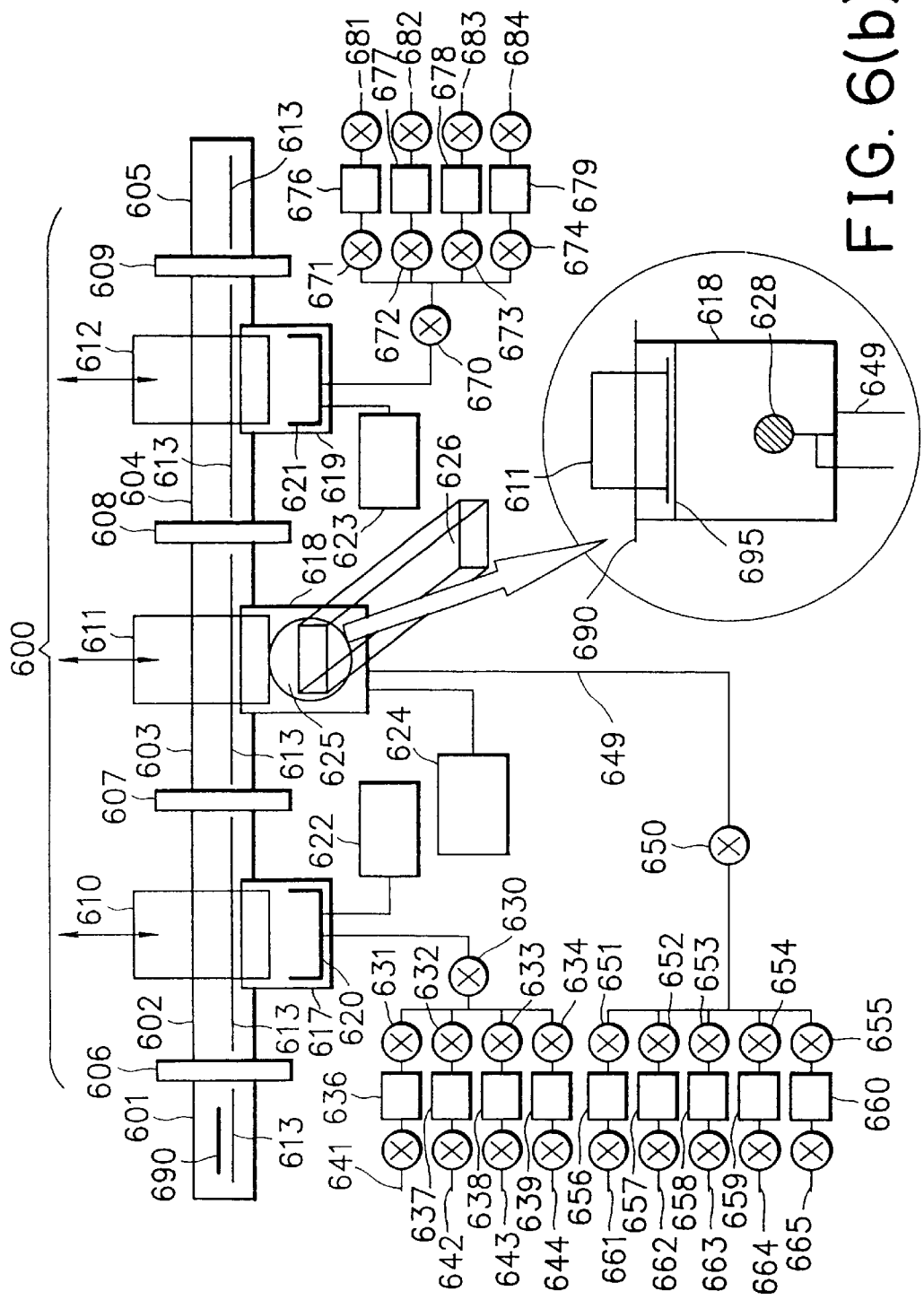

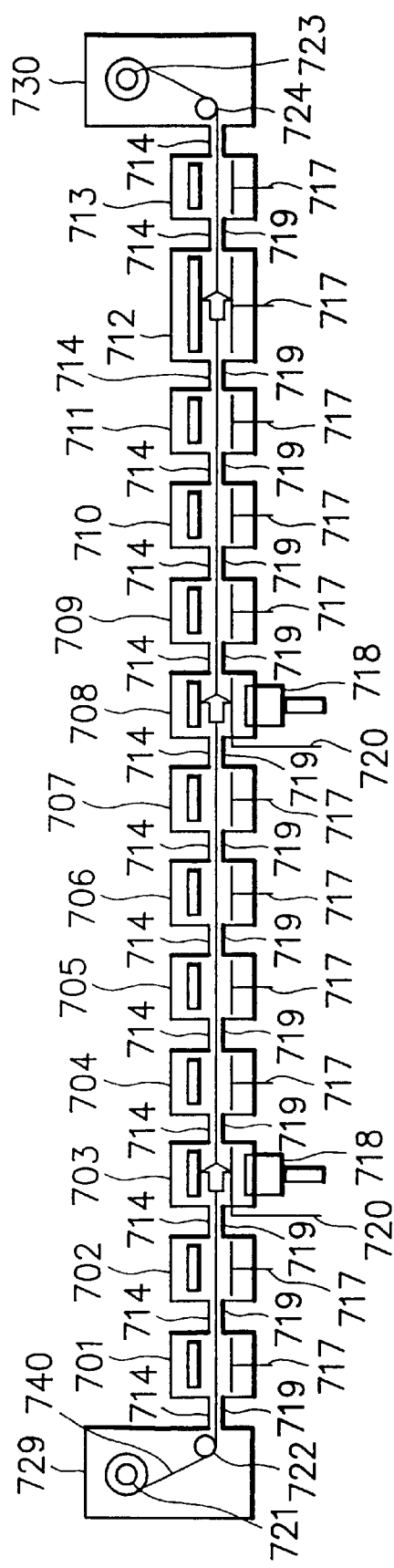
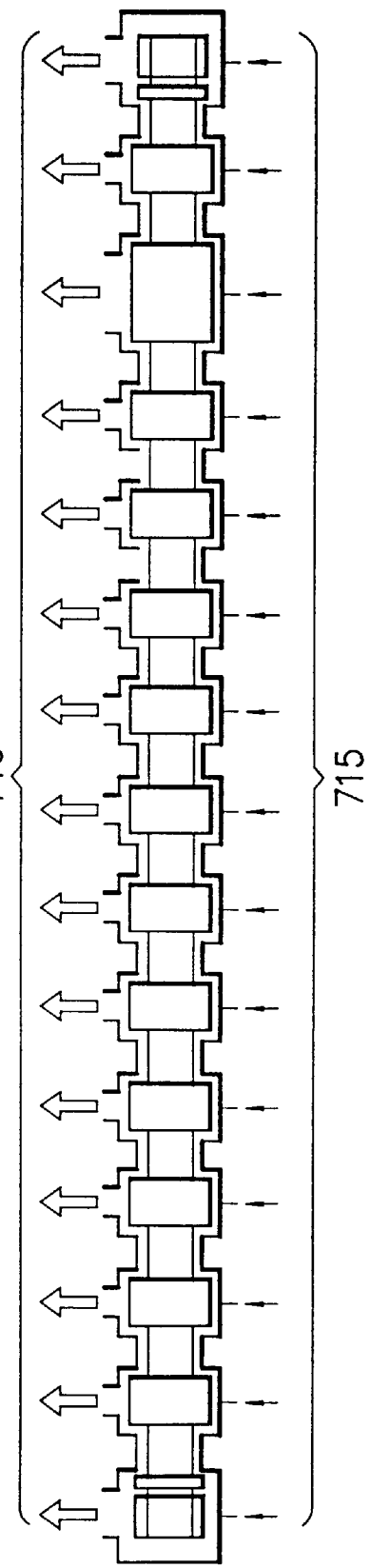
FIG. 7(a)
FIG. 7(b)

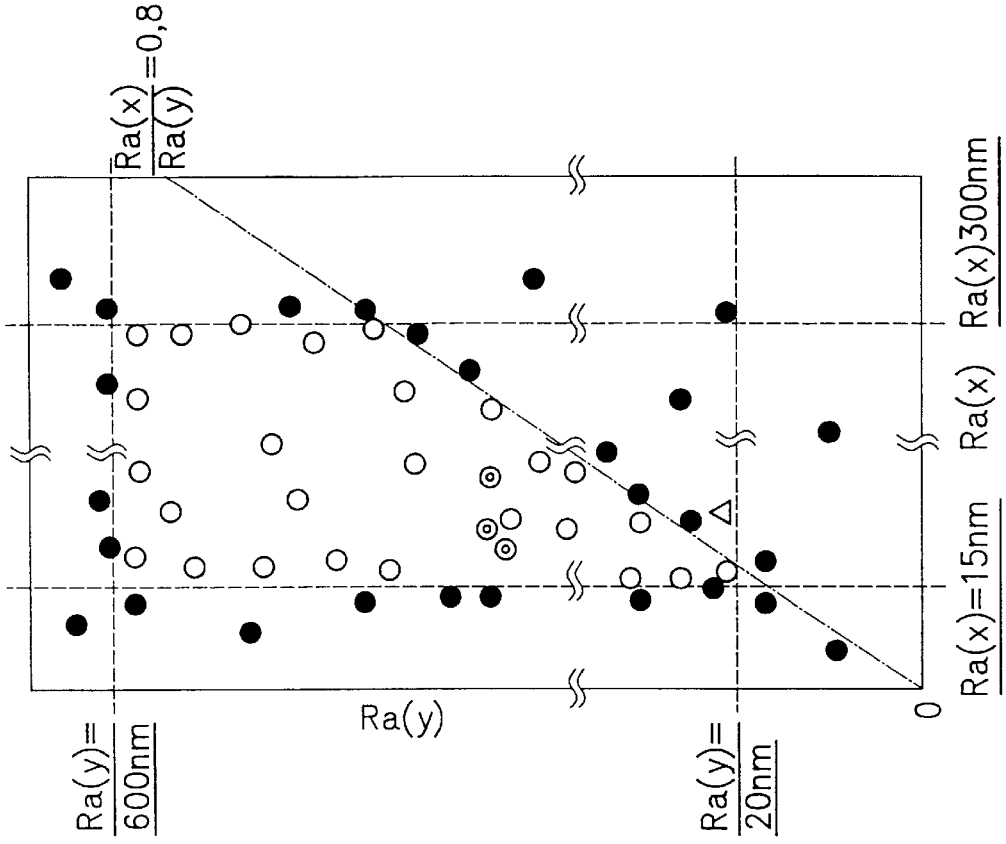
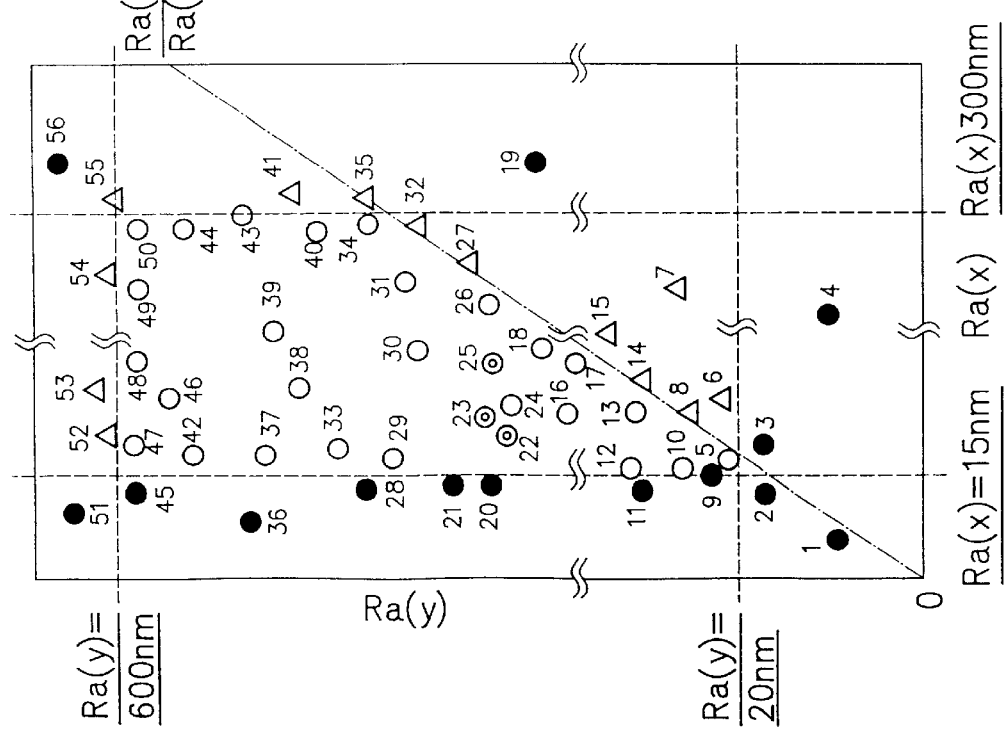
FIG. 8(a)
FIG. 8(b)

PHOTOVOLTAIC DEVICE PROVIDED WITH AN OPAQUE SUBSTRATE HAVING A SPECIFIC IRREGULAR SURFACE STRUCTURE

BACKGROUND OF THE INVENTION

1. Field of the Invention

The present invention relates to an improvement in photovoltaic devices for solar cells and for power sources in various electric appliances. More particularly, the present invention relates to a photovoltaic device (or a photoelectric conversion device) provided with an opaque substrate having a specific irregular surface structure which enhances the utilization efficiency of incident light in the photoelectric conversion region (or the photoactive semiconductor region) and provides improved photoelectric conversion efficiency.

2. Related Background Art

In order to attain a photovoltaic device having an improved photoelectric conversion efficiency, there is known a manner of disposing a metallic reflection layer (which is a so-called metallic back reflection layer) on the side opposite the light incident side of the photoelectric conversion layer. In addition, it is known that in the case of disposing a transparent and electrically conductive layer between a photoelectric conversion layer and a metallic back reflection layer, there can be attained a photovoltaic device having advantages in that the constituents of the metallic back reflector layer are prevented from being diffused into the photoelectric conversion layer, excess current is prevented from flowing, and the photoelectric conversion layer has improved adhesion (see, Japanese Patent Publications Nos. 43101/1984, 41878/1985, and 84888/1985).

Further, there is known a photovoltaic device comprising a transparent and electrically conductive layer composed of $TiO_2$ interposed between a photoelectric conversion layer and a metallic back reflection layer (see, Y. Hamakawa et al., *Appl. Phys. Lett.*, 43, p. 644 (1983)).

Further in addition, there is known a photovoltaic device comprising a transparent and electrically conductive layer having a textured surface structure provided with a plurality of minute irregularities contacted with a photoelectric conversion layer in which light is scattered at the interface between the transparent and electrically conductive layer and the photoelectric conversion layer to improve the utilization efficiency of incident light in the photoelectric conversion layer (see, H. Deckman et al., *Proc. 16th IEEE Photovoltaic Specialist Conf.*, p. 1425 (1982)).

However, in the case where a photovoltaic device is intended to operate by adopting a lower electrode (or a back electrode) structure containing the transparent and electrically conductive layer having such textured surface structure, problems with respect to workability and durability are sometimes encountered as will be described in the following.

Herein, it has been generally considered that the conventional so-called textured surface structure in the case of a photovoltaic device is typically of such a configuration with a plurality of pyramid-like irregularities as described in T. Tiedje et al., *Proc. 16th IEEE Photovoltaic Specialist Conf.*, p. 1423 (1982), and it provides an excellent light-confining effect.

However, in the case of producing a photovoltaic device by providing a substrate having an uneven surface provided with a plurality of pyramid-like irregularities (this uneven surface will be hereinafter referred to as pyramid-like irregular surface) and forming a lower electrode and a photoactive semiconductor layer as a photoelectric conversion layer in this order on said pyramid-like irregular surface of the substrate, a problematic increase in the leakage current sometimes occurs due to a defect or the like in the photoactive semiconductor layer, thereby making it difficult to attain a high yield. Besides this, in this case, since the effective thickness of the photoelectric conversion layer formed above the pyramid-like irregular surface of the substrate is thinner than that of a photoelectric conversion layer formed above a polished surface of a substrate, particularly its constituent doped layer regions (formed at a relatively thin thickness) become further thinned and as a result, the resulting photovoltaic device is eventually such that it is inferior to a photovoltaic device formed on the polished surface of the substrate in terms of Voc (open-circuit voltage) and F.F. (fill factor).

Separately, in the case of a photovoltaic device having a metallic back reflection layer composed of silver (Ag) or copper (Cu), when a positive bias voltage is applied to the metallic back reflection layer under a high humidity environmental condition, the Ag or Cu as the constituent of the metallic back reflection layer can problematically migrate to electrically connect with the electrode (the upper electrode) situated on the light incident side, whereby the photovoltaic device suffers from a shunt (or a short-circuit). This phenomenon is significant in the case where the metallic back reflection layer has an irregular surface (or a textured surface structure) of a magnitude similar to the wavelength of light impinged.

For a photovoltaic device having a metallic back reflection layer composed of aluminum (Al) and having a textured surface, though such migration as occurs in the case of using the metallic back reflection layer composed of Ag or Cu does not occur, the reflectance tends to decrease. Further, in the case where a transparent and electrically conductive layer is stacked on the textured surface of the Al back reflection layer, the reflectance tends to markedly decrease.

Incidentally, for a substrate used in a photovoltaic device, it is known that the surface state of the substrate is closely related to the photovoltaic characteristics of a semiconductor film formed thereon, and as the roughness of the substrate surface increases, the characteristics of the semiconductor film decrease (see, *Japanese Journal of Applied Physics*, Vol. 21 (1982), Supplement 21-2, pp. 287–290). Therefore, it has been generally recognized that to use a substrate having a surface roughness as small as possible such that is similar to a polished (specular) surface is desired in order to produce a photovoltaic device having desirable photovoltaic characteristics at a high yield.

However, in the case where the surface of each of the substrate and the back reflection layer is made to be a polished surface, the light reflection in the back side is problematically relatively small and because of this, the utilization efficiency of incident light in the photoactive semiconductor layer is insufficient. Depending upon a combination of the material by which the substrate is constituted and that which constitutes the back reflection layer, the adhesion of the substrate with the back reflection layer becomes insufficient to cause layer separation at the interface between the substrate and the back reflection layer during the preparation of a photovoltaic device. Separately, processing a substrate used in a photovoltaic device so as to have a polished surface brings about a rise in the substrate production cost, resulting in making the resulting photovoltaic device costly.

The above problems are certainly possible to occur in the case of adopting a photovoltaic device-producing process which is less costly and adequate in practice by using a low-priced substrate comprising a resin film, stainless steel member or the like or by increasing the photovoltaic device production speed by way of raising the formation speed of a photoactive semiconductor layer, where particularly the yield of a photovoltaic device is decreased.

In order for a transparent and electrically conductive layer used in a photovoltaic device to have such an irregular surface as above described, there is known a manner of making a substrate (on which said transparent and electrically conductive layer is to be formed) having an irregular surface. Particularly in this respect, Japanese Unexamined Patent Publication No. 205879/1991 discloses a solar cell (belonging to a photovoltaic device) in which a glass substrate having an irregular surface is used. However, this manner is problematic in that said irregular surface on the glass substrate is a pyramid-like irregular surface with a random roughness and because of this, those problems above described are liable to occur.

Japanese Unexamined Patent Publication No. 147783/1987 discloses a solar cell (belonging to a photovoltaic device) comprising an amorphous silicon (an a-Si) photoactive semiconductor layer deposited on a metallic substrate whose surface has a specific regular surface capable of causing diffraction of incident light. However, the formation of said specific regular surface on the metallic substrate is conducted by way of the special etching process in this case and because of this, the solar cell is costly.

Thus, there is an increased demand for provision of a highly reliable photovoltaic device in which the utilization efficiency of incident light and the photoelectric conversion efficiency are further improved, which excels in workability and which can be efficiently produced at a reasonable production cost.

SUMMARY OF THE INVENTION

An object of the present invention is to eliminate the foregoing problems found in the prior art and satisfy the foregoing demand.

Another object of the present invention is to provide a highly reliable photovoltaic device which is free of the foregoing problems relating to workability, reliability and production cost found in the prior art and in which absorption of incident light (or the utilization efficiency of incident light) by the photoactive semiconductor layer (or the photoelectric conversion layer) is improved and which excels in workability and reliability.

The present invention is based on a finding obtained through experimental studies by the present inventors in order to attain the above objects. The inventors have found that the use of an opaque substrate having a specific irregular surface structure comprising a plurality of linear irregularities or recesses enables the attainment of a highly reliable photovoltaic device which is free of the foregoing problems relating to workability, reliability and production cost found in the prior art, and in which absorption of incident light (or the utilization efficiency of incident light) by the photoelectric conversion layer is improved, and which excels in workability and can be efficiently produced at a reasonable production cost.

A photovoltaic device according to the present invention is featured by having an opaque substrate having a specific irregular surface structure comprising a plurality of linear irregularities or recesses which enables more efficient utilization of incident light (or more efficient absorption of incident light) by the photoelectric conversion layer, thereby providing an improvement in the photoelectric conversion efficiency.

The linear irregularities or recesses in the irregular structure on the opaque substrate in the present invention may have a linearly shaped pattern in which the linear irregularities or recesses are arranged in a linear form arrangement, a wave-like shaped pattern in which the linear irregularities or recesses are arranged in a wavelike form arrangement, and a spirally shaped pattern in which the linear irregularities or recesses are arranged in a spiral form arrangement. Particularly in the case of a long substrate web used in a so-called roll-to-roll film-forming process, the present invention provides a pronounced advantage in that in a rolling process for the production of said substrate web, the forgoing irregular surface structure can be efficiently formed on the substrate web and because of this, there can be obtained a desirably processed substrate web having the foregoing irregular surface structure.

For the linearly shaped pattern in which the linear irregularities or recesses are linearly arranged, the present inventors found that the linear irregularities or recesses are preferred to lie in a specific numeric value range. Specifically, when a center line average roughness obtained when scanning is conducted in a direction parallel to the linear irregularities or recesses is made to be Ra(X) and a center line average roughness obtained when scanning is conducted in a direction perpendicular to the linear irregularities or recesses is made to be Ra(Y), Ra(X) is in the range of from 15 nm to 300 nm, Ra(Y) is in the range of from 20 nm to 600 nm, and Ra(X)/Ra(Y) is 0.8 or less.

The center line average roughness Ra herein is generally defined by the following equation (I).

$$Ra = 1/L \times \int_0^L |f(x)| dx \qquad (I)$$

In the equation (I), L is a measured length in a given direction, and f(x) corresponds to a height based on the center line of the irregularities at a given position in the surface of the substrate.

The parameter defining the surface roughness can be expressed by means of a maximum height Rmax. But the experimental results obtained by the present inventors revealed that the use of the center line average roughness Ra is more suitable because it is highly interrelated to the yield and characteristics of a photovoltaic device. The reason for this is considered such that when even only one large-sized irregularity should be present, the Rmax becomes large accordingly and on the other hand, the Ra provides a more average evaluation for the surface of the linear irregularities or linear recesses in the present invention. Herein for an irregular surface comprising a plurality of simple triangle irregularities, it is considered that the Rmax is about four times the Ra. On the other hand, for the irregular surface comprising the linear irregularities or recesses in the present invention, the Rmax was found to be about five times the Ra in most cases as a result of experimental studies by the present inventors.

Using a substrate having the above-described specific irregular surface structure according to the present invention in a photovoltaic device provides various advantages as will be described in the following.

In comparison with the case of using a substrate having an even (specular) surface in the production of a photovoltaic device, the adhesion between the substrate and a film deposited thereon is markedly improved. Because of this, controllability and freedom in the production of a photovoltaic device are increased, thereby making it possible to efficiently produce a desirable photovoltaic device at a high yield. The photovoltaic device obtained excels in weatherability and durability, and the photovoltaic device excels in photovoltaic characteristics. Particularly, due to the specific irregular surface structure of the substrate, the irregular reflection of light in the back area of the photovoltaic device is markedly improved such that long wavelength light remaining without being adsorbed by the photoactive semiconductor layer is effectively scattered into the photoactive semiconductor layer to prolong the optical path length in the photoactive semiconductor layer, whereby the series resistance is greatly diminished and a marked improvement is provided in the short-circuit current (Jsc) and fill factor (F.F.). In this way, the photovoltaic device exhibits an improved photoelectric conversion efficiency.

In comparison with the case of using a substrate having an uneven surface provided with a plurality of pyramid-like shaped irregularities in the production of a photovoltaic device, the use of the substrate having the specific irregular surface structure according to the present invention enables the efficient production of a desirable photovoltaic device excelling in weatherability and durability and having improved photovoltaic characteristics at a higher yield. The photovoltaic device has an apparent improvement in the photovoltaic characteristics including open circuit voltage (Voc) and fill factor (F.F.) while maintaining the short-circuit current (Jsc) at a high level, and the photovoltaic device exhibits an improved photoelectric conversion efficiency. The reason why the use of the substrate having the specific irregular surface structure according to the present invention provides such pronounced advantages is not clear at the present time. However, it is theorized that in the case of using the substrate having an uneven surface provided with a plurality of pyramid-like shaped irregularities, when the magnitude of the pyramid-like shaped irregularities is enlarged in order to attain an improvement in the light-scattering effect, a semiconductor layer formed on such irregular substrate surface has a tendency of having defective portions at the tips of the pyramid-like shaped irregularities. On the other hand, in the case of using the substrate having the specific irregular surface structure according to the present invention, such a problem is not encountered. Particularly, the specific irregular surface structure according to the present invention does not have such pyramid tips but is shaped to have ridges and because of this, it is difficult to converge electric field at the ridges; accordingly, such defective semiconductor layer portions hardly occur.

Further, for a semiconductor layer formed on the pyramid-like shaped irregular surface, its effective thickness is thinner than that of a semiconductor layer on a polished (specular) substrate surface. In the case where the semiconductor layer is a doped layer or the like (which is usually designed to have a thin thickness), its effective thickness is excessively thinned. A photovoltaic device having such excessively thinned doped layer is liable to be inferior to a photovoltaic device formed on a polished substrate surface in terms of the open circuit voltage (Voc) and fill factor (F.F.). In the case of producing a photovoltaic device using the substrate having the specific irregular surface structure according to the present invention, it is difficult to undesirably thin a semiconductor layer (including a doped layer) formed on the specific irregular surface structure as in the case of using the pyramid-like irregular substrate surface, because the surface area of the specific irregular surface structure of the substrate according to the present invention is smaller than that of the pyramid-like shaped substrate surface. As a result, photovoltaic device obtained is superior to the photovoltaic device formed on the pyramid-like shaped substrate surface particularly in terms of the open circuit voltage (Voc) and fill factor (F.F.) while maintaining the short-circuit current (Jsc) at a high level.

BRIEF DESCRIPTION OF THE DRAWINGS

FIG. 5 is a schematic diagram illustrating an example of a sputtering apparatus for preparing a substrate having the foregoing specific irregular surface structure used in a photovoltaic device according to the present invention.

FIG. 6 is a schematic diagram illustrating an example of a fabrication apparatus for producing a photovoltaic device according to the present invention.

FIGS. 7(a) and 7(b) are schematic diagrams illustrating an example of a roll-to-roll type fabrication apparatus for producing a photovoltaic device according to the present invention.

FIG. 8(a) is a graph showing evaluated results with respect to yield for photovoltaic devices according to the present invention and conventional photovoltaic devices in Example 2 which will be later described.

FIG. 8(b) is a graph showing evaluated results with respect to characteristics after a durability test for photovoltaic devices according to the present invention and conventional photovoltaic devices in Example 2 which will be later described.

DESCRIPTION OF THE PREFERRED EMBODIMENTS OF THE INVENTION

Figure 1:
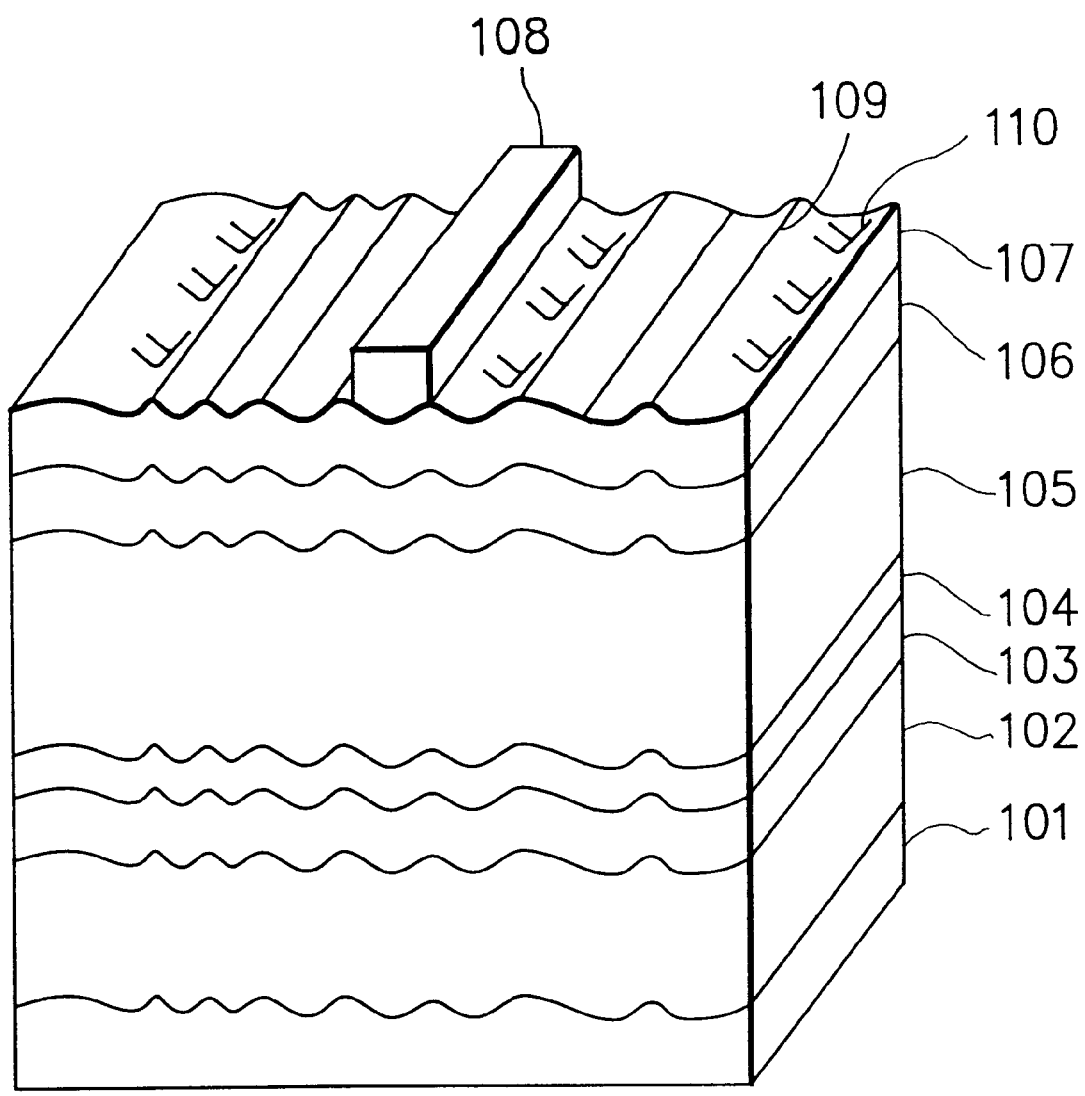
FIG. 1 is a schematic view illustrating the layer constitution of an example of a photovoltaic device according to the present invention.

The present invention will be described while referring to the drawings.

The photovoltaic device according to the present invention may be of a single cell type or a multi-cell type such as tandem cell type, triple cell type, or the like.

FIG. 1 is a schematic view illustrating the constitution of an example of a single cell type photovoltaic device according to the present invention.

Figure 2:
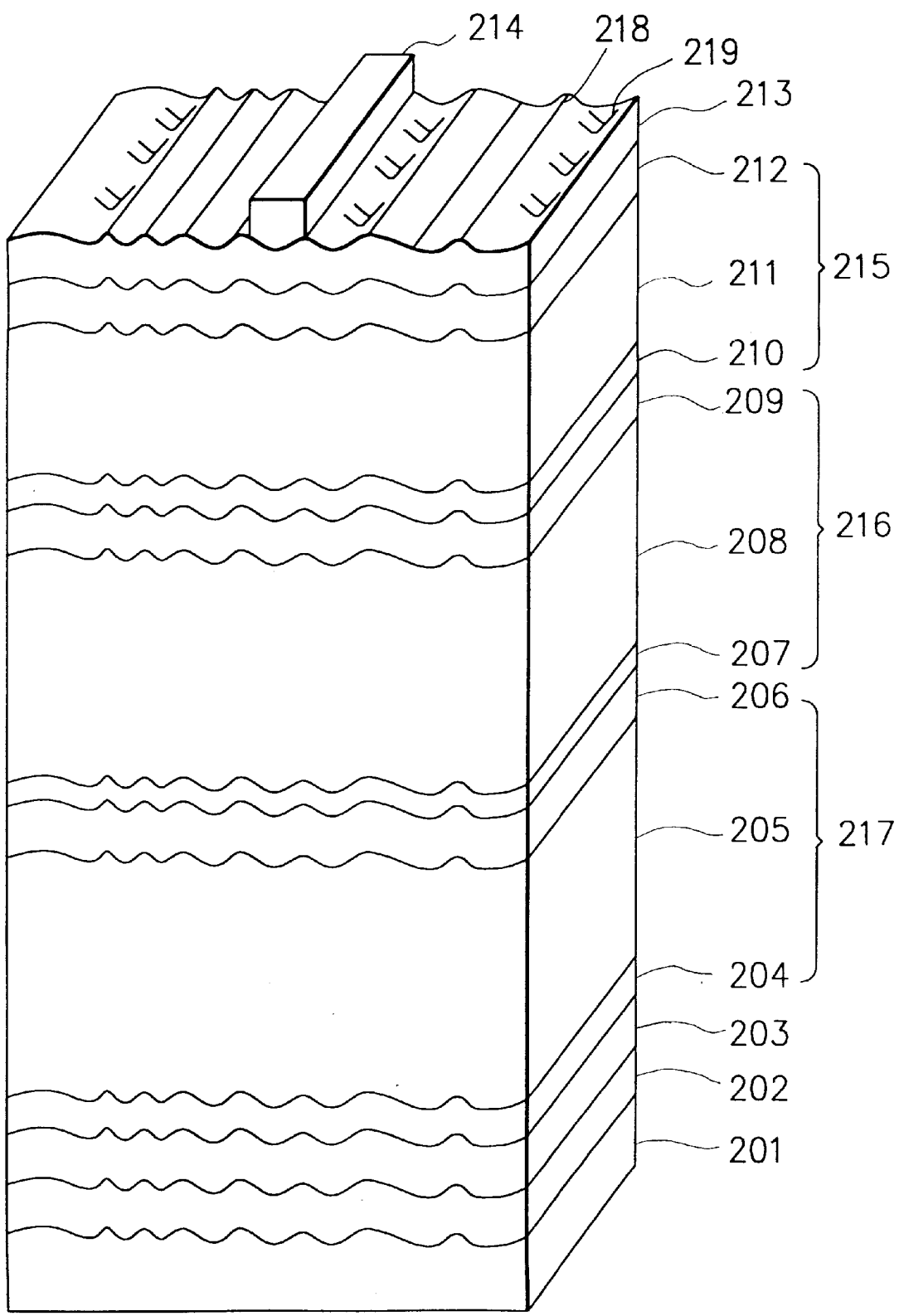
FIG. 2 is a schematic view illustrating the layer constitution of another example of a photovoltaic device according to the present invention.

FIG. 2 is a schematic view illustrating the constitution of an example of a multi-cell type photovoltaic device according to the present invention.

The single cell type photovoltaic device shown in FIG. 1 comprises a single pin junction cell. Particularly, the photovoltaic device shown in FIG. 1 comprises a metallic back reflection layer 102, a transparent and electrically conductive layer 103, an n-type semiconductor layer 104 (that is, a doped semiconductor layer of n-type), an i-type semiconductor layer 105 (that is, a non-doped semiconductor layer of i-type), a p-type semiconductor layer 106 (that is, a doped semiconductor layer of p-type), a transparent electrode layer 107 having an irregular surface provided with a plurality of first linear irregularities 109 provided with a plurality of minute linear irregularities 110 arranged in a direction perpendicular to the first irregularities, and a collecting electrode 108 stacked in the named order on a specific irregular surface structure of an opaque substrate 101. In the photovoltaic device shown in FIG. 1, the n-type semiconductor layer 104, the i-type semiconductor layer 105 and the p-type semiconductor layer 106 establish a pin junction cell. In the photovoltaic device shown in FIG. 1, light is impinged through the transparent electrode layer 107 side.

The photovoltaic device shown in FIG. 1 may further comprise a contact layer (not shown) interposed between the substrate 101 and the metallic back reflection layer 102 in order to improve the adhesion of the metallic back reflection layer 102 with the substrate 101.

In the photovoltaic device shown in FIG. 1, not only the positions of the doped semiconductor layers, but also those of the electrodes may be changed depending upon the direction from which light is to be impinged.

The multi-cell type photovoltaic device shown in FIG. 2 is of a triple cell type comprising three pin junction cells being stacked. Particularly, the triple cell type photovoltaic device shown in FIG. 2 comprises a metallic back reflection layer 202, a transparent and electrically conductive layer 203, a first pin junction cell 217, a second pin junction cell 216, a third pin junction cell 215, a transparent electrode 213 having an irregular surface provided with a plurality of first linear irregularities 218 provided with a plurality of minute linear irregularities 219 arranged in a direction perpendicular to the first irregularities and a collecting electrode 214 stacked in the named order on a specific irregular surface structure of an opaque substrate 201. In this photovoltaic device, the first pin junction cell 217 comprises an n-type semiconductor layer 204, an i-type semiconductor layer 205 and a p-type semiconductor layer 206 being stacked in the named order from the substrate 201 side, the second pin junction cell 216 comprises an n-type semiconductor layer 207, an i-type semiconductor layer 208 and a p-type semiconductor layer 209 being stacked in the named order from the substrate 201 side, and the third pin junction cell 215 comprises an n-type semiconductor layer 210, an i-type semiconductor layer 211 and a p-type semiconductor layer 212 being stacked in the named order from the substrate 201 side. In the photovoltaic device shown in FIG. 2, light is impinged through the side of the third pin junction cell 215.

The photovoltaic device shown in FIG. 2 may further comprise a contact layer (not shown) interposed between the substrate 201 and the metallic back reflection layer 202 in order to improve the adhesion of the metallic back reflection layer 202 with the substrate 201.

In the photovoltaic device shown in FIG. 2, not only the positions of the doped semiconductor layers, but also those of the electrodes may be changed depending upon the direction from which light is to be impinged.

In the following, description will be made of each constituent of the photovoltaic device according to the present invention.

Substrate

A principal feature of the present invention lies in the use of an opaque substrate having a specific irregular surface structure (or pattern) thereon as the substrate (101, 201).

Figure 3A:
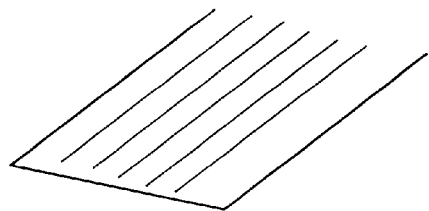
FIG. 3(a) is a schematic view illustrating an example of an irregular surface structure provided on an opaque substrate according to the present invention, comprising a plurality of linear irregularities or recesses which are arranged in a linear form arrangement.
Figure 3B:
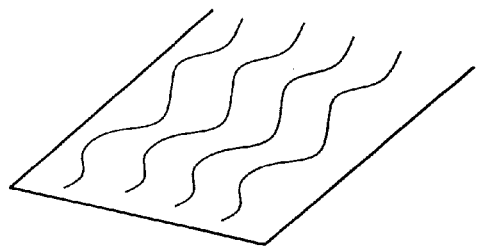
FIG. 3(b) is a schematic view illustrating another example of an irregular surface structure provided on an opaque substrate according to the present invention, comprising a plurality of linear irregularities or recesses which are arranged in a wave-like form arrangement.
Figure 3C:
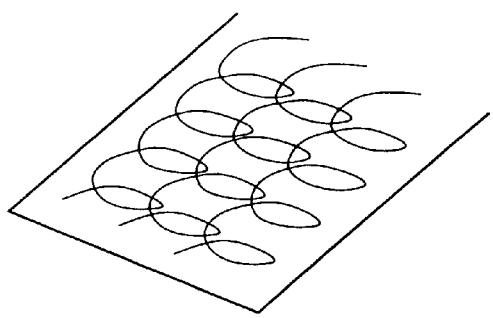
FIG. 3(c) is a schematic view illustrating a further example of an irregular surface structure provided on an opaque substrate according to the present invention, comprising a plurality of linear irregularities or recesses which are arranged in a spiral form arrangement.
Figure 3D:
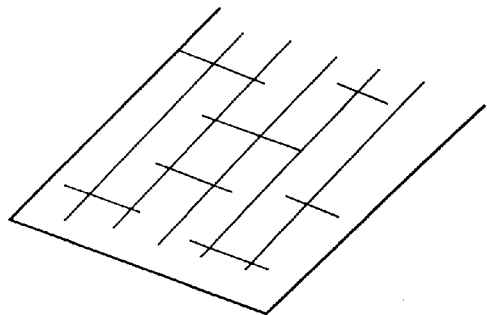
FIG. 3(d) is a schematic view illustrating a further example of an irregular surface structure provided on an opaque substrate according to the present invention, comprising a plurality of first linear irregularities or recesses arranged in a linear form arrangement and a plurality of second linear irregularities or recesses arranged in a direction perpendicular to said first linear irregularities or recesses.

The specific irregular surface structure provided on the substrate comprises:

- an irregular surface pattern shown in FIG. 3(a) comprising a plurality of linear irregularities or recesses arranged in a linear form arrangement;
- an irregular surface pattern shown in FIG. 3(b) comprising a plurality of linear irregularities or recesses arranged in a wave-like form arrangement;
- an irregular surface pattern shown in FIG. 3(c) comprising a plurality of linear irregularities or recesses arranged in a spiral form arrangement; or an irregular surface pattern shown in FIG. 3(d) comprising a plurality of first linear irregularities or recesses arranged in a linear form arrangement and a plurality of minute irregularities or recesses arranged in a direction perpendicular to said first irregularities or recesses.

This is based on findings obtained through experimental studies by the present inventors that the use of an opaque substrate having any of the irregular surface patterns shown in FIGS. 3(a) to 3(d) enables the attainment of a highly reliable photovoltaic device which is free of the foregoing problems relating to workability, reliability and production cost found in the prior art, in which absorption of incident light (or the utilization efficiency of incident light) by the photoactive semiconductor layer (or the photoelectric conversion layer) is improved, and which excels in workability and can be efficiently produced at a reasonable production cost. Particularly, it was found that the use of an opaque substrate having the irregular surface pattern shown in FIG. 3(a), 3(b) or 3(c) enables the attainment of the production of a highly reliable photovoltaic device at a high yield, which is improved in terms of the prevention of the occurrence of a leakage current and in which irregular reflection of light in the back area is improved to elongate the optical path length in the photoactive semiconductor layer (or the photoelectric conversion layer), whereby the light absorption by the photoactive semiconductor layer is increased, resulting in an increase in the short-circuit current (Jsc).

For the irregular surface patterns shown in FIGS. 3(a) to 3(c), the present inventors obtained the following findings through experimental studies.

When a center line average roughness obtained when scanning is conducted in a direction parallel to the linear irregularities or recesses is made to be Ra(x) and a center line average roughness obtained when scanning is conducted in a direction perpendicular to the linear irregularities or recesses is made to be Ra(Y), Ra(X) is desired to be preferably in the range of from 15 nm to 300 nm, more preferably in the range of from 20 nm to 200 nm, most preferably in the range of from 25 nm to 150 nm, Ra(Y) is desired to be preferably in the range of from 20 nm to 600 nm, more preferably in the range of from 40 nm to 400 nm, most preferably in the range of from 60 nm to 300 nm, and Ra(X)/Ra(Y) is desired to be preferably 0.8 or less, more preferably 0.6 or less, most preferably 0.4 or less.

In addition, the linear irregularities or recesses are desired to have a pitch (that is, an interval between adjacent irregularities or recesses) preferably in the range 0.5 $\mu$m to 20 $\mu$m, more preferably in the range of from 1 $\mu$m to 15 $\mu$m, most preferably in the range of from 2 $\mu$m to 10 $\mu$m. The pitches among the linear irregularities or recesses are not necessary to be uniform as long as they are within said range.

The irregular surface pattern shown in FIG. 3(d) is a modification of the irregular surface pattern shown in FIG. 3(a) such that a plurality of second minute linear irregularities or recesses of 20 $\mu$m or less in length are additionally arranged in a direction perpendicular to the linear irregularities or recesses linearly arranged in FIG. 3(a). Particularly, in the irregular surface pattern shown in FIG. 3(d), a plurality of first linear irregularities or recesses are spacedly arranged in a linear arrangement form as shown in FIG. 3(a) and a plurality of second minute linear irregularities or recesses of 20 $\mu$m or less in length are spacedly arranged in a direction perpendicular to the first linear irregularities or recesses.

The results obtained as a result of experimental studies by the present inventors revealed that the irregular surface pattern shown in FIG. 3(d) provides pronounced advantages. Particularly, the use of an opaque substrate having the irregular surface pattern shown in FIG. 3(d) enables the attainment of the production of a highly reliable photovoltaic device at a high yield, which is more improved in terms of the prevention of the occurrence of a leakage current and in which irregular reflection of light in the back area is improved to more elongate the optical path length in the photoactive semiconductor layer (or the photoelectric conversion layer), whereby the light absorption by the photoactive semiconductor layer is increased more, resulting in a greater increase in the short-circuit current (Jsc).

For the second minute linear irregularities or recesses, their length is desired to be 20 $\mu$m or less as above described. It is more preferably 15 $\mu$m or less, most preferably 10 $\mu$m or less.

The substrate (101, 201) may be constituted by a single crystal material or a non-single crystal material, which is either electrically conductive or electrically insulative. In any case, it is desired for the substrate to be constituted by an appropriate material which is difficult to be deformed or distorted and has a sufficient physical strength.

Specifically, the substrate may comprise a metal selected from the group consisting of Fe, Ni, Cr, Al, Mo, Au, Nb, Ta, V, Ti, Pt, and Pb; an alloy selected from the group consisting of alloys of these metals such as brasses and stainless steels; or a member selected from the group consisting of composites of these alloys.

Alternatively, the substrate may comprise a film or sheet of a heat resistant synthetic resin such as polyester, polyethylene, polycarbonate, cellulose acetate, polypropylene, polyvinyl chloride, polyvinylidene chloride, polystyrene, polyamide, polyimide, or epoxy resin; or a member selected from the group consisting of composites of these films or sheets with a glass fiber, carbon fiber, boron fiber or metallic fiber.

Besides these, the material by which the substrate is constituted can include thin plates made of the foregoing metals having a surface coated by a metal thin film made of a different metal or/and an electrically insulative thin film of $SiO_2$, $Si_3N_4$, $Al_2O_3$ or AlN by way of sputtering, vacuum deposition, or plating; the foregoing synthetic resin sheets having a surface coated by an appropriate metal thin film or/and an electrically insulative thin film of $SiO_2$, $Si_3N_4$, $Al_2O_3$ or AlN by way of sputtering, vacuum deposition, or plating; and ceramics.

Of the above-described materials as the constituent of the substrate, stainless steels are the most appropriate since they excel in workability, durability and flexibility and in addition, they excel in suitability in forming the foregoing irregular surface patterns thereon.

In the case where the substrate is constituted by an electrically conductive material, it may be designed such that it serves also as an electric current outputting electrode. In the case where the substrate is constituted by an electrically insulative material, its surface on which a deposited film is to be formed is desired to have been applied with electrically conductive surface treatment with the use of a metal such as Al, Ag, Pt, Au, Ni, Ti, Mo, W, Fe, V, Cr or Cu; an alloy such as stainless steel, brass or nichrome; or a transparent and electrically conductive oxide material such as $SnO_2$, $In_2O_3$, ZnO or ITO by way of plating, vacuum deposition or sputtering so as to establish an electric current outputting terminal.

Even in the case where the substrate is constituted by an electrically conductive material comprising a metallic material, a metal layer composed of a metal different from the constituent metallic material of the substrate is desired to be disposed on a surface of the substrate on which a deposited film is to be formed for the purposes of improving the reflection of long wavelength light on the surface of the substrate and preventing the constituent elements of the substrate and those of a film deposited from being mutually diffused.

The substrate may be of any configuration such as plate-like, belt-like or cylindrical shape, which can be properly determined depending on the application use.

In the case where the substrate is used in the roll-to-roll film-forming process comprising a rolling step for preparing a substrate having the foregoing irregular surface pattern and a film-forming step for forming a deposited film on the substrate, it is desired to be in a belt-like shape comprising a long web substrate. In this case, in the rolling step before subjecting the substrate for film formation to the film-forming step, the irregular surface pattern can be continuously formed on the surface of the long web substrate which is moving toward the film-forming step. By this, a photovoltaic device according to the present invention can be continuously produced at a high productivity and with a reasonable production cost.

For the thickness of the substrate, it should be properly determined so that a photovoltaic device as desired can be obtained. In the case where flexibility is required for the photovoltaic device, it can be made as thin as possible within a range capable of sufficiently providing the function as the substrate. However, the thickness is usually greater than 10 $\mu$m in view of the fabrication and handling or mechanical strength of the substrate.

In the following, description will be made of the formation of the foregoing irregular surface pattern on the substrate.

The formation of the irregular surface pattern on the substrate is conducted by an appropriate manner depending upon the kind of the constituent material of the substrate.

However, there can be employed such manners as will be described below.

In order to form an irregular surface pattern comprising a plurality of linear irregularities or recesses spacedly arranged in a given direction on a surface of the substrate, there can be used a manner by way of rolling, a manner by way of polishing, a manner by way of molding or a manner by way of etching. In these manners, annealing can be supplementarily used.

The manner by way of rolling is suitable in the case where the substrate is made of a metallic material. This is suitable particularly in the case of forming the irregular surface pattern shown in FIG. 3(a).

The rolling can include hot rolling and cold rolling. The cold rolling may be conducted by means of a reversing type four rolls rolling mill, a senizimir twenty rolls rolling mill, and a skinpass rolling mill. In the case of using the cold rolling, for instance, when the substrate is constituted by an austenitenitic stainless steel, a ferritic steel or a martensitic stainless steel, there can be formed a desirable irregular surface patten comprising a plurality of linear irregularities or recesses respectively arranged in a given direction on a surface of the substrate by way of 2D finishing, 2B finishing or BA finishing.

In the following, description will be made of the manner of forming an irregular surface pattern comprising a plurality of linear irregularities or recesses according to the present invention on a surface of a stainless steel plate by way of rolling.

The process for the production of a stainless steel plate generally comprises a steel-making process, a hot rolling process, a cold rolling process, and a final process. Of these processes, the final process is the most important for the formation of the irregular surface pattern according to the present invention. By selecting optimum conditions for the final surface treatment by finish rolling, finish polishing and the like, the irregular surface pattern according to the present invention can be formed on the surface of the stainless steel in a desirable state.

In the steel-making process, a raw material is melted and refined by an electric arc furnace, followed by decarburization by a L.D. converter. Then, the stainless component and the temperature are appropriately adjusted by means of a vacuum degassing vessel, followed by the formation of slabs by means of a continuous casting machine.

In the hot rolling process, the slabs are ground by means of a surface grinding machine, then re-heated by means of a furnace into a so-called hot coil state, followed by treatment by a roughing-ill mill then treatment by a hot strip mill, whereby the slab of more than 100 mm in thickness is hot-rolled into a slab having a thickness of 2 to 3 mm.

In the cold rolling process, in the case of a ferritic or martensitic stainless steel, after provisional annealing treatment is conducted by means of a bell type annealing furnace, in the case of an austenitenic stainless steel, without conducting provisional annealing treatment, annealing treatment and acid-washing are conducted using a continuous annealing and pickling line to remove an oxide (which is called "a scale") present on the stainless steel surface into a state capable of being readily cold-rolled. The cold rolling treatment for the resultant is conducted by means of the sendzimir twenty rolls rolling mill or a tandem sendzimir rolling mill whereby it is processed and hardened into a plate of less than 1 mm in thickness. After the cold rolling treatment, when the 2D or 2B finishing is conducted, by means of a continuous annealing and pickling line for a cold-rolled strip, heat treatment and acid-washing are conducted for the recrystallization, softening, and carbon solution treatment of the stainless steel. In the case of conducting the BA finishing, heat treatment is conducted in an inert gas using a continuous bright annealing line. In this case, no acid-washing is necessary to be conducted because no scale deposition occurs, and a strong brilliance can be attained.

In the final process, finish rolling using a finish rolling mill with a work roll or finish polishing using a finish polishing mill with a contact roll is conducted to obtain a stainless steel plate having a desired thickness and having a surface with the foregoing irregular surface pattern comprising a plurality of linear irregularities or recesses according to the present invention which is quite suitable for use in producing a photovoltaic device according to the present invention. For the thickness of the stainless steel plate, it is preferably in the range of from 0.05 mm to 1 mm, more preferably in the range of from 0.1 mm to 0.5 mm.

As the finish rolling mill in the above, there can be used a four rolls cold rolling mill, a twelve rolls cold rolling mill, or a skinpass rolling mill.

As the work roll of the finish rolling mill or as the contact roll of the finish polishing mill, to use a work roll or contact roll respectively having a surface flatness of the following value enables the effective formation of the irregular surface pattern comprising a plurality of linear irregularities or recesses according to the present invention as desired. That contact roll, when a center line average roughness obtained when scanning is conducted in a circumference direction of the roll (shaped in a cylindrical form) is made to be $Ra(L)$ and a center line average roughness obtained when scanning is conducted in a generatrix direction of the roll is made to be $Ra(H)$, they are desired to have a $Ra(L)$ value preferably in the range of from 5 nm to 500 nm or more preferably in the range of from 10 nm to 300 nm, and a $Ra(H)$ value preferably in the range of from 10 nm to 1000 nm or more preferably in the range of from 20 nm to 600 nm.

In the case where a desired irregular surface pattern comprising a plurality of linear irregularities or recesses according to the present invention could not be formed by one finish rolling or finish polishing treatment, the resultant irregular surface pattern can be adjusted into a desired state by additionally conducting appropriate polishing treatment or etching treatment. For instance, in the case of a stainless steel obtained by conducting the BA finishing and having an irregular surface pattern which is insufficient in the foregoing $Ra(X)$ and $Ra(Y)$ values, by softly etching the surface of the stainless steel plate by the etching manner which will be later described, there can be attained the formation of a desired irregular surface pattern which is sufficient in the foregoing $Ra(X)$ and $Ra(Y)$ values. In the case of a stainless steel obtained by conducting the 2D or 2B finishing and having an irregular surface pattern which has an excessive $Ra(X)$ value and an excessive $Ra(Y)$ value, by repeating the finish rolling treatment or the finish polishing treatment several times, there can be attained the formation of a desired irregular surface pattern which is sufficient in the foregoing $Ra(X)$ and $Ra(Y)$ values.

In the final process, there can be additionally conducted finish heat treatment, or treatment for correcting the warp of the stainless steel plate such as roller reveling or tension reveling.

The irregular surface patterns shown in FIGS. 3(a), 3(b) and 3(c) according to the present invention can be formed by an appropriate polishing manner without conducting rolling treatment. The polishing manner may be employed in the case of a non-metallic substrate.

The polishing manner therein may be conducted by means of belt polishing, buff polishing, brush polishing, or lap-polishing.

Besides, it may be conducted by means of surface treatment using a roller. In this case, by using a roller having an irregular surface with the foregoing Ra(L) and Ra(H) values, there can be attained the formation of a desired irregular surface pattern which is sufficient in the foregoing Ra(X) and Ra(Y) values according to the present invention.

The polishing manner may be a polishing manner using abrasive grains. It is desired for the abrasive grains used to have a mean particle size preferably in the range of from 0.1 $\mu$m to 100 $\mu$m, more preferably in the range of from 0.2 $\mu$m to 50 $\mu$m.

It is possible to use two or more of the above polishing manners in combination.

The formation of any of the irregular surface patterns shown in FIGS. 3(a), 3(b) and 3(c) according to the present invention may be conducted by the manner by way of molding wherein a mold having a surface provided with a pattern corresponding to any of the irregular surface patterns shown in FIGS. 3(a), 3(b) and 3(c) is press-contacted to the surface of the substrate. The mold having such surface pattern on the surface thereof may be prepared by an appropriate manner such as polishing, etching, or patterning.

In the above, before or after the surface treatment by rolling or polishing, it is possible to conduct etching or annealing treatment for the surface of the substrate. The etching treatment in this case can include vapor phase etching treatment and liquid phase etching treatment.

The vapor phase etching treatment can include gas etching treatment, plasma etching treatment and ion etching treatment. The gas etching treatment may be conducted using an appropriate etching gas of $CF_4$, $C_2F_6$, $C_3F_8$, $C_4F_{10}$, $CHF_3$, $CH_2F_2$, $Cl_2$, $ClF_3$, $CCl_4$, $CCl_2F_2$, $CClF_3$, $CHClF_2$, $C_2Cl_2F_4$, $BCl_3$, $PCl_3$, $CBrF_3$, $SF_6$, $SiF_4$, $SiCl_4$, $HF$, $O_2$, $N_2$, $H_2$, $He$, $Ne$, $Ar$, or $Xe$. Mixtures of two or more of these gases may also be used as the etching gas.

The plasma etching treatment may be conducted using a plasma generated from one or more gases selected from those above mentioned at a gas pressure of $1\times10^{-3}$ to 1 Torr by applying a D.C. or A.C. power, a RF power with an oscillation frequency of 1 to 100 MHz, or other high frequency power such as microwave power with an oscillation frequency of 0.1 to 10 GHz. For a preferable range of the energy to produce the plasma, it is in the range of from 100 to 2000 V in the case of using the D.C. power. In the case of using the A.C. or RF power, it is in the range of 0.001 to 5 W/cm$^3$. In the case of using the microwave power, it is in the range of from 0.01 to 1 W/cm$^3$. For the substrate temperature upon conducting the etching treatment, it is preferably in the range of from 10 to 400° C., more preferably in the range of from 20 to 300° C. For the period of time during which the etching treatment is conducted, it is preferably in the range of from 0.5 to 100 minutes, more preferably in the range of from 2 to 60 minutes.

The liquid phase etching treatment may be conducted using an appropriate etching liquid. The etching liquid in this case can include acid series etching liquids and alkali series etching liquids.

Specific examples of the acid series etching liquids are etching liquids comprising sulfuric acid, hydrochloric acid, nitric acid, phosphoric acid, hydrofluoric acid, chromic acid, sulfamic acid, oxalic acid, tartaric acid, citric acid, formic acid, lactic acid, glycolic acid, acetic acid, gluconic acid, succinic acid, malic acid, water dilutions of these compounds, or mixtures of these. Specific examples of the alkali series etching liquids are etching liquids comprising caustic soda, ammonium hydroxide, potassium hydroxide, sodium carbonate, sodium bicarbonate, sodium sesquicarbonate, sodium primary phosphate, sodium secondary phosphate, sodium tertiary phosphate, sodium pyrophosphate, sodium tripolyphosphate, sodium tetrapolyphosphate, sodium trimetaphosphate, sodium tetrametaphosphate, sodium hexametaphosphate, sodium orthosilicate, sodium metasilicate, water dilutions of these compounds, or mixtures of these.

In the case of the liquid phase etching treatment, it is possible to heat the etching liquid or to apply an energy of a supersonic wave to the etching liquid.

In the case where the acid series or alkali series etching liquid is diluted by water, the acid or alkali concentration is desired to be preferably in the range of from 1 to 80 volume %, more preferably in the range of from 5 to 50 volume %. For the temperature of the acid series or alkali series etching liquid upon conducting the etching, it is preferably in the range of from 10 to 80° C., more preferably in the range of from 20 to 60° C. For the period of time during which the etching treatment is conducted, it is preferably in the range of from 5 seconds to 30 minutes, more preferably in the range of from 10 seconds to 10 minutes.

In the case where the annealing treatment is employed, the annealing treatment may be conducted in a gaseous atmosphere composed of air, steam, nitrogen gas, hydrogen gas, oxygen gas, inert gas, or another appropriate gas at an appropriate annealing temperature and for an appropriate annealing treatment period of time selected depending upon the constituent of the substrate. For the annealing temperature, in general, it is desired to be preferably in the range of from 200 to 800° C., more preferably in the range of from 400 to 700 ° C. For the annealing period of time, in general, it is desired to be preferably in the range of from 1 to 100 minutes, more preferably in the range of from 2 to 60 minutes.

Now, the irregular surface pattern shown in FIG. 3(d) in which a plurality of first linear irregularities or recesses are arranged in a linear arrangement form (this will be hereinafter referred to as first irregular pattern) and a plurality of second minute linear irregularities or recesses of 20 $\mu$m or less in length are arranged in a direction perpendicular to the first linear irregularities or recesses (this will be hereinafter referred to as second irregular pattern) may be formed by conducting the foregoing final process while using either a finish rolling mill with a work roll having an irregular surface pattern comprising a plurality of linear irregularities or recesses having a length of 20 $\mu$m or less, an elevation of 0.5 $\mu$m or less and a depth of 0.5 $\mu$m or less respectively in a generatrix direction of the work roll or a finish polishing roller with a contact roll having an irregular surface pattern comprising a plurality of linear irregularities or recesses having a length of 20 $\mu$m or less, an elevation of 0.5 $\mu$m or less and a depth of 0.5 $\mu$m or less respectively in a generatrix direction of the contact roll.

Besides, the irregular surface pattern shown in FIG. 3(d) may be formed by conducting the foregoing final process while using either a finish rolling mill with a work roll having the above irregular surface pattern which has an average pitch of 20 $\mu$m or less for the irregularities in a generatrix line of the work roll and additionally deposited with liquid or a finish polishing mill with a contact roll having the above irregular surface pattern which has an average pitch of 20 μm or less for the irregularities in a generatrix line of the contact roll and additionally deposited with liquid.

Separately, the irregular surface pattern shown in FIG. 3(d) in which a plurality of first linear irregularities or recesses are arranged in a linear arrangement form (this will be hereinafter referred to as first irregular pattern) and a plurality of second minute linear irregularities or recesses of 20 μm or less in length are arranged in a direction perpendicular to the first linear irregularities or recesses (this will be hereinafter referred to as second irregular pattern) may be formed by a manner of forming the former irregular pattern by means of an appropriate polishing manner and forming the latter irregular pattern in a direction perpendicular to the former one by means of an appropriate rolling or polishing manner. In this manner, by the lately formed irregular pattern, the previously formed irregular pattern is partially broken to cause partial residues as the second irregular pattern, and wherein the lately formed irregular pattern becomes the first irregular pattern. Further, by making the lately formed pattern such that it has an average pitch (d) of 20 μm or less for the linear irregularities or recesses, the second irregular pattern can be formed as desired.

Besides this, it may be formed by a manner of forming the first irregular pattern by means of an appropriate rolling or polishing manner and forming the second irregular pattern by subjecting the surface of the first irregular pattern to etching treatment using a mask having a plurality of long thin openings in a direction perpendicular to the linear irregularities or recesses of the first irregular pattern.

Back Reflection Layer

The back reflection layer (102, 202) is formed on the surface of the foregoing specific uneven surface structure provided on the substrate (101, 201).

The back reflection layer serves to reflect light which is not absorbed by the photoelectric conversion layer and which reached the substrate into the photoelectric conversion layer so that it is recycled in the photoelectric conversion layer. The back reflection layer also serves as a back electrode (or a lower electrode).

The back reflection layer comprises a metallic layer constituted by an appropriate metallic material such as a metal or alloy.

Specific examples of said metal are Au, Ag, Cu, Al, Mg, Ni, Fe, Mo, W, Ti, Co, Ta, Nb and Zr. Specific examples of said alloy are alloys of said metals such as stainless steel and alloys composed of said metals and containing silicon (Si) as an additive. Of these, Al, Mg, Cu, Ag and Au which have a high light reflectance against visible light to infrared light and alloys principally composed of two or more of these metals and added with silicon (Si) are the most appropriate.

The back reflection layer constituted by any of the above metallic materials may be formed by means of a conventional manner such as electron beam evaporation, sputtering, CVD, plating, or screen printing.

The back reflection layer may be of a single-layered structure or a multi-layered structure. In the case where the substrate is constituted by an electrically conductive material, the back reflection layer is not always necessary to be disposed.

The back reflection layer may be designed to have an even surface or an uneven surface. In the case where the back reflection layer has an uneven surface, there is provided an advantage in that the optical path length of light reflected into the photoactive semiconductor layer is prolonged to afford an increase in the short-circuit current.

As previously described, the back reflection layer is formed on the surface of the foregoing specific uneven surface structure provided on the substrate. Therefore, the back reflection layer is formed in a state of following the uneven surface structure of the substrate. Because of this, the back reflection layer has an improved adhesion with the substrate. This situation provides pronounced advantages in that freedom and controllability in the production of a photovoltaic device are increased, the yield of a photovoltaic device is improved, and a photovoltaic device obtained is sufficient in weatherability and durability.

Further, in the case where the back reflection layer is constituted principally by a metallic material having a high light reflectance against visible light to infrared light such as Au, Ag, Cu, Al or Mg, there can be attained a desirable photovoltaic device in which the light reflectance of the back area is markedly improved to afford a marked increase in the quantity of light absorbed by the photoactive semiconductor layer whereby providing a markedly improved short-circuit current (Jsc).

Incidentally, in the case of a photovoltaic device provided with a back reflection layer composed of the above-described metallic material having a high light reflectance on a textured structure surface (with a plurality of pyramid-like shaped irregularities) of a substrate or a back reflection layer (composed of the above-described metallic material having a high light reflectance) having a textured structure surface (with a plurality of pyramid-like shaped irregularities), the constituent metallic material of the back reflection layer tends to diffuse or migrate into the photoactive semiconductor layer to a shunt. However, such a problem is not encountered in the present invention. Particularly, in a photovoltaic device according to the present invention which is provided with the back reflection layer composed of the above-described metallic material having a high light reflectance formed on the specific irregular surface pattern of the substrate, the constituent metallic material of the back reflection layer is scarcely diffused or migrated into the photoactive semiconductor layer and a high irregular light reflection and a high short-circuit current (Jsc) are attained. In addition, the leakage current is markedly diminished and a marked improvement is provided in the open circuit voltage (Voc) and also in the fill factor (F.F.). The photovoltaic device having these pronounced advantages can be efficiently produced at a high yield.

The use of Al as the principal constituent of the back reflection layer is most appropriate because it is relatively inexpensive and it is less likely to migrate in comparison with Ag or Cu. However, in the case of a photovoltaic device provided with a back reflection layer composed of Al formed on a textured structure surface (with a plurality of pyramid-like shaped irregularities) of a substrate or a back reflection layer (composed of Al) having a textured structure surface (with a plurality of pyramid-like shaped irregularities), the total light reflectance of the surface of the back reflection layer is usually undesirably low. In the case where a transparent and electrically conductive layer is formed on such Al back reflection layer, the total light reflectance of the surface of the back reflection layer is liable to further decrease. Therefore, it has been generally recognized that to use Al as the constituent of the back reflection layer for a photovoltaic device is not suitable. In addition, in a case of a photovoltaic device provided with a back reflection layer composed of Al formed on a polished substrate surface, there are problems in that light does not sufficiently scatter at the interface between the Al back reflection layer and the photoelectric conversion layer, thereby causing a decrease in the short-circuit current (Jsc) and an increase in the possibility of layer peeling occurring at the interface between the Al back reflection layer and the substrate. However, these problems are not encountered in the present invention. Particularly, in a photovoltaic device according to the present invention which is provided with the back reflection layer composed of Al formed on the specific irregular surface pattern of the substrate, light is efficiently scattered in the back area of the photovoltaic device without a decrease in the total light reflectance of the surface of the Al back reflection layer, whereby the quantity of light absorbed by the photoactive semiconductor layer is increased to provide an improved short-circuit current (Jsc). In addition, the adhesion between the substrate and the Al back reflection layer is desirably improved. Further, the photovoltaic device excels in weatherability and durability. In addition, freedom and controllability in the production of a photovoltaic device are increased to efficiently produce a desirable photovoltaic device having the above advantages at a high yield.

Now, in the present invention, there are provided pronounced advantages for a transparent and electrically conductive layer which is formed on the back reflection layer in that the transparent and electrically conductive layer has an improved orientation, and in the case where the transparent and electrically conductive layer is constituted of a polycrystalline material, the polycrystalline material as the constituent of the transparent and electrically conductive layer has a large mean grain size and a slight grain size variation. This situation enables the production of a desirable photovoltaic device which is quite small in series resistance and has an improved fill factor (F.F.) and in which light is efficiently scattered at the interface between the transparent and electrically conductive layer and the photoelectric conversion layer to provide an improved short-circuit current (Jsc).

For the surface state of the back reflection layer formed on the uneven surface structure of the substrate, it is different depending upon the magnitude of the thickness of the back reflection layer. When the back reflection layer is designed to have a relatively thin thickness of, for instance, 0.1 $\mu$m or less, the back reflection layer has an uneven surface which follows the uneven surface structure of the substrate. On the other hand, when the back reflection layer is designed to have a relatively thin thickness of, for instance, beyond 1 $\mu$m, the back reflection layer tends to have a substantially even surface.

In the case where the surface of the back reflection layer is even, it is possible to subject the surface to polishing or etching treatment whereby the surface is made to have an irregular surface provided with a plurality of linear irregularities or recesses.

Transparent and Electrically Conductive Layer

The transparent and electrically conductive layer (103, 203) serves to increase irregular reflection of not only incident light but also reflected light thereby elongating the optical path length in the photoactive semiconductor layer, resulting in an increase in the short-circuit current (Jsc) provided by the photovoltaic device. In addition, the transparent and electrically conductive layer serves to prevent the constituent of the metallic layer as the back reflection layer from diffusing or migrating into the photoactive semiconductor layer whereby the photovoltaic device is shunted.

Further, by making the transparent and electrically conductive layer have an adequate electric resistance, the back reflection layer (102, 202) and the transparent electrode layer (107, 213) can be effectively prevented from being short-circuited due to a defect such as a pinhole present in the photoactive semiconductor layer.

The transparent and electrically conductive layer is required to have a sufficient transmittance for light having a wavelength which is capable of being absorbed by the photoactive semiconductor layer, and it is desired to have such an adequate electric resistance. For the transmittance, it is preferably 80% or more, more preferably 85% or more, most preferably 90% or more, for light having a wavelength of 650 nm or more. For the electric resistance, it is preferably in the range of from $1 \times 10^{-4}$ to $1 \times 10^{-6}$ $\Omega$cm, more preferably in the range of from $1 \times 10^{-2}$ to $5 \times 10^{4}$ $\Omega$cm.

The transparent and electrically conductive layer is constituted by an electrically conductive material selected from the group consisting of inorganic oxides such as $In_2O_3$, $SnO_2$, ITO ($In_2O_3$-$SnO_2$), ZnO, CdO, $Cd_2SnO_4$, $TiO_2$, $Ta_2O_5$, $Bi_2O_3$, $MoO_3$ and $Na_xWO_3$ and mixtures of these inorganic oxides. Any of these electrically conductive materials may contain a conductivity-controlling dopant.

As such dopant, there can be mentioned Al, In, B, Ga, F and Si, for instance, in the case where the transparent and electrically conductive layer is comprised of ZnO. In the case where the transparent and electrically conductive layer is comprised of $In_2O_3$, there can be mentioned Sn, F, Te, Ti, Sb and Pb. In the case where the transparent and electrically conductive layer is comprised of $SnO_2$, there can be mentioned F, Sb, P, As, In, Tl, Te, W, Cl, Br and I.

The transparent and electrically conductive layer constituted by any of the above-mentioned materials may be formed by means of a conventional manner such as electron beam evaporation, sputtering, CVD, spray coating, spin coating, or dip coating.

The transparent and electrically conductive layer may be designed to have an even surface or an uneven surface. In the case where the transparent and electrically conductive layer is made to have an uneven surface, the uneven surface may be an irregular surface provided with a plurality of linear irregularities or recesses based on the uneven surface structure of the substrate.

The constituent of the transparent and electrically conductive layer may be polycrystalline. In this case, there is an occasion in that the polycrystalline constituent is grown to provide an uneven surface provided with a plurality of irregularities based on the grown polycrystalline constituent. Further, in the case where the constituent of the transparent and electrically conductive layer is polycrystalline, the polycrystalline constituent is in a state with a large mean grain size and a slight grain size variation due to the uneven surface structure of the substrate. This situation enables the production of a desirable photovoltaic device in which light is efficiently scattered at the interface between the transparent and electrically conductive layer and the photoelectric conversion layer to provide an improved short-circuit current (Jsc).

Photoelectric Conversion Layer

The photoelectric conversion layer means a semiconductor layer which functions to conduct photoelectric conversion. The pin junction cell in FIGS. 1 and 2 corresponds to the photoelectric conversion layer.

The photoelectric conversion layer may comprise a non-single crystalline semiconductor material such as an amorphous semiconductor material, a microcrystalline semiconductor material or polycrystalline silicon semiconductor material. Alternatively, it may comprise a non-single crystalline compound semiconductor material.

Such non-single crystalline semiconductor material can include, for example, non-single crystalline semiconductor materials of an element belonging to group IV of the periodic table (this element will be hereinafter referred to as group IV element) such as Si, C, Ge, or the like and non-single crystalline semiconductor materials of group IV alloying elements such as SiGe, SiC, SiSn, or the like. Any of these non-single crystalline semiconductor materials may contain hydrogen atoms (H, D) or/and halogen atoms (X) in an amount of, for instance, 0.1 to 40 atomic %. Further, any of these non-single crystalline semiconductor materials may contain oxygen atoms (O) or/and nitrogen atoms (N).

As particularly preferable examples of these non-single crystalline semiconductor materials, there can be mentioned amorphous, polycrystalline or microcrystalline Si:H, Si:F, Si:H:F, SiGe:H, SiGe:F, SiGe:H:F, SiC:H, SiC:F and SiC:H:F.

The non-single crystalline compound semiconductor material can include, for example, group II-VI elements-containing compound semiconductor materials such as CdS, CdTe, ZnO, ZnSe, and the like and group I-III-VI elements-containing compound semiconductor materials such as CuInSe$_2$, Cu(InGa)Se$_2$, CuInS$_2$, CuIn(Se, S)$_2$, CuInGaSeTe, and the like.

In any case, the photoelectric conversion layer comprised of any of the above-described non-single crystalline semiconductor materials may be of a stacked structure with a pin junction (which corresponds to the pin junction cell in FIGS. 1 and 2) which comprises an n-type semiconductor layer, an i-type semiconductor layer and a p-type semiconductor layer, or of a stacked structure with a pn junction which comprises an n-type semiconductor layer and a p-type semiconductor layer.

Description will be made of each of the i-type, n-type and p-type semiconductor layers.

The i-type semiconductor layer (or the intrinsic layer) comprises any of the foregoing non-single crystalline semiconductor materials and it pays an important role of generating a carrier against light irradiated and transporting said carrier.

The i-type semiconductor layer may of a slightly p-type or n-type nature.

The i-type semiconductor layer may be of a single-layered structure or a multi-layered structure which may include a so-called buffer layer.

The i-type semiconductor layer is desired to be constituted by any of the foregoing non-single crystalline semiconductor materials containing hydrogen atoms (H, D) or/and halogen atoms (X) in an amount of 1 to 40 atomic %, for example, an amorphous silicon (a-Si) semiconductor material or an amorphous silicon germanium (a-SiGe) semiconductor material such as a-Si:H, a-Si:F, a-Si:H:F, a-SiGe:H, a-SiGe:F, a-SiGe:H:F or the like. The hydrogen atoms (H, D) or/and the halogen atoms are desired to be contained in the i-type semiconductor layer such that their concentration distribution is enhanced not only on the side of the interface between the i-type semiconductor layer and the n-type semiconductor layer but also on the side of the interface between the i-type semiconductor layer and the p-type semiconductor layer. For the i-type semiconductor layer positioned in the pin junction cell situated at a position near the side through which light is impinged, it is desired to be constituted by a non-single crystalline semiconductor material having a wide band gap. For the i-type semiconductor layer positioned in the pin junction cell situated at a position remote from the side through which light is impinged, it is desired to be constituted by a non-single crystalline semiconductor material having a narrow band gap.

Each of the n-type and p-type semiconductor layers is constituted by any of the foregoing non-single crystalline semiconductor materials containing hydrogen atoms (H, D) or/and halogen atoms (X) in an amount of 0.1 to 40 atomic % as an optimum amount and which are added with a valence electron controlling agent of n-type or p-type at a high concentration. The n-type valence electron controlling agent can include, for example, group V elements such as P, As, Sb, and Bi. The p-type valence electron controlling agent can include, for example, group III elements such as B, Al, Ga, In and Tl.

Preferable examples of such non-single crystalline semiconductor added with the n-type or p-type valence electron controlling agent are amorphous (a-) silicon-containing semiconductor materials such as a-Si:H, a-Si:HX, a-SiC:H, a-SiC:HX, a-SiGe:H, a-SiGe:HX, a-SiGeC:H, a-SiGeC:HX, a-SiO:H, a-SiO:HX, a-SiN:H, a-SiN:HX, a-SiON:H, a-SiON:HX, a-SiOCN:H, and a-SiOCN:HX which are added with the above n-type or p-type valence electron controlling agent at a high concentration; microcrystalline (uc-) silicon-containing semiconductor materials such as uc-Si:H, uc-Si:HX, uc-SiC:H, uc-SiC:HX, uc-SiGe:H, uc-SiGe:HX, uc-SiGeC:H, uc-SiGeC:HX, uc-SiO:H, uc-SiO:HX, uc-SiN:H, uc-SiN:HX, uc-SiON:H, uc-SiON:HX, uc-SiOCN:H, and ucSiOCN:HX which are added with the above n-type or p-type valence electron controlling agent at a high concentration; polycrystalline (poly-) silicon-containing semiconductor materials such as poly-Si:H, poly-Si:HX, poly-SiC:H, polySiC:HX, poly-SiGe:H, poly-SiGe:HX, poly-SiGeC:H, poly-SiGeC:HX, poly-SiO:H, poly-Sio:HX, poly-SiN:H, poly-SiN:HX, poly-SiON:H, poly-SiON:HX, poly-SiOCN:H, and poly-SiOCN:HX which are added with the above n-type or p-type valence electron controlling agent at a high concentration.

For the hydrogen atoms (H, D) or/and the halogen atoms contained in each of the n-type and p-type semiconductor layers, they are desired to be contained such that their concentration distribution is enhanced not only on the side of the interface with the i-type semiconductor layer.

For the n-type or p-type semiconductor layer situated on the side through which light is impinged, it is desired to be constituted by a crystalline semiconductor material which does not tend to absorb light and has a wide band gap.

Each of the n-type and p-type semiconductor layers is desired to have an activation energy preferably of 0.2 eV or less, most preferably 0.1 eV or less and a resistivity of preferably 100 Ωcm or less, most preferably 1 Ωcm or less.

The photoelectric conversion layer may be designed to have an even surface or an uneven surface. In the case where the photoelectric conversion layer is made to have an uneven surface, the uneven surface may be an irregular surface provided with a plurality of linear irregularities or recesses based on the uneven surface structure of the substrate.

The photoelectric conversion layer may be desirably formed by means of a conventional microwave (uW) plasma CVD process or a conventional high frequency (RF) plasma CVD process.

The formation of the photoelectric conversion layer by the microwave plasma CVD process may be conducted using a microwave plasma CVD apparatus comprising a deposition chamber capable of being vacuumed and provided with a microwave power introduction means (comprising a microwave transmissive window (made of an alumina ceramic or the like) and a waveguide extending a microwave power source), an exhaust system having a vacuum pump, and a raw material gas introduction means, for example, in the following manner.

A substrate on which a deposited film is to be formed is arranged in the deposition chamber. The inside of the deposition chamber is provisionally evacuated to a desired vacuum degree by means of the vacuum pump. The substrate is maintained at a desired temperature (for instance, 100 to 450° C.). A given film-forming raw material gas (together with a given doping gas in the case of forming a doped deposited film of n-type or p-type), if necessary together with a dilution gas, is introduced into the deposition chamber through the raw material gas introduction means. The gas pressure in the deposition chamber is controlled to a desired value (for instance, 0.5 to 30 mTorr) by means of the vacuum pump. When the gas pressure in the deposition chamber becomes constant at said desired value, the microwave power source is switched on to apply a microwave power with a desired oscillation frequency (for instance, 0.1 to 10 GHz) and of a desired wattage (for instance, 0.01 to 1 W/cm$^3$) into the deposition chamber, where plasma glow discharge causes the decomposition of the raw material gas whereby producing a plasma, resulting in the formation of a deposited film as a semiconductor layer on the substrate at a desired deposition rate (for instance, 0.05 to 20 nm/sec.).

The formation of the photoelectric conversion layer by the RF plasma CVD process may be conducted using a RF plasma CVD apparatus comprising a deposition chamber capable of being vacuumed and provided with a RF power introduction means having a RF power source, an exhaust system having a vacuum pump, and a raw material gas introduction means, for example, in the following manner.

A substrate on which a deposited film is to be formed is arranged in the deposition chamber. The inside of the deposition chamber is provisionally evacuated to a desired vacuum degree by means of the vacuum pump. The substrate is maintained at a desired temperature (for instance, 100 to 350° C.). A given film-forming raw material gas (together with a given doping gas in the case of forming a doped deposited film of n-type or p-type), if necessary together with a dilution gas, is introduced into the deposition chamber through the raw material gas introduction means. The gas pressure in the deposition chamber is controlled to a desired value (for instance, 0.1 to 10 Torr) by means of the vacuum pump. When the gas pressure in the deposition chamber becomes constant at said desired value, the RF power source is switched on to apply a RF power with a desired oscillation frequency (for instance, 0.1 to 100 MHz) and of a desired wattage (for instance, 0.001 to 5.0 W/cm$^3$) into the deposition chamber, where plasma glow discharge causes the decomposition of the raw material gas whereby producing a plasma, resulting in the formation of a deposited film as a semiconductor layer on the substrate at a desired deposition rate (for instance, 0.01 to 3 nm/sec.).

Transparent Electrode Layer

The transparent electrode layer (107, 213) serves as an electrode having a property of transmitting light on the light incident side. When the thickness of the transparent electrode is adequately adjusted, it also functions as a reflection preventive layer.

The transparent electrode layer is required to have a sufficient transmittance for light having a wavelength which is capable of being absorbed by the photoactive semiconductor layer and a sufficiently low electric resistance. For the transmittance, it is preferably 80% or more, more preferably 85% or more, most preferably 90% or more, for light having a wavelength of 550 nm or more. For the electric resistance, it is preferably $5 \times 10^{-3}$ Ωcm or less, more preferably $1 \times 10^3$ Ωcm or less.

The transparent electrode layer is constituted by an electrically conductive material selected from the group consisting of inorganic oxides such as $In_2O_3$, $SnO_2$, ITO ($In_2O_3$-$SnO_2$), ZnO, CdO, $Cd_2SnO_4$, $TiO_2$, $Ta_2O_5$, $Bi_2O_3$, $MoO_3$ and $Na_xWO_3$ and mixtures of these inorganic oxides. Any of these electrically conductive materials may contain a conductivity-controlling dopant.

As such dopant, there can be mentioned Al, In, B, Ga, F and Si, for instance, in the case where the transparent electrode layer is comprised of ZnO. In the case where the transparent electrode layer is comprised of $In_2O_3$, there can be mentioned Sn, F, Te, Ti, Sb and Pb. In the case where the transparent electrode layer is comprised of $SnO_2$, there can be mentioned F, Sb, P, As, In, Tl, Te, W, Cl, Br and I.

The transparent electrode layer constituted by any of the above-mentioned materials may be formed by means of a conventional manner such as electron beam evaporation, sputtering, CVD, spray coating, spin coating, or dip coating.

The transparent electrode layer may be designed to have an even surface or an uneven surface. In the case where the transparent electrode layer is made to have an uneven surface, the uneven surface may be an irregular surface provided with a plurality of linear irregularities or recesses based on the uneven surface structure of the substrate.

Collecting Electrode

The collecting electrode (108, 214) (or the grid eletrode) serves to effectively collect an electric current generated. The collecting electrode is not always necessary. It is disposed on a part of the surface of the transparent electrode (107, 213) if required when the electric resistance of the transparent electrode is difficult to be sufficiently lowered. In this case, the collecting electrode functions to lower the electric resistance of the transparent electrode.

The collecting electrode may be constituted by a metal selected from the group consisting of Au, Ag, Cu, Al, Ni, Fe, Cr, Mo, W, Ti, Co, Ta, Nb and Zr or an alloy selected from the group consisting of alloys such as Ti, Cr, Mo, W, Al, Ag, Ni, Cu, Sn, or an alloy of these metals. Alternatively, the collecting electrode may be formed of an electrically conductive paste. The electroconductive paste can include electrically conductive pastes comprising powdery Ag, Au, Cu, Ni or carbon dispersed in an appropriate binder resin.

The collecting electrode may be formed by means of evaporation, sputtering or plating, using a mask pattern.

The formation of the collecting electrode using the above-described electroconductive paste can be conducted by subjecting the electroconductive paste to screen printing.

Incidentally, in the case of producing a photovoltaic module or panel using a photovoltaic device according to the present invention, the production thereof may be conducted, for example, in the following manner.

There is provided a plurality of photovoltaic devices having the above constitution, and they are integrated in series connection or in parallel connection depending upon a desired outputting voltage or outputting electric current. A protective member is disposed on each of the surface and the back face of the integrated body obtained, and a pair of power outputting terminals are fixed to the resultant. It is possible to dispose the integrated body on an insulating member. For the integrated body in series connection, an appropriate reverse-current preventive diode may be installed therein.

In the following, the present invention will be described in more detail with reference to examples. It should be understood that the present invention is not limited to these examples.

EXAMPLE 1

In this example, there was prepared a photovoltaic device of the configuration shown in FIG. 1 using a substrate having a specific irregular surface structure according to the present invention in the following manner.

(1) Preparation of Substrate

There was provided a stainless steel slab obtained by way of the previously described steel making, hot rolling, cold rolling, and final processes. The slab was subjected to bright-annealing, followed by subjecting to surface finishing by means of a skinpass rolling mill, to thereby obtain a 0.15 $\mu$m thick stainless steel plate (corresponding to a SUS430BA plate prescribed in the JIS Standard) of 50 mm×50 mm in size. The stainless steel plate was then subjected to surface etching treatment using a fluorinenitric acid composition (comprising HF, $HNO_3$ and $H_2O$ at a mole ratio of 1:3:15) for 30 seconds while applying ultrasonic vibration as shown in Table 1-1. By this, there was obtained a stainless steel substrate having an irregular surface with a specific irregular surface structure as the substrate 101. In this way, there were prepared a plurality of stainless steel substrates having a specific irregular surface structure. One of these stainless steel substrates was reserved as a specimen (Substrate Sample Ex. 1-1) for evaluation, which will be later described.

The remaining stainless steel substrates were subjected to film formation.

(2) Formation of Back Reflection Layer and Transparent and Electrically Conductive Layer For each of the remaining stainless substrates, on its irregular surface structure surface, a 0.05 $\mu$m thick Al film as the back reflection layer 102 and a 1.0 $\mu$m thick ZnO film as the transparent and electrically conductive layer 103 were sequentially formed.

The formation of the Al back reflection layer was conducted using a DC magnetron sputtering apparatus shown in FIG. 5 in the following manner under conditions shown in Table 1-1.

The stainless steel substrate was introduced into a deposition chamber 501 of the DC magnetron sputtering apparatus, and the stainless steel substrate (502 in FIG. 5) was positioned on a mounting table 503 having an electric heater installed therein. The inside of the deposition chamber 501 was evacuated to a vacuum degree of 1×10$^{-6}$ Torr through an exhaust port connected through a conductance valve 513 to an oil diffusion pump (not shown). When the inner pressure of the deposition chamber 501 became constant at said vacuum degree, a valve 514 was opened to introduce Ar gas from a gas reservoir (not shown) into the deposition chamber 501 at a flow rate of 50 sccm while adjusting a mass flow controller 516. The conductance valve 513 was regulated to adjust the inner pressure of the deposition chamber 501 at 7 mTorr. A target shutter 507 was opened. A D.C. power of −380 V from a toroidal coil 506 was applied to an Al-target 504 to cause Ar plasma. By this, there was formed a 0.05 $\mu$m thick Al film as the back reflection layer 102 on the irregular surface structure surface of the substrate 101.

After the formation of the back reflection layer 102, the target shutter 507 was closed, and the application of the D.C. power and the introduction of the Ar gas were terminated.

On the Al film thus formed as the back reflection layer 102, a ZnO film as the transparent and electrically conductive layer 103 was formed by repeating the above film-forming procedures using the magnetron sputtering apparatus shown in FIG. 5 under conditions shown in Table 1-1. In the formation of the ZnO film, Ar gas was introduced into the deposition chamber 501 at a flow rate of 40 sccm, the substrate temperature upon the film formation was made to be 200° C., and the inner pressure upon the film formation was made to be 5 mTorr. A D.C. power of −500 V from a D.C. power source 510 was applied to an ZnO-target 508 to cause Ar plasma, and a target shutter 511 was opened. By this, there was formed a 1.0 $\mu$m thick ZnO film as the the transparent and electrically conductive layer 103 on the Al film as the back reflection layer 102.

After the formation of the transparent and electrically conductive layer 103, the target shutter 511 was closed, and the application of the D.C. power and the introduction of the Ar gas were terminated.

In this way, there were prepared a plurality of substrate products comprising the back reflection layer 102 and the transparent and electrically conductive layer 103 stacked in the named order on the substrate 101.

One of these substrate products was reserved as a specimen (Substrate Product Sample Ex. 1-2) for evaluation, which will be later described.

The remaining substrate products were subjected to semiconductor layer formation.

(3) Formation of Semiconductor Layer

For each of the remaining substrate products, on its ZnO film (as the transparent and electrically conductive layer 103), a three-layered semiconductor layer (comprising an n-type layer 104 composed of an a-Si material, an i-type layer 105 composed of an a-Si material and a p-type layer 106 composed of a microcrystalline Si material (a uc-Si material) stacked in the named order from the substrate side) under conditions shown in Table 1-1, using a multi-chambered film-forming apparatus shown in FIG. 6.

The n-type and p-type layers were formed by means of a RF plasma CVD process. The i-type layer was formed by means of the RF plasma CVD process and a microwave plasma CVD process. The i-type layer herein has a three-layered structure comprising an i-type layer formed by the RF plasma CVD process (this i-type layer will be hereinafter referred to as first RF i-type layer), an i-type layer formed by the microwave plasma CVD process (this i-type layer will be hereinafter referred to as MW i-type layer) and a second RF i-type layer formed by the RF plasma CVD process.

The formation of the three-layered semiconductor layer with a pin junction was formed in the following manner.

First, all the transportation systems and deposition chambers of the apparatus shown in FIG. 6 were evacuated to a vacuum degree of about 10$^{-6}$ Torr. The substrate product (obtained in the above step (2)) was fixed to the rear face of a substrate holder 690, followed by introduction into a load rock chamber 601, where the substrate holder 690 was positioned on a transportation rail 613. The inside of the load rock chamber 601 was evacuated to a vacuum degree of about 10$^{-3}$ Torr by means of a vacuuming means comprising a mechanical booster pump and a rotary pump (not shown), followed by evacuating to a vacuum degree of about 10$^{-6}$ Torr by means of a turbo-molecular pump (not shown).

Formation of n-type Layer

Then, a gate valve 606 was opened, and the substrate holder 690 was moved into an n-type layer transportation chamber 602 including a deposition chamber 617 for the formation of an n-type layer. The gate valve 606 was closed. Then, the substrate holder 690 was moved to a position under a substrate temperature controlling means 610 of the deposition chamber 617, where hydrogen gas was flown to make the inner pressure of the n-type layer transportation chamber 602 such that it was substantially the same as that upon conducting the film formation of the n-type layer. Then, the the substrate temperature controlling means 610 was lowered to heat the substrate product to and maintain it at 330° C. (see, Table 1-1) by means of the substrate temperature controlling means. Through a raw material gas supply system comprising mass flow controllers 636–639 and stop valves 630–634 and 641–644, raw material gases shown in Table 1-1 for the formation of the n-type layer were introduced into the deposition chamber 617. The inner pressure of the deposition chamber 617 was controlled to and maintained at 1.2 Torr by means of a vacuuming pump (not shown). Then, a RF power source 622 was switched on to apply a RF power of 2 W into the deposition chamber 617 through a RF power introduction cup 620, where glow discharge caused the formation of a 20 nm thick n-type a-Si semiconductor film as the n-type layer on the ZnO film as the transparent and electrically conductive layer. After this, the application of the RF power and the introduction of the raw material gases were terminated. Then, the inside of the transportation chamber 602 was evacuated to a vacuum degree of about $10^{-6}$ Torr by means of a turbo-molecular pump (not shown).

The substrate controlling means 610 was raised, a gate valve 607 was opened, and the substrate holder 690 was moved into an i-type layer transportation chamber 603 including a deposition chamber 618 for the formation of an i-type layer. The gate valve 607 was closed.

Formation of First RF i-type Layer

The substrate holder 690 was then moved to position under a substrate temperature controlling means 611 of the deposition chamber 618, where hydrogen gas was flown to make the inner pressure of the transportation chamber 603 such that it was substantially the same as that upon conducting the film formation of the first RF i-type layer. Then, the substrate temperature controlling means 611 was lowered to heat the substrate temperature to and maintain it at 300° C. (see, Table 1-1) by means of the substrate temperature controlling means. Through a raw material gas supply system comprising a gas introduction pipe 649, stop valves 650–655 and 661–665 and mass flow controllers 656–660, raw material gases shown in Table 1-1 for the formation of the first RF i-type layer were introduced into the deposition chamber 618 under conditions shown in Table 1-1. The inner pressure of the deposition chamber 618 was controlled to and maintained at 0.5 Torr by means of a vacuuming pump (not shown). While maintaining a shutter 695 of the deposition chamber 618 in a closed state, a RF power source 624 was switched on to apply a RF power of 1.7 W into the deposition chamber 618 through a RF bias power introduction electrode 628 to generate glow discharge whereby producing a plasma in the deposition chamber 618. When the plasma became stable, the shutter 650 was opened to cause the formation of a 10 nm thick i-type a-Si semiconductor film as the first RF i-type layer on the n-type layer.

After this, the shutter 695 was closed, and the application of the RF power and the introduction of the raw material gases were terminated. Then, the inside of the deposition chamber 603 was evacuated to a vacuum degree of about $10^{-6}$ Torr by means of a turbo-molecular pump (not shown).

Formation of MW i-type Layer

Then, hydrogen gas was flown to make the inner pressure of the transportation chamber 603 such that it was substantially the same as that upon conducting the film formation of the MW i-type layer. Thereafter, the substrated temperature was heated to and maintained at 380° C. by means of the substrate temperature controlling means 611. Through the above-described raw material gas supply system, raw material gases shown in Table 1-1 for the formation of a MW i-type layer were introduced into the deposition chamber 618 under conditions shown in Table 1-1. The inner pressure of the deposition chamber 618 was controlled to and maintained at 8 mTorr by means of a vacuuming pump (not shown). Then, a microwave power source (not shown) was switched on to apply a microwave power of 200 W into the deposition chamber 618 through a waveguide 626 and a microwave introduction window 625, and simultaneously with this, a RF bias power of 700 W from a RF bias power source (not shown) was applied into the deposition chamber 618 through the electrode 628, where glow discharge produced a plasma in the deposition chamber 618. When the plasma became stable, the shutter 695 was opened to cause the formation of a 70 nm thick i-type a-Si semiconductor film as the Mw i-type layer on the first RF i-type layer.

After this, the shutter 695 was closed, and the application of the MW power and the RF bias power and the introduction of the raw material gases were terminated. Then, the inside of the deposition chamber 602 was evacuated to a vacuum degree of about $10^{-6}$ Torr by means of a turbo-molecular pump (not shown).

Formation of Second RF i-type Layer

The above procedures for the formation of the first RF i-type layer were repeated to form a 20 nm thick i-type a-Si semiconductor film as the second RF i-type layer on the MW i-type layer.

After this, the application of the RF power and the introduction of the raw material gases were terminated.

Then, the inside of the transportation chamber 603 was evacuated to a vacuum degree of about $10^{-6}$ Torr by means of a turbo-molecular pump (not shown).

The substrate temperature controlling means 611 was raised, a gate valve 608 was opened, and the substrate holder 690 was moved into a p-type layer transportation chamber 604 including a deposition chamber 619 for the formation of a p-type layer. The gate valve 608 was closed.

Hydrogen Plasma Treatment

Then, the substrate holder 690 was moved to a position under a substrate temperature controlling means 612 of the deposition chamber 619, where through a raw material gas supply system comprising stop valves 670–674 and 681–684 and mass flow controllers 676–679, hydrogen gas ($H_2$ gas) was introduced into the deposition chamber 619 to make the inner pressure of the transportation chamber 604 such that it was substantially the same as that (2.0 Torr) upon conducting hydrogen plasma treatment for the surface of the second RF i-type layer. Then, the substrate temperature controlling means 612 was lowered to heat the substrate temperature to and maintain it at 200° C. (see, Table 1-1) by means of the substrate temperature controlling means. When the flow rate of the hydrogen gas became constant at a flow rate of 80 sccm, a RF power source 623 was switched on to apply a RF power of 30 W into the deposition chamber 619 through a RF power introduction cup 621, whereby glow discharge was generated in the hydrogen gas to produce hydrogen plasma, by which the surface of the second RF i-type layer was treated for 30 seconds. The conditions for this hydrogen plasma treatment are shown in Table 1-1.

Formation of p-type Layer

The procedures in the above hydrogen plasma treatment where repeated, except that raw material gases shown in Table 1-1 for the formation of a p-type layer were introduced into the deposition chamber 619 under conditions shown in Table 1-1 through the above raw material gas supply system, to thereby form a 20 nm thick p-type uc-Si semiconductor film as the p-type layer on the hydrogen plasma treated surface of the second RF i-type layer.

After this, the application of the RF power and the introduction of the raw material gases were terminated. The substrate temperature controlling means 612 was raised. Then, hydrogen gas was flown into the p-type layer transportation chamber for 5 minutes. Thereafter, the introduction of the hydrogen gas was terminated. Then, the inside of the transportation chamber 604 was evacuated to a vacuum degree of about $10^{-6}$ Torr by means of a turbo-molecular pump (not shown). A gate valve 609 was opened and the substrate holder 690 was moved into an unload chamber 605, where the resultant was cooled. It was then taken out from the film-forming apparatus.

On the p-type layer of the resultant, there was formed a 70 nm thick $In_2O_3$ film as the transparent electrode layer 107 by means of a resistance heating vacuum deposition process.

Figure 4:
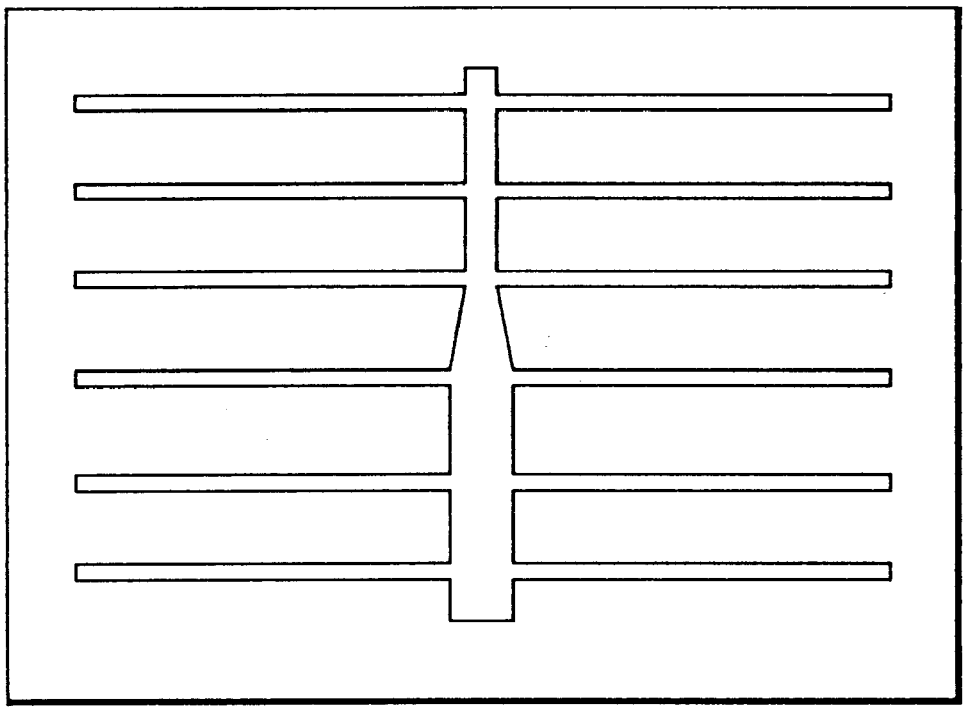
FIG. 4 is a schematic plan view illustration of a pattern example of a collecting electrode used in a photovoltaic device according to the present invention.

Finally, on the transparent electrode layer 107, there was formed a comb-shaped collecting electrode (having the configuration shown in FIG. 4) comprising Cr(100 nm)/Ag(1 $\mu$m)/Cr(100 nm) by means of a vacuum evaporation Thus, there was obtained a photovoltaic device of the configuration shown in FIG. 1.

In this way, there were prepared five photovoltaic device samples as Element Sample Ex. 1-1 for evaluation, which will be later described.

Comparative Example 1-1

The procedures of Example 1 were repeated, except that abrasive polishing and buff polishing were additionally conducted in the surface treatment of the SUS plate in Example 1, to thereby obtain a substrate specimen as Substrate Sample Comp. 1-1 for evaluation, a substrate product as Substrate Product Sample Comp. 1–4 for evaluation, and five photovoltaic device samples as Element Sample Comp. 1-1 for evaluation.

Comparative Example 1-2

The procedures of Example 1 were repeated, except that abrasive polishing, buff polishing and electrolytic polishing were additionally conducted in the surface treatment of the SUS plate in Example 1, to thereby obtain a substrate specimen as Substrate Sample Comp. 1-2 for evaluation, a substrate product as Substrate Product Sample Comp. 1-5 for evaluation, and five photovoltaic device samples as Element Sample Comp. 1-2 for evaluation.

Comparative Example 1-3

The procedures, of Example 1 were repeated, except that surface texturing treatment by way of beads-blasting treatment at an air pressure of 0.5 Kgf/cm² was conducted after the bright annealing in the surface treatment of the SUS plate in Example 1, to thereby obtain a substrate specimen as Substrate Sample Comp. 1-3 for evaluation, a substrate product as Substrate Product Sample Comp. 1-6 for evaluation, and five photovoltaic device samples as Element Sample Comp. 1-3 for evaluation.

Evaluation

1. For each of the Substrate Samples Ex. 1-1, Comp. 1-1, Comp. 1-2, and Comp. 1-3, its surface pattern was observed by means of an electron microscope (SEM).

The observed results obtained are collectively shown in Table 1-2.

From the results shown in Table 1-2, it is understood that the sample Ex. 1-1 has an irregular surface pattern provided with linear irregularities arranged in a given direction, the sample Comp. 1-1 has a substantially flat surface pattern with no linear irregularities, the sample Comp. 1-2 has a flatter surface pattern than the Comp. 1-1 and has no linear irregularities, and the sample Comp. 1-3 has a surface pattern having an irregular texture structure distributed on the entire surface area and having no linear irregularities.

2. For each of the Substrate Product Samples Ex. 2, Comp. 1-4, Comp. 1-5, and Comp. 1-6, the mean particle size ratio of the ZnO film as the back reflection layer was examined by a conventional manner.

In addition, for each substrate product sample, the total reflectance (the sum of the regular reflectance and diffuse reflectance) and the diffuse reflectance were examined using a spectrophotometer provided with an integrating sphere.

The examined results obtained are collectively shown in Table 1-3. The values shown in Table 1-3 are normalized based on the values obtained for the substrate product sample of Ex. 1-2.

From the results shown in Table 1-3, the following facts are understood. The substrate product sample Ex. 1-2 has an apparently large mean particle size ratio for the ZnO film and excels in total reflectance and diffuse reflectance. Each of the substrate product samples Comp. 1-4 and Comp. 1-5 has a relatively small mean particle ratio for the ZnO film and is inferior in diffuse reflectance. The substrate product sample Comp. 1-6 is inferior in total reflectance, though it is relatively high in diffuse reflectance.

3. For each of the Element Samples Ex. 1-1, Comp. 1-1, Comp. 1-2, and Comp. 1-3 each comprising the five photovoltaic device samples, each of the five photovoltaic device samples of each Element Sample was cut into 25 elements having an equal area. By this, there were obtained 125 elements in total for each Element Sample.

Using the resultant elements, for each Element Sample, evaluation was conducted with respect to (1) yield, (2) adhesion strength, (3) initial photoelectric conversion efficiency, (4) light degradation, (5) degradation in HHRB test, and (6) degradation in temperature and humidity cycle test in the following manner. The evaluated results obtained are collectively shown in Table 1-4.

(1) Evaluation of the Yield

For each of the 125 elements of each Element Sample, a reverse bias voltage of –1.0 V was applied while maintaining the element in a dark atmosphere where a shunt resistance was measured. There was examined the number of the elements having shown a shunt resistance of a value of at least $3.0 \times 10^4$ $\Omega cm^2$ which is practically acceptable. The examined number is shown as the yield in Table 1-4.

The values shown in Table 1-4 are values relative to the numerical value of the Element Sample Ex. 1-1 with respect to the yield, which is set at 1.0.

(2) Evaluation of the Adhesion Strength

This evaluation was conducted by way of a conventional adhesion strength test in the following manner. For one randomly selected from the 125 elements of each Element Sample, 10 incisions were made crosswise at an interval of 1 mm at the surface thereof to form a lattice pattern comprising 100 measures. Then, a cellophane adhesive tape was sufficiently laminated on the lattice pattern, followed by instantaneously peeling off the cellophane adhesive tape. And the area of the element which was peeled was examined. The peeled area thus examined was made to be the adhesion strength.

The evaluated results obtained are collectively shown in Table 1-4. The values shown in Table 1-4 are values relative to the peeled area of the Element Sample Ex. 1-1, which is set at 1.0.

(3) Evaluation of the Initial Photoelectric Conversion Efficiency

This evaluation was conducted in the following manner. One randomly selected from the 125 elements of each Element Sample was subjected to irradiation of light of AM 1.5 with an intensity of 100 mW/cm$^2$, where V-I characteristics were measured to obtain an initial photoelectric conversion efficiency.

The evaluated results obtained are collectively shown in Table 1-4. The values shown in Table 1-4 are values relative to the initial photoelectric conversion efficiency of the Element Sample Ex. 1-1, which is set at 1.0.

(4) Evaluation of the Light Degradation

This evaluation was conducted in the following manner. The element of each Element Sample which has been subjected to the measurement of the initial photoelectric conversion efficiency in the above (3) was again subjected to irradiation of light of AM 1.5 with an intensity of 100 mW/cm$^2$ in an atmosphere of 25° C./50% RH for 500 hours and thereafter, its photoelectric conversion efficiency under the irradiation of light of AM 1.5 with an intensity of 100 mW/cm$^2$ was measured in the same manner as in the above (3). A rate of change (or a reduction ratio) between the initial photoelectric conversion efficiency and the photoelectric conversion efficiency after the endurance was determined.

The evaluated results obtained are collectively shown in Table 1-4. The values shown in Table 1-4 are values relative to the change of rate of the Element Sample Ex. 1-1, which is set at 1.0.

(5) Evaluation of the Degradation in HHRB Test

This evaluation was conducted by way of a conventional HHRB (high temperature-high humidity reverse bias) test in the following manner. For one randomly selected from the remaining elements of each Element Sample, its initial photoelectric conversion efficiency was measured in the same manner as in the above (3). The element was then maintained in a dark atmosphere of 80° C./80% RH for 100 hours while applying a reverse bias voltage of 0.8 V. Thereafter, its photoelectric conversion efficiency under the irradiation of light of AM 1.5 with an intensity of 100 mW/cm$^2$ was measured in the same manner as in the above (3). A rate of change (or a reduction ratio) between the initial photoelectric conversion efficiency and the photoelectric conversion efficiency after the endurance was determined.

The evaluated results obtained are collectively shown in Table 1-4. The values shown in Table 1-4 are values relative to the change of rate of the Element Sample Ex. 1-1, which is set at 1.0.

(6) Evaluation of the Degradation in Temperature and Humidity Cycle Test

This evaluation was conducted by way of a conventional temperature and humidity cycle test in the following manner. For one randomly selected from the remaining elements of each Element Sample, its initial photoelectric conversion efficiency was measured in the same manner as in the above (3). The element was then subjected to alternate repetition of a cycle of exposing to a dark atmosphere of 85° C./85% RH for 3 hours, a cycle of exposing to an atmosphere of −40° C. for 70 minutes, and a cycle of exposing to an atmosphere of 85° C./85% RH for 70 minutes 20 times. Thereafter, its photoelectric conversion efficiency under the irradiation of light of AM 1.5 with an intensity of 100 mW/cm$^2$ was measured in the same manner as in the above (3). A rate of change (or a reduction ratio) between the initial photoelectric conversion efficiency and the photoelectric conversion efficiency after the endurance was determined.

The evaluated results obtained are collectively shown in Table 1-4. The values shown in Table 1-4 are values relative to the change of rate of the Element Sample Ex. 1-1 which is set at 1.0.

Based on the results shown in Table 1-4, the following facts are understood. The Element Samples Comp. 1-1 and Comp. 1-2 are apparently inferior to the Element Sample Ex. 1-1 in terms of the yield and adhesion strength.

The Element Samples Comp. 1-1 and Comp. 1-2 are inferior to the Element Sample Ex. 1-1 also in terms of other evaluation items. For the reason why the Element Samples Comp. 1-1 and Comp. 1-2 are thus inferior to the Element Sample Ex. 1-1, it is considered mainly due to a decrease in the fill factor (F.F.) caused by an increase in the series resistance because of the insufficiency in the adhesion strength.

The Element Sample Comp. 1-3 is apparently inferior to the Element Sample Ex. 1-1 in terms of the initial photoelectric conversion efficiency and the photoelectric conversion efficiency after endurance. For the reason why the Element Sample Comp. 1-3 is inferior to the Element Sample Ex. 1-1 in terms of the initial photoelectric conversion efficiency, it is considered such that in the Element Sample Comp. 1-3, the magnitude of the irregularities is excessively large and because of this, certain defects occur in the semiconductor layer portion causing a decrease in the shunt resistance, resulting in a decrease in the fill factor (F.F.) and also in the open circuit voltage (Voc).

Hence, it is understood that the photovoltaic device (the Element Sample Ex. 1-1) is apparently superior to any of the conventional photovoltaic devices (the Element Samples Comp. 1-1, Comp. 1-2 and Comp. 1-3) in terms of the photovoltaic characteristics.

EXAMPLE 2

In this example, there was prepared a plurality of photovoltaic devices of the configuration shown in FIG. 1 in the following manner.

(1) Preparation of Substrate

There were provided a plurality of stainless steel slabs obtained by way of the previously described steel making, hot rolling, cold rolling and final processes. Each stainless steel slab was subjected to surface roughing treatment by a different manner as shown in Table 2-1, particularly a manner of conducting bright-annealing or/and conducting a combination of annealing and acid-washing or/and conducting or not conducting surface finishing by means of a skinpass rolling mill, and conducting mechanical polishing (belt polishing, buff polishing, or barrel polishing) or electrolytic polishing.

By this, there were obtained a variety of stainless steel plates of 0.20 mm in thickness and 50 mm×50 mm in size and each having a different irregular surface with a specific irregular surface structure comprising a plurality of linear irregularities or recesses arranged as shown in FIGS. 3(a), 3(b), or 3(c).

In this way, for each stainless steel plate having a different specific irregular surface structure, there were prepared a plural number of the stainless steel plates.

Each of the resultant stainless steel plates was subjected to surface etching treatment in the following manner under conditions shown in Table 2-1.

The stainless steel plate was introduced into the deposition chamber 501 of the DC magnetron sputtering apparatus shown in FIG. 5, and the stainless steel plate (502 in FIG. 5) was positioned on the mounting table 503 having the electric heater installed therein. The temperature of the stainless steel plate was heated to and maintained at a temperature of RT to 200° C. by means of the heater. Then, the inside of the deposition chamber 501 was evacuated to a vacuum degree of $1 \times 10^{-6}$ Torr through the exhaust port connected through the conductance valve 513 to the oil diffusion pump (not shown). When the inner pressure of the deposition chamber 501 became constant at said vacuum degree, the valve 514 was opened to introduce Ar gas from the gas reservoir (not shown) into the deposition chamber 501 at a flow rate of 50 sccm while adjusting the mass flow controller 516. The conductance valve 513 was regulated to adjust the inner pressure of the deposition chamber 501 at 6 mTorr. A RF power of a wattage in the range of 100 to 600 W from the sputtering power source 506 was applied to the stainless steel plate to generate glow discharge whereby producing Ar plasma in the deposition chamber 501, where the generation of the glow discharge producing the Ar plasma was continued for 2 to 10 minutes, whereby the surface of the stainless steel plate was etched by the Ar plasma. After this, the application of the RF power and the introduction of the Ar gas were terminated. The stainless steel substrate was cooled to room temperature, and it was taken out from the apparatus. By this, the surface of the irregular surface structure of each stainless steel plate was etched by the Ar plasma.

In this way, in each case, there were obtained a plurality of substrate samples.

For the substrate samples thus obtained in each case, one of them was reserved for evaluation.

(2) Preparation of Photovoltaic Device

On each of the remaining substrate samples, a photoelectric conversion layer having a stacked structure with a pin junction was formed in the same manner as in Example 1 under conditions shown in Table 2-1, and a transparent electrode composed of $In_2O_3$ and a collecting electrode were formed on the photoelectric conversion layer in the same manner as in Example 1 under conditions shown in Table 2-1. By this, there was obtained a photovoltaic device.

In this way, there were prepared a plurality of photovoltaic device samples for each of the different substrate samples.

Evaluation

1. For each of the substrate samples reserved for evaluation, using a profilometer (ALPHASTEP: trade name, produced by Dencor Company), the irregular surface pattern was examined by measuring a center line average roughness Ra(X) in a direction parallel to the linear irregularities and a center line average roughness Ra(Y) in a direction perpendicular to the linear irregularities, wherein scanning was conducted for a length L of 400 um and the measurement was conducted at five points for every length of 1 um.

As a result, each substrate sample was found to be in the range of 5 to 350 nm for the Ra(X) and in the range of 8 to 650 nm for the Ra(Y).

2. For the photovoltaic device samples obtained in the above, evaluation was conducted with respect to (a) yield, (b) adhesion strength, (c) degradation in HHRB test, and (d) degradation in temperature and humidity cycle test in the same manner as in Example 1.

2-(1) The evaluated results with respect to the yield (a) are collectively and graphically shown in FIG. 8(*a*) in relation to the Ra(X) and Ra(Y).

In FIG. 8(*a*), the photovoltaic device sample in which the substrate product sample of 30 nm in Ra(X), 50 nm in Ra(Y) and 0.6 in Ra(X)/Ra(Y) was used and which was found to be satisfactory in the yield (a) is indicated by a mark ○ as a standard. For the photovoltaic device sample which is superior to the standard in terms of the yield, it is indicated by a mark ◎. For the photovoltaic device sample which is inferior to the standard in terms of the yield, it is indicated by a mark Δ. For the photovoltaic device sample which is distinguishably inferior to the standard in terms of the yield, it is indicated by a mark •.

From the results shown in FIG. 8(*a*), the following facts are understood. In the case of using the substrate sample of 15 to 300 nm in Ra(X), 20 to 600 nm in Ra(Y) and 0.8 or less in Ra(X)/Ra(Y), the yield of a desirable photovoltaic device is satisfactory. Particularly, in the case of using the substrate sample of 25 to 150 nm in Ra(X), 60 to 300 nm in Ra(Y) and 0.8 or less in Ra(X)/Ra(Y), the yield of a desirable photovoltaic device is markedly excellent.

On the other hand, in the case of using the substrate sample of beyond 300 nm in Ra(X), the substrate sample of beyond 600 nm in Ra(Y), or the substrate sample of less than 20 nm in Ra(Y) and less than 0.8 in Ra(X)/Ra(Y), the yield of a practically usable photovoltaic device is apparently inferior. The reason for this was found to be a decrease in the shunt resistance due to an excessively large magnitude of the linear irregularities.

Further, in the case of using the substrate sample of 300 nm or less in Ra(X) and less than 20 nm in Ra(Y) or the substrate sample of less than 15 nm in Ra(X) and 600 nm or less in Ra(Y), the yield of a practically usable photovoltaic device is apparently inferior. The reason for this was found to be mainly layer peeling.

2-(2) The evaluated results with respect to the degradation in HHRB test (c), and the degradation in temperature and humidity cycle test (d) are collectively and graphically shown in FIG. 8(*b*) in relation to the Ra(X) and Ra(Y).

In FIG. 8(*b*), the photovoltaic device sample in which the substrate sample of 30 nm in Ra(X), 50 nm in Ra(Y) and 0.6 in Ra(X)/Ra(Y) was used and which was found to be satisfactory in the evaluation items (c) and (d) is indicated by a mark ○ as a standard. For the photovoltaic device sample which is superior to the standard in terms of the evaluation items (c) and (d), it is indicated by a mark ◎. For the photovoltaic device sample which is inferior to the standard in terms of the evaluation items (c) and (d), it is indicated by a mark Δ. For the photovoltaic device sample which is distinguishably inferior to the standard in terms of the evaluation items (c) and (d), it is indicated by a mark ●.

From the results shown in FIG. 8(*b*), the following facts are understood. In the case of using the substrate sample having an irregular surface structure of 15 to 300 nm in Ra(X), 20 to 600 nm in Ra(Y) and 0.8 or less in Ra(X)/Ra(Y), any of the resultant photovoltaic device samples is quite satisfactory in the evaluation items (c) and (d). Particularly, in the case of using the substrate sample having an irregular surface structure of 25 to 150 nm in Ra(X), 60 to 300 nm in Ra(Y) and 0.8 or less in Ra(X)/Ra(Y), any of the resultant desirable photovoltaic device samples is markedly excellent in the evaluation items (c) and (d).

On the other hand, for the photovoltaic device samples obtained using the substrate sample of beyond 300 nm in Ra(X), the substrate sample of beyond 600 nm in Ra(Y), or the substrate sample of less than 20 nm in Ra(Y) and beyond 0.8 in Ra(X)/Ra(Y), any of them was found to have an apparent decrease particularly in the open circuit voltage (Voc) after the endurance in the evaluation of the evaluation item (c) or (d). Hence, any of them is understood to be inferior in photovoltaic characteristics.

Further, for the photovoltaic device samples obtained using the substrate sample of 300 nm or less in Ra(X) and less than 20 nm in Ra(Y) or the substrate sample of less than 15 nm in Ra(X) and 600 nm or less in Ra(Y), any of them was found to suffer from an apparent increase in the series resistance mainly due to layer peeling during the evaluation of the evaluation item (c) or (d). Hence, any of them is understood to be apparently inferior in photovoltaic characteristics.

Incidentally, the samples shown in FIGS. 8(a) and 8(b) had been applied with belt polishing using extra fine abrasive grains in the Ra(Y) direction as the mechanical polishing. In Table 2-2, the conditions of the belt polishing and those of the surface etching treatment for these samples are collectively shown.

Based on the above-described results, it is understood that the use of a substrate having an irregular surface with a specific irregular surface structure which is 15 to 300 nm the Ra(X), 20 to 600 $\mu$m for the Ra(Y) and 0.8 or less for the Ra(X)/Ra(Y) enables the efficient production of a high quality photovoltaic device excelling photovoltaic characteristics at a high yield.

EXAMPLE 3

In this example, there was prepared a plurality of photovoltaic devices of the configuration shown in FIG. 1 in the following manner.

(1) Preparation of Substrate

There were provided a plurality of stainless steel slabs obtained by way of the previously described steel making, hot rolling, cold rolling and final processes. Each stainless steel slab was subjected to surface roughing treatment by a different manner as shown in Table 3-1, particularly a manner of conducting bright-annealing or/and conducting a combination of annealing and acid-washing or/and conducting or not conducting surface finishing by means of a skinpass rolling mill, and conducting mechanical polishing (belt polishing, buff polishing, or barrel polishing) or electrolytic polishing.

By this, there were obtained a variety of stainless steel plates of 0.20 mm in thickness and 50 mm×50 mm in size and each having a different irregular surface with a specific irregular surface structure comprising a plurality of linear irregularities arranged as shown in FIG. 3(a), 3(b), or 3(c).

In this way, for each stainless steel plate having a different specific irregular surface structure, there were prepared a plural number of the stainless steel plates.

Each of the resultant stainless steel plates was subjected to surface etching treatment in the same manner using the sputtering apparatus as in Example 2 and under conditions shown in Table 3-1.

In this way, in each case, there were obtained a plurality of substrate samples.

For the substrate samples thus obtained in each case, one of them was reserved for evaluation.

(2) Formation of Back Reflection Layer and Transparent and Electrically Conductive Layer In the same manner as in Example 1 and under conditions shown in Table 3-1, on each of the remaining substrate samples, a 100 nm thick AlSi film as the back reflection layer and a 1 $\mu$m thick ZnO film as the transparent and electrically conductive layer were sequentially formed to obtain a substrate product sample.

In this way, there were prepared a plurality of substrate product samples for each of the different substrate samples.

For the substrate product samples thus obtained in each case, one of them was reserved for evaluation.

(3) Preparation of Photovoltaic Device

Using the remaining substrate product samples in each case, there were prepared a plurality of photovoltaic device samples by sequentially forming a photoelectric conversion layer with a pin junction, a transparent electrode (comprising $In_2O_3$) and a collecting electrode thereon in the same manner as in Example 1 and under conditions shown in Table 3-1.

Evaluation

1. For each of the substrate samples reserved for evaluation, the irregular surface pattern was examined in the same manner as in Example 2.

As a result, each substrate sample was found to be in the range of 5 to 350 nm for the Ra(X) and in the range of 8 to 650 nm for the Ra(Y).

2. For each of the substrate product samples reserved for evaluation, there were examined the mean particle size of the ZnO film as the back reflection layer and the total reflectance and diffuse reflectance in the same manner as in Example 1.

As a result, there were obtained the following facts.

When the Ra(X) is 15 nm or more and the Ra(Y) is 20 nm or more, the constituent crystalline material of the ZnO film is grown to have a desirably large mean grain size.

When the Ra(X) is beyond 300 =m or the Ra(Y) is beyond 600 nm or the Ra(Y) is less than 20 nm and the Ra(X)/Ra(Y) is 0.8, the total reflectance is decreased while the diffuse reflectance is decreased. Particularly, in the case where the Ra(X) is 300 nm or less and the Ra(Y) is 200 nm or less and also in the case where the Ra(X) is less than 15 nm and the Ra(Y) is 600 nm or less, the diffuse reflectance is decreased though the total reflectance is satisfactory.

On the other hand, in the case where the Ra(X) is in the range of 15 to 300 nm, the Ra(Y) is in the range of 20 to 600 nm, and the Ra(X)/Ra(Y) is 0.8 or less, both the total reflectance and the diffuse reflectance are excellent. Particularly, in the case where the Ra(X) is in the range of 25 to 150 nm, the Ra(Y) is in the range of 60 to 300 nm, and the Ra(X)/Ra(Y) is 0.8 or less, both the total reflectance and the diffuse reflectance are markedly excellent.

3. For the photovoltaic device samples obtained in the above, evaluation was conducted with respect to (a) yield, (b) adhesion strength, (c) degradation in HHRB test, and (d) degradation in temperature and humidity cycle test in the same manner as in Example 1.

3-(1). The evaluated results with respect to the yield (a) are collectively and graphically shown in FIG. 9(a) in relation to the Ra(X) and Ra(Y).

Figure 9A:
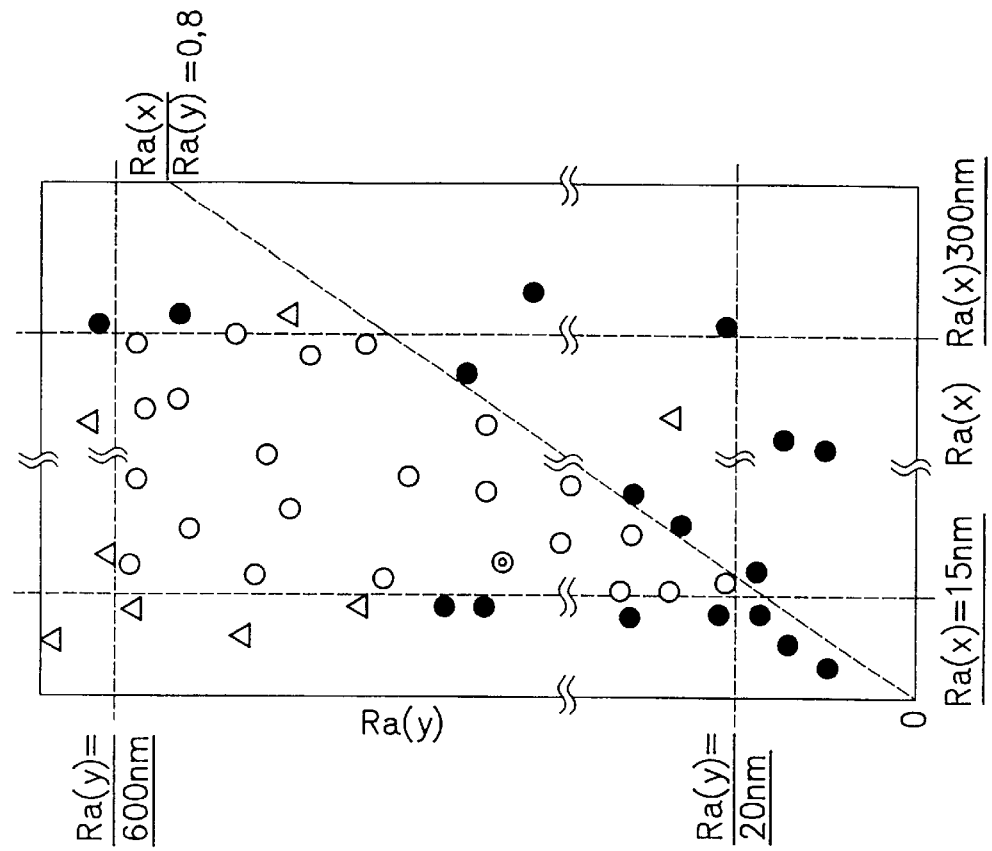
FIG. 9(a) is a graph showing evaluated results with respect to yield for photovoltaic devices according to the present invention and conventional photovoltaic devices in Example 3 which will be later described.

In FIG. 9(a), the photovoltaic device sample in which the substrate product sample of 30 nm in Ra(X), 50 nm in Ra(Y) and 0.6 in Ra(X)/Ra(Y) was used and which was found to be satisfactory in the yield (a) is indicated by a mark ○ as a standard. For the photovoltaic device sample which is superior to the standard in terms of the yield, it is indicated by a mark ◎. For the photovoltaic device sample which is inferior to the standard in terms of the yield, it is indicated by a mark Δ. For the photovoltaic device sample which is distinguishably inferior to the standard in terms of the yield, it is indicated by a mark ●.

From the results shown in FIG. 9(a), the following facts are understood. In the case of using the substrate sample of 15 to 300 nm in Ra(X), 20 to 600 nm in Ra(Y) and 0.8 or less in Ra(X)/Ra(Y), the yield of a desirable photovoltaic device is satisfactory. Particularly, in the case of using the substrate sample of 25 to 150 nm in Ra(X), 60 to 300 nm in Ra(Y) and 0.8 or less in Ra(X)/Ra(Y), the yield of a desirable photovoltaic device is markedly excellent.

On the other hand, in the case of using the substrate sample of beyond 300 nm in Ra(X), the substrate sample of beyond 600 nm in Ra(Y), or the substrate product sample of less than 20 nm in Ra(Y) and less than 0.8 in Ra(X)/Ra(Y), the yield of a practically usable photovoltaic device is apparently inferior. The reason for this was found to be a decrease in the shunt resistance due to an excessively large magnitude of the linear irregularities.

Further, in the case of using the substrate sample of 300 nm or less in Ra(X) and less than 20 nm in Ra(Y) or the substrate sample of less than 15 nm in Ra(X) and 600 nm or less in Ra(Y), the yield of a practically usable photovoltaic device is apparently inferior. The reason for this was found to be mainly layer peeling.

3-(2). The evaluated results with respect to the degradation in HHRB test (c), and the degradation in temperature and humidity cycle test (d) are collectively and graphically shown in FIG. 9(b) in relation to the Ra(X) and Ra(Y).

Figure 9B:
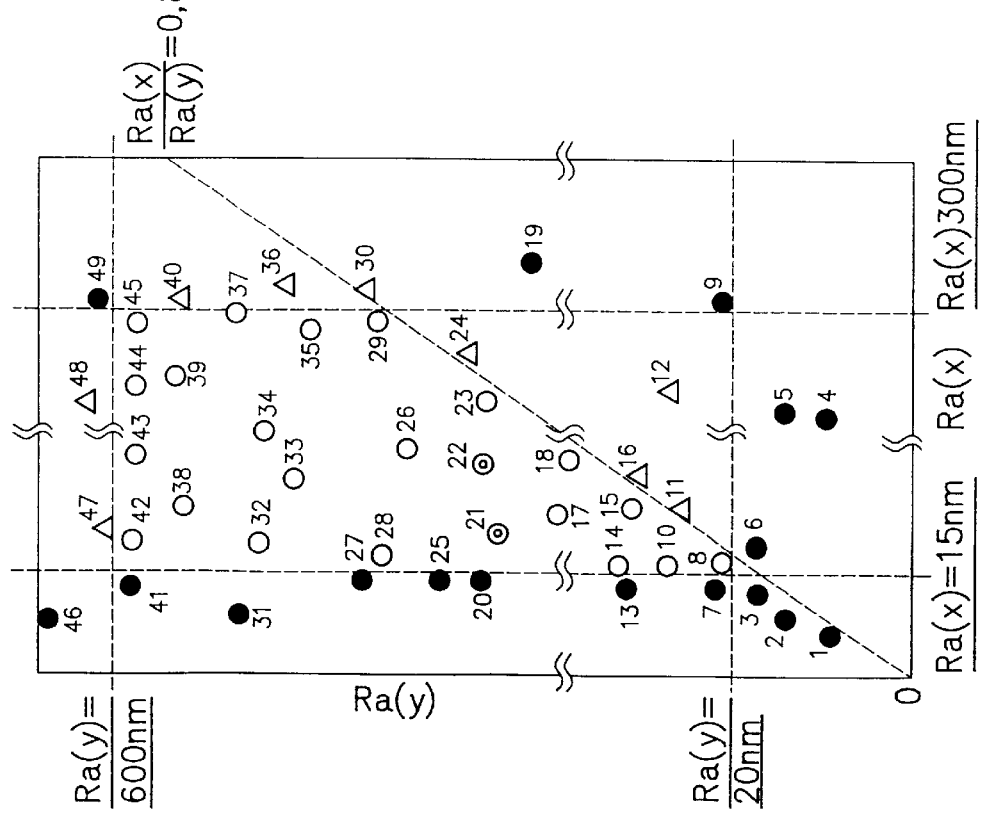
FIG. 9(b) is a graph showing evaluated results with respect to characteristics after a durability test for photovoltaic devices according to the present invention and conventional photovoltaic devices in Example 3 which will be later described.

In FIG. 9(b), the photovoltaic device sample in which the substrate product sample of 30 nm in Ra(X), 50 nm in Ra(Y) and 0.6 in Ra(X)/Ra(Y) was used and which was found to be satisfactory in the evaluation items (c) and (d) is indicated by a mark ○ as a standard. For the photovoltaic device sample which is superior to the standard in terms of the evaluation items (c) and (d), it is indicated by a mark ◉. For the photovoltaic device sample which is inferior to the standard in terms of the evaluation items (c) and (d), it is indicated by a mark Δ. For the photovoltaic device sample which is distinguishably inferior to the standard in terms of the evaluation items (c) and (d), it is indicated by a mark ●.

From the results shown in FIG. 9(b), the following facts are understood. In the case of using the substrate sample of 15 to 300 nm in Ra(X), 20 to 600 nm in Ra(Y) and 0.8 or less in Ra(X)/Ra(Y), any of the resultant photovoltaic device samples is quite satisfactory in the evaluation items (c) and (d).

On the other hand, for the photovoltaic device samples obtained using the substrate sample of beyond 300 nm in Ra(X), the substrate sample of beyond 600 nm in Ra(Y), or the substrate sample of less than 20 nm in Ra(Y) and beyond 0.8 in Ra(X)/Ra(Y), any of them was found to have an apparent decrease particularly in the open circuit voltage (Voc) after the endurance in the evaluation of the evaluation item (c) or (d). Hence, any of them is understood to be inferior in photovoltaic characteristics.

Further, for the photovoltaic device samples obtained using the substrate sample of 300 nm or less in Ra(X) and less than 20 nm in Ra(Y) or the substrate sample of less than 15 nm in Ra(X) and 600 nm or less in Ra(Y), any of them was found to suffer from an apparent increase in the series resistance mainly due to layer peeling during the evaluation of the evaluation item (c) or (d). Hence, any of them is understood to be apparently inferior in photovoltaic characteristics.

Incidentally, the samples shown in FIGS. 9(a) and 9(b) had been applied with belt polishing using extra fine abrasive grains in the Ra(Y) direction as the mechanical polishing. In Table 3-2, the conditions of the belt polishing and those of the surface etching treatment for these samples are collectively shown.

Based on the above-described results, it is understood that the use of a substrate having an irregular surface with a specific irregular surface structure which is 15 to 300 nm for the Ra(X), 20 to 600 nm for the Ra(Y) and 0.8 or less for Ra(X)/Ra(Y) enables the efficient production of a high quality photovoltaic device excelling in photovoltaic characteristics at a high yield.

EXAMPLE 4

In this example, there was prepared a plurality of photovoltaic devices of the configuration shown in FIG. 1 in the following manner.

(1) Preparation of Substrate

There were provided a plurality of ferritic stainless steel slabs obtained by way of the previously described steel making, hot rolling, cold rolling and final processes. Each stainless steel slab was subjected to surface roughing treatment by a different manner as shown in Table 4-1, particularly a manner of conducting bright-annealing, conducting acid-washing and conducting or not conducting surface finishing by means of a skinpass rolling mill.

By this, there were obtained a variety of ferritic stainless steel plates of 0.20 mm in thickness and 50 mm×50 mm in size and each having a different irregular surface pattern as shown in FIG. 3(a), 3(b) or 3(c).

In this way, for each ferritic stainless steel plate having a different specific irregular surface structure, there were prepared a plural number of the ferritic stainless steel plates.

Each of the resultant stainless steel plates was introduced into an annealing apparatus (not shown), wherein the surface thereof was subjected to annealing treatment at a temperature of 600° C., followed by gradually cooling to room temperature (see, Table 4-1).

In this way, in each case, there were obtained a plurality of substrate samples.

For the substrate samples thus obtained in each case, one of them was reserved for evaluation.

(2) Formation of Back Reflection Layer and Transparent and Electrically Conductive Layer In the same manner as in Example 1 and under conditions shown in Table 4-1, on each of the remaining substrate samples, a 50 nm thick AlTi film as the back reflection layer and a 1 μm thick ZnO film as the transparent and electrically conductive layer were sequentially formed to obtain a substrate product sample.

In this way, there were prepared a plurality of substrate product samples for each of the different different substrate samples.

For the substrate product samples thus obtained in each case, one of them was reserved for evaluation.

(3) Preparation of Photovoltaic Device

Using the remaining substrate product samples in each case, there was prepared a plurality of photovoltaic device samples by sequentially forming a photoelectric conversion layer with a pin junction, a transparent electrode (comprising $In_2O_3$) and a collecting electrode thereon in the same manner as in Example 1 and under conditions shown in Table 4-1.

Evaluation

1. For each of the substrate samples reserved for evaluation, the irregular surface pattern was examined in the same manner as in Example 2.

As a result, each substrate sample was found to be in the range of 5 to 350 nm for the Ra(X) and in the range of 8 to 650 nm for the Ra(Y).

Of these substrate samples, for the substrate samples having parameters of 15 to 300 nm in the Ra(X), 20 to 600 nm in the Ra(Y) and 0.8 or less in the Ra(X)/Ra(Y) which afforded the excellent results in Example 3, there was examined a pitch d of the linear irregularities for each of these substrate samples. As a result, their pitches d were found to be in the range of 0.2 to 30 μm.

2. For each of the substrate product samples respectively based on the substrate sample of 0.2 to 30 μm in the pitch d, evaluation was conducted with respect to total reflectance and diffuse reflectance.

The evaluated results are collectively shown in Table 4-2. The values shown in Table 4-2 are values relative to the corresponding values in the case of 5.0 μm in the pitch d, which are set at 1.0.

Based on the results shown in Table 4-2, the following facts are understood. In the case where the pitch d is in the range of 0.5 to 20 μm, both the total reflectance and the diffuse reflectance are high enough. In the case where the pitch d is less than 0.5 μm, the total reflectance is inferior and because of this, the diffuse reflectance is also inferior. In the case where the pitch d is beyond 20 μm, the total reflectance is relatively high but the diffuse reflectance is inferior such that it is similar to that in the case of a usual polished surface.

3. For the resultant photovoltaic device samples respectively based on the substrate product sample of 0.2 to 30 μm in the pitch d, evaluation was conducted with respect to (a) yield, (b) adhesion strength, (c) degradation in HHRB test, and (d) degradation in temperature and humidity cycle test in the same manner as in Example 1.

3-(1). The evaluated results with respect to the yield (a) are collectively shown in Table 4-3. The values shown in Table 4-3 are values relative to the yield in the case of 5.0 μm in the pitch d, which is set at 1.0.

Based on the results shown in Table 4-3, the following facts are understood. In the case where the pitch d is in the range of 0.5 to 20 μm, the yield of a desirable photovoltaic device is quite satisfactory.

On the other hand, in the case where the pitch d is less than 0.5 μm, the yield of a practically usable photovoltaic device is inferior. The reason for this was found to be a decrease in the open circuit voltage (Voc) and also in the fill factor (F.F.).

Further, in the case where the pitch d is beyond 20 μm, the yield of a practically usable photovoltaic device is inferior. The reason for this was found to be mainly layer peeling.

3-(2). The evaluated results with respect to the degradation in HHRB test (c) and the degradation in temperature and humidity cycle test (d) are collectively shown in Table 4-4. The values shown in Table 4-4 are values relative to the corresponding values in the case of 0.5 μm in the pitch d.

Based on the results shown in Table 4-4, the following facts are understood. In the case where the pitch d is in the range of 0.5 to 20 μm, any of the resultant photovoltaic device samples is quite satisfactory in the evaluation items (c) and (d).

On the other hand, in the case where the pitch d is less than 0.5 μm, any of the resultant photovoltaic device samples was found to have an apparent decrease particularly in not only the open circuit voltage (Voc) but also in the fill factor (F.F.) after the endurance in the evaluation of the evaluation item (c) or (d). Hence, any of them is understood to be inferior in photovoltaic characteristics.

Further, in the case where the pitch d is beyond 20 μm, any of the resultant photovoltaic device samples was found to suffer from an apparent increase in the series resistance mainly due to layer peeling during the evaluation of the evaluation item (c) or (d). Hence, any of them is understood to be apparently inferior in photovoltaic characteristics.

Based on the above-described results, it is understood that the use of a substrate having an irregular surface with a specific irregular surface structure which is 15 to 300 nm for the Ra(X), 20 to 600 nm for the Ra(Y) and 0.8 or less for the Ra(X)/Ra(Y), and 0.5 to 20 μm for the pitch d enables the efficient production of a high quality photovoltaic device excelling in photovoltaic characteristics at a high yield.

EXAMPLE 5

In this example, there was prepared a plurality of photovoltaic devices of the configuration shown in FIG. 1 in the following manner.

(1) Preparation of Substrate

There was provided a plurality of ferritic stainless steel slabs obtained by way of the previously described steel making, hot rolling, cold rolling and final processes. Each stainless steel slab was subjected to surface roughing treatment by a different manner as shown in Table 5-1, particularly a manner of conducting annealing, conducting acid-washing and conducting or not conducting surface finishing by means of a skinpass rolling mill.

By this, there was obtained a variety of stainless steel plates of 0.20 mm in thickness and 50 mm×50 mm in size and each having a different irregular surface pattern as shown in FIG. 3(a), 3(b) or 3(c).

In this way, for each stainless steel plate having a different specific irregular surface structure, there were prepared a plural number of the stainless steel plates.

Each of the resultant stainless steel plates was introduced into an annealing apparatus (not shown), wherein the surface thereof was subjected to annealing treatment at a temperature of 650° C., followed by gradually cooling to room temperature (see, Table 5-1).

In this way, in each case, there were obtained a plurality of substrate samples.

For the substrate samples thus obtained in each case, one of them was reserved for evaluation.

(2) Formation of Back Reflection Layer and Transparent and Electrically Conductive Layer In the same manner as in Example 1 and under conditions shown in Table 5-1, on each of the remaining substrate samples, a 50 nm thick Cu film as the back reflection layer and a 1 μm thick ZnO film as the transparent and electrically conductive layer were sequentially formed to obtain a substrate product sample.

In this way, there was prepared a plurality of substrate product samples for each of the different substrate samples.

For the substrate product samples thus obtained in each case, one of them was reserved for evaluation.

(3) Preparation of Photovoltaic Device

Using the remaining substrate product samples in each case, there was prepared a plurality of photovoltaic device samples by sequentially forming a photoelectric conversion layer with a pin junction, a transparent electrode (comprising $In_2O_3$) and a collecting electrode thereon in the same manner as in Example 1.

Evaluation

1. Each of the substrate samples reserved for evaluation was found to have an irregular surface pattern as shown in FIG. 3(d) in which a plurality of first linear irregularities are arranged in a linear arrangement form and a plurality of second linear irregularities are arranged in a direction perpendicular to the first linear irregularities.

For the irregular surface pattern of each of the substrate samples, the Ra(X) and Ra(Y) were examined in the same manner as in Example 2.

As a result, each substrate sample was found to be in the range of 4 to 400 nm for the Ra(X) and in the range of 7 to 700 nm for the Ra(Y).

Of these substrate samples, for the substrate samples having parameters of 15 to 300 nm in the Ra(X), 20 to 600 nm in the Ra(Y) and 0.8 or less in the Ra(X)/Ra(Y) which afforded the excellent results in Example 3, there was examined a pitch d of the linear irregularities for each of these substrate samples. As a result, their pitches d were found to be in the range of 0.2 to 30 µm.

Of these substrate samples, the substrate samples having a value of d in the range of 0.5 to 20 µm were selected. For each of the selected substrate samples, there was examined an average length l of the second linear irregularities arranged in a direction perpendicular to first irregularities in the irregular surface pattern. As a result, these selected substrate samples were found to be in the range of from measurement limit to 25 µm for the average length l.

2. For the substrate product samples respectively based on the substrate sample of measurement limit to 25 um in the average length l, evaluation was conducted with respect to total reflectance and diffuse reflectance. The evaluated results are collectively shown in Table 5-2. The values shown in Table 5-2 are values relative to the corresponding values in the case of 5.0 µm in the average length l, which are set at 1.0.

Based on the results shown in Table 5-2, the following facts are understood. In the case where the length l is 20 µm or less, both the total reflectance and the diffuse reflectance are high enough. In the case where the length l is beyond 20 µm, the total reflectance is inferior and because of this, the diffuse reflectance is also inferior.

3. For the resultant photovoltaic device samples respectively based on the substrate product sample of measurement limit to 25 µm in the length l, evaluation was conducted with respect to (a) yield, (b) adhesion strength, (c) degradation in HHRB test, and (d) degradation in temperature and humidity cycle test in the same manner as in Example 1.

3-1. The evaluated results with respect to the yield (a) are collectively shown in Table 5-3. The values shown in Table 5-3 are values relative to the yield in the case of 5.0 µm in the length l, which is set at 1.0.

Based on the results shown in Table 5-3, the following facts are understood. In the case where the length is 20 µm or less, the yield of a desirable photovoltaic device is quite satisfactory.

On the other hand, in the case where the length l is beyond 20 µm, the yield of a practically usable photovoltaic device is inferior. The reason for this was found to be due to a decrease in the open circuit voltage (Voc) and also in the fill factor (F.F.).

3-(2). The evaluated results with respect to the degradation in HHRB test (c) and the degradation in temperature and humidity cycle test (d) are collectively shown in Table 5-4. The values shown in Table 5-4 are values relative to the corresponding values in the case of 5.0 µm in length l, which are set at 1.0.

Based on the results shown in Table 5-4, the following facts are understood. In the case where the length l is 20 µm or less, any of the resultant photovoltaic device samples is quite satisfactory in the evaluation items (c) and (d).

On the other hand, in the case where the length l is beyond 20 µm, any of the resultant photovoltaic device samples was found to have an apparent decrease particularly in not only the open ciurcuit voltage (Voc) but also in the fill factor (F.F.) after the endurance in the evaluation of the evaluation item (c) or (d). Hence, any of them is understood to be inferior in photovoltaic characteristics.

Based on the above-described results, it is understood that the use of a substrate having an irregular surface with a specific irregular surface structure which is 15 to 300 nm for the Ra(X), 20 to 600 nm for the Ra(Y) and 0.8 or less for the Ra(X)/Ra(Y), and 0.5 to 20 µm for the pitch d, and 20 µm or less for the length l enables the efficient production of a high quality photovoltaic device excelling in photovoltaic characteristics at a high yield.

EXAMPLE 6

In this example, there was prepared a plurality of triple-cell type photovoltaic devices of the configuration shown in FIG. 2 in the following manner.

1. Preparation of Substrate

There was provided a plurality of stainless steel slabs obtained by way of the previously described steel making, hot rolling, cold rolling and final processes. Each stainless steel slab was subjected to surface roughing treatment by a different manner as shown in Table 6-1, particularly a manner of conducting annealing, conducting acid-washing and conducting or not conducting surface finishing by means of a skinpass rolling mill.

By this, there were obtained a variety of stainless steel sheets of 100 m in length, 30 cm in width and 0.13 mm in thickness and each having a different irregular surface pattern as shown in FIGS. 3(a), 3(b) or 3(c).

The irregular surface of each of the stainless steel sheets was subjected to annealing treatment in the following manner.

Each of the resultant stainless steel sheets was wound on a rotary pay-out reel (not shown). The pay-out reel having the stainless steel sheet wound thereon was set to an annealing apparatus having a reaction chamber and a cooling chamber (not shown). A rotary take-up reel (not shown) for taking up the stainless steel sheet released from the pay-out reel was also set to the annealing apparatus. In this case, the pay-out reel and the take-up reel were positioned such that they were opposed to each other through the annealing apparatus. A part of the stainless steel sheet on the pay-out reel was released to fix to the take-up reel while extending the stainless steel sheet in the reaction chamber and cooling chamber of the annealing apparatus. The irregular surface of the stainless steel sheet was subjected to annealing treatment at a temperature in the range of 550 to 650° C. in the reaction chamber, followed by cooling to room temperature in the cooling chamber, while continuously moving the stainless steel sheet through the reaction chamber and the cooling chamber by rotating the pay-out and take-up reels.

In this way, there were obtained a plurality of different substrate web samples.

For each of the substrate web samples thus obtained, a part was cut to obtain a specimen for evaluation (this will be hereinafter referred to as substrate specimen).

2. Formation of Back Reflection Layer and Transparent and Electrically Conductive Layer In the same manner as in Example 1 and under conditions shown in Table 6-1, on each of the substrate web samples, there were sequentially formed an 80 nm thick AlMg film as the back reflection layer and a 0.75 µm thick ZnO film as the transparent and electrically conductive layer by way of a conventional roll-to-roll film forming process, whereby obtaining a substrate web product sample.

In this way, there were prepared a plurality of different substrate web product samples.

For each of the substrate web product samples thus obtained, a part was cut to obtain a specimen for evaluation (this will be hereinafter referred to as substrate product specimen).

3. Preparation of Photovoltaic Device

Using each of the substrate web product samples, there was prepared a plurality of photovoltaic device samples in the following manner.

3-(1). Formation of Photoelectric Conversion Layer

On the ZnO film (as the transparent and electrically conductive layer) of each of the substrate web product samples, there was formed a multi-layered photoelectric conversion layer comprising a pin junction bottom cell (comprising an n-type layer, a three-layered i-type layer (comprising a RF i-type layer, MW i-type layer and a RF i-type layer) and a p-type layer), a pin junction middle cell (comprising an n-type layer, a three-layered i-type layer (comprising a RF i-type layer, MW i-type layer and a RF i-type layer) and a p-type layer) and a pin junction top cell (comprising an n-type layer, a single-layered i-type layer (comprising a RF i-type layer) and a p-type layer) stacked in the named order from the substrate side in accordance with a conventional roll-to-roll film-forming process using a roll-to-roll type multi-chambered plasma CVD apparatus shown in FIGS. 7(a) and 7(b) and under conditions shown in Table 6-1. The formation of each pin junction cell was conducted in the same manner as in the formation of the photoelectric conversion layer in Example 1.

Herein, description will made of the plasma CVD apparatus shown in FIGS. 7(a) and 7(b). FIG. 7(a) is a schematic diagram illustrating the constitution of the plasma CVD apparatus. FIG. 7(b) is a schematic view illustrating the multi-chambered arrangement in the plasma CVD apparatus shown in FIG. 7(a), viewed from above the multi-chambered arrangement.

The plasma CVD apparatus shown in FIGS. 7(a) and 7(b) comprises a substrate pay-out chamber 729 containing a pay-out reel 721 having a substrate web 740 wound hereon (this substrate web corresponding to the foregoing substrate web product sample), a plurality of deposition chambers 701–713, and a substrate take-up chamber 730 containing a take-up reel 723 for taking up the substrate web 740 transported. Each adjacent chamber is isolated by an isolation passage 714. Each chamber is provided with an exhaust port extending from a vacuuming means so that the inside of the chamber can be vacuumed.

The substrate web 740 paid out from the pay-out reel 721 is transported through the isolation passage into the deposition chamber 701. In this way, the substrate web 740 is transported into the successive chambers 702–713, and it is finally taken up and wound on the take-up reel 724 in the take-up chamber 730. The plasma CVD apparatus is structured such that a desired raw material gas is introduced into the respective deposition chambers while flowing a scavenging gas into the respective isolation passage 714, where film-formation in each deposition chamber can be independently conducted without influencing adjacent deposition chambers. Each deposition chamber is provided with a substrate temperature controlling means (not shown) in order to maintain the substrate web 740 at a desired temperature suitable for the formation of a film therein.

Particularly, each of the deposition chambers 701–713 is provided with a raw material gas introduction port 715 extending from a raw material gas supply system (not shown) and an exhaust port 716 connected to a vacuuming pump such as an oil diffusion pump, mechanical booster pump or the like. Each of the deposition chambers 701, 702, 704–707, and 709–713 is provided with a RF power introduction electrode 717 electrically connected to a RF power source (not shown). Each of the deposition chambers 703 and 708 is provided with a microwave applicator 718 extending from a microwave power source (not shown) and a bias electrode 720 electrically connected to a RF power source (not shown). Each isolation passage 714 is provided with an inlet port 719 for flowing a scavenging gas thereinto. The scavenging gas is flown in a direction as shown in FIG. 7(b).

The pay-out chamber 729 is provided with a delivery roll 722 for delivering the substrate web paid out from the pay-out reel 721 toward the take-up chamber 730 while passing through the respective deposition chambers. The take-up chamber 730 is provided with a guide roller 724 for maintaining the substrate web 740 in a horizontal state with an adequate tensile force.

The formation of the photoelectric conversion layer in the above-described plasma CVD apparatus was conducted as follows. Each of the substrate web products obtained in the above step 2 was wound on the take-up reel 721 (having an average radius of curvature of 30 cm). The take-up reel 721 was set in the pay-out chamber 729, the substrate web product 714 was delivered to pass through the respective deposition chambers, and its tip was fixed to the take-up reel in the take-up chamber 730. The entire inside of the plasma CVD apparatus was exhausted, and the substrate temperature controlling means in each deposition chamber was operated so that the substrate web product could be maintained at a desired temperature in the deposition chamber. When the entire inside of the plasma CVD apparatus became less than 1 mTorr, a scavenging gas was flown into the plasma CVD apparatus through the respective inlet ports 719 as shown in FIG. 7(b), while moving the substrate web product 714 in a direction indicated by an arrow mark in FIG. 7(a) toward the take-up chamber 730. The substrate web product was successively taken up by and wound on the take-up reel 723. Desired raw material gas was introduced into each deposition chamber, where the raw material gas was prevented from diffusing into adjacent deposition chambers by properly adjusting the flow rate of the scavenging gas introduced into the respective isolation passages or the inner pressures of the respective deposition chambers. Then, by introducing a RF power into each of the deposition chambers 701, 702, 704–707, and 709–713, and a microwave power and a RF bias power into each of the deposition chambers 703 and 708, glow discharge was generated to produce a plasma in each of these deposition chambers. By this, on the surface of the ZnO film of the substrate web product 740, in the same manner as in Example 1 and under conditions shown in Table 6-1, there were continuously formed a bottom pin junction cell in a first zone comprising the deposition chambers 701–705 where there were formed an n-type a-Si layer in the deposition chamber 701, a RF i-type a-Si layer in the deposition chamber 702, a MW i-type a-Si layer in the deposition chamber 703, a RF i-type a-Si layer in the deposition chamber 704, and a p-type microcrystalline Si layer in the deposition chamber 705; a middle pin junction cell in a second zone comprising the deposition chambers 706–710 where there were formed an n-type a-Si layer in the deposition chamber 706, a RF i-type a-Si layer in the deposition chamber 707, a MW i-type a-Si layer in the deposition chamber 708, a RF i-type a-Si layer in the deposition chamber 709, and a p-type microcrystalline Si layer in the deposition chamber 710; and a top pin junction cell in a third zone comprising the deposition chambers 711–713 where there were formed an n-type a-Si layer in the deposition chamber 711, a RF i-type a-Si layer in the deposition chamber 712, and a p-type microcrystalline Si layer in the deposition chamber 713. As the raw material gases and the film-forming conditions for the formation of these layers, those mentioned in Table 1-1 were employed.

After all of the substrate web products were wound on the take-up reel 723, the introduction of the RF power sources, the microwave power sources and the RF bias power sources were terminated. At the same time, the introduction of the raw material gases and the scavenging gas were terminated. The entire inside pressure of the plasma CVD apparatus was returned to atmospheric pressure, and the take-up reel 723 was taken out from the plasma CVD apparatus.

By this, there was formed a multi-layered photoelectric conversion layer with a pin-pin-pin structure on each substrate web product.

3-(2). Formation of Transparent Electrode and Collecting Electrode.

On the p-type layer of the top pin junction cell of each substrate web product, there was formed a 75 nm thick ITO film as the transparent electrode layer by using a conventional reactive sputtering apparatus, followed by forming a wire grid comprising a 50 $\mu$m thick copper wire having an Ag clad layer and a carbon layer with a binder comprising a urethane resin as the collecting electrode by way of conventional resistance heating evaporation.

By this, there was prepared a plurality of different long photovotaic devices.

Each long photovoltaic device was cut to obtain a photovoltaic device sample of 250 mm×100 mm in size.

Evaluation

1. Each of the substrate specimens reserved for evaluation was found to have an irregular surface pattern as shown in FIG. 3(d) in which a plurality of first linear irregularities are arranged in a linear arrangement form and a plurality of second linear irregularities are arranged in a direction perpendicular to the first linear irregularities.

For the irregular surface pattern of each of the substrate specimens, the Ra(X) and Ra(Y) were examined in the same manner as in Example 2.

As a result, each substrate specimen was found to be in the range of 3 to 350 nm for the Ra(X) and in the range of 5 to 650 nm for the Ra(Y).

Of these substrate specimens, for the substrate specimens having parameters of 15 to 300 nm in the Ra(X), 20 to 600 nm in the Ra(Y) and 0.8 or less in the Ra(X)/Ra(Y) which afforded the excellent results in Example 3, there was examined a pitch d of the linear irregularities for each of these substrate specimens. As a result, their pitches d were found to be in the range of 0.2 to 30 $\mu$m.

Of these substrate specimens, the substrate specimens having a value of d in the range of 0.5 to 20 $\mu$m were selected. For each of the selected substrate specimens, there was examined an average length l of the second linear irregularities arranged in a direction perpendicular to first irregularities in the irregular surface pattern. As a result, these selected substrate specimens were found to be 25 $\mu$m or less for the average length l.

2. For the substrate product specimens respectively based on the substrate sample of 25 $\mu$m or less in the average length l, evaluation was conducted with respect to total reflectance and diffuse reflectance. The evaluated results are collectively shown in Table 6-2. The values shown in Table 6-2 are values relative to the corresponding values in the case of 5.0 $\mu$m in the average length l, which are set at 1.0.

Based on the results shown in Table 6-2, the following facts are understood. In the case where the length l is 20 $\mu$m or less, both the total reflectance and the diffuse reflectance are high enough. In the case where the length l is beyond 20 $\mu$m, the total reflectance is inferior and because of this, the diffuse reflectance is also inferior.

3. For the resultant photovoltaic device samples respectively based on the substrate product sample of 25 $\mu$m or less in the length l, evaluation was conducted with respect to (a) yield, (b) adhesion strength, (c) degradation in HHRB test, and (d) degradation in temperature and humidity cycle test in the same manner as in Example 1.

3-(1). The evaluated results with respect to the yield (a) are collectively shown in Table 6-3. The values shown in Table 6-3 are values relative to the yield in the case of 5.0 $\mu$m in the length l, which is set at 1.0.

Based on the results shown in Table 6-3, the following facts are understood. In the case where the length l is 20 $\mu$m or less, the yield of a desirable photovoltaic device is quite satisfactory.

On the other hand, in the case where the length l is beyond 20 $\mu$m, the yield of a practically usable photovoltaic device is inferior. The reason for this was found to be a decrease in the open circuit voltage (Voc) and also in the fill factor (F.F.).

3-(2). The evaluated results with respect to the degradation in HHRB test (c) and the degradation in temperature and humidity cycle test (d) are collectively shown in Table 6-4. The values shown in Table 6-4 are values relative to the corresponding values in the case of 5.0 $\mu$m in length l, which are set at 1.0.

Based on the results shown in Table 6-4, the following facts are understood. In the case where the length l is 20 $\mu$m or less, any of the resultant photovoltaic device samples is quite satisfactory in the evaluation items (c) and (d).

On the other hand, in the case where the length l is beyond 20 $\mu$m, any of the resultant photovoltaic device samples was found to have an apparent decrease particularly in not only the open circuit voltage (Voc) but also in the fill factor (F.F.) after the endurance in the evaluation of the evaluation item (c) or (d). Hence, any of them is understood to be inferior in photovoltaic characteristics.

Based on the above-described results, it is understood that the use of a substrate having an irregular surface with a specific irregular surface structure which is 15 to 300 nm for the Ra(X), 20 to 600 nm for the Ra(Y) and 0.8 or less for the Ra(X)/Ra(Y), and 0.5 to 20 $\mu$m for the pitch d, and 20 $\mu$m or less for the length l enables the efficient production of a high quality photovoltaic device excelling in photovoltaic characteristics at a high yield.

EXAMPLE 7

In this example, there was prepared a photovoltaic device of the configuration shown in FIG. 1 in the following manner 1.

1. Preparation of Substrate

There was provided a stainless steel slab obtained by using the previously described steel making, hot rolling, cold rolling and final processes. The stainless steel slab was subjected to surface roughing treatment by a manner of conducting annealing and conducting surface finishing by means of a skinpass rolling mill.

By this, there was obtained a stainless steel plate having an irregular surface pattern as shown in FIG. 3(a).

The resultant stainless steel plate was introduced into a dry etching apparatus (not shown), wherein the surface thereof was subjected to etching treatment in a gaseous atmosphere composed of $CCl_4$ or $Cl_2$ gas at a temperature of RT for 5 minutes while applying a RF power of 200 W, followed by cooling to room temperature (see, Table 7-1).

In this way, there was obtained a substrate. A part of the resultant substrate was cut to obtain a specimen for evaluation (this specimen will be hereinafter referred to as substrate specimen Ex. 7-1).

2. Formation of Back Reflection Layer and Transparent and Electrically Conductive Layer In the same manner as in Example 5 and under conditions shown in Table 7-1, on the substrate obtained in the above step 1, a 35 nm thick AlSiTi layer as the back reflection layer and a 1 μm thick ZnO layer as the transparent and electrically conductive layer were sequentially formed to obtain a substrate product.

A part of the resultant substrate product was cut to obtain a specimen for evaluation (this specimen will be hereinafter referred to as substrate product specimen Ex. 7-2).

3. Preparation of Photovoltaic Device

Using the substrate product obtained in the above step 1, there was prepared a photovoltaic device by sequentially forming a photoelectric conversion layer with a pin junction, a transparent electrode (comprising $In_2O_3$) and a collecting electrode thereon in the same manner as in Example 1. The resultant photovoltaic device will be hereinafter referred to as Element Ex. 7-1.

Comparative Example 7-1

The procedures of Example 7 were repeated, except that the formation of the ZnO transparent electrode layer was conducted under conditions of 10 μm for the thickness and 450° C. for the substrate temperature, to thereby obtain a substrate specimen (Comp. 7-1), a substrate product specimen (Comp. 7-2) and a photovoltaic device (Element Comp. 7-1).

Evaluation

1. For each of the substrate specimen Ex. 7-1, the substrate specimen Comp. 7-1, the substrate product specimen Ex. 7-2, the substrate product specimen Comp. 7-2, the Element Ex. 7-1, and the Element Comp. 7-1, the surface state was examined by means of an electron microscope (SEM).

As a result, each of the specimens Ex. 7-1 and Ex. 7-2 was found to have an irregular surface pattern comprising a plurality of linear irregularities arranged in a linear arrangement form as shown in FIG. 3(a). This irregular surface pattern was found to have influenced the surface of the photovoltaic device.

Each of the substrate specimen Comp. 7-1 and the substrate product specimen Comp. 7-2 was found to have an irregular surface pattern similar to that in the case of each of the substrate specimen Ex. 7-1 and the substrate product specimen Ex. 7-2. However, the surface of the Element Comp. 7-1 was found to have no such linear irregularities as in the case of the Element Ex. 7-1 but have other irregularities seemingly based on ZnO grain boundaries.

The results obtained through the examination using the electron microscope are collectively shown in Table 7-2.

2. For each of the Element Ex. 7-1 and the Element Comp. 7-1, evaluation was conducted with respect to yield, adhesion strength, initial photoelectric conversion efficiency, light degradation, degradation in HHRB test, and degradation in temperature and humidity cycle test in the same manner as in Example 1.

The evaluated results obtained are collectively shown in Table 7-3.

The values of the Element Comp. 7-1 shown in Table 7-3 are values relative to the corresponding values of the Element Ex. 7-1, which are set at 1.0.

Based on the results shown in Table 7-3, the following facts are understood. The Element Ex. 7-1 is superior to the Element Comp. 7-1 in all the evaluation items. The reason why the former is superior to the latter is considered to be a decrease in the fill factor (F.F.) mainly based on an increase in the series resistance due to insufficient adhesion strength.

EXAMPLE 8

In this example, there was prepared a plurality of photovoltaic devices of the configuration shown in FIG. 1 in the following manner.

1. Preparation of Substrate

There was provided a plurality of stainless steel slabs obtained by way of the previously described steel making, hot rolling, cold rolling and final processes. Each stainless steel slab was subjected to surface roughing treatment by a different manner as shown in Table 8-1, particularly a manner of conducting annealing, conducting acid-washing and conducting or not conducting surface finishing by means of a skinpass rolling mill.

By this, there were obtained a variety of stainless steel plates of 0.20 mm in thickness and 50 mm×50 mm in size, each having a different irregular surface pattern.

In this way, for each stainless steel plate, there were prepared a plural number of the stainless steel plates.

Each of the resultant stainless steel plates was introduced into an annealing apparatus (not shown), wherein the surface thereof was subjected to annealing treatment at a temperature of 650° C., followed by gradually cooling to room temperature (see, Table 8-1).

In this way, in each case, there was obtained a plurality of substrate samples.

For the substrate samples thus obtained in each case, one of them was reserved for evaluation.

2. Formation of Back Reflection Layer and Transparent and Electrically Conductive Layer In the same manner as in Example 5 and under conditions shown in Table 8-1, on each of the remaining substrate samples, a 100 nm thick AlSi film as the back reflection layer and a 1 μm thick ZnO film as the transparent and electrically conductive layer were sequentially formed to obtain a substrate product sample.

In this way, there was prepared a plurality of substrate product samples for each of the different substrate samples.

For the substrate product samples thus obtained in each case, one of them was reserved for evaluation.

3. Preparation of Photovoltaic Device

Using the remaining substrate product samples in each case, there was prepared a plurality of photovoltaic device samples in the following manner.

Using a multi-chambered plasma CVD apparatus having a hydrogen-assisted plasma CVD deposition chamber for forming a polycrystalline deposited film (not shown) and under conditions shown in Table 8-1, on the ZnO film of each substrate product sample, there were sequentially formed an $n^+$-type layer composed of an a-Si material in the same manner, an i-type layer composed of a polycrystalline Si material in the hydrogen-assisted plasma CVD chamber, and a p-type layer composed of a microcrystalline Si material in the same manner as in Example 5.

By this, a photoelectric conversion layer with a pin junction was formed on said ZnO film.

Then, under conditions shown in Table 8-1, on the p-type layer of the photoelectric conversion layer, there were sequentially formed a transparent electrode (comprising a 70 nm thick $In_2O_3$ film) by way of conventional reactive evaporation, and a collecting electrode in the same manner as in Example 1.

Evaluation

1. Each of the substrate samples reserved for evaluation was found to have an irregular surface pattern as shown in FIG. 3(d) in which a plurality of first linear irregularities are arranged in a linear arrangement form and a plurality of second linear irregularities are arranged in a direction perpendicular to the first linear irregularities.

For the irregular surface pattern of each of the substrate samples, the Ra(X) and Ra(Y) were examined in the same manner as in Example 2.

As a result, each substrate sample was found to be in the range of 3 to 350 nm for the RaM and in the range of 12 to 630 nm for the Ra(Y).

Of these substrate samples, for the substrate samples having parameters of 15 to 300 nm in the Ra(X), 20 to 600 nm in the Ra(Y) and 0.8 or less in the Ra(X)/Ra(Y) which afforded the excellent results in Example 3, there was examined a pitch d of the linear irregularities for each of these substrate samples. As a result, their pitches d were found to be in the range of 0.3 to 25 $\mu$m.

Of these substrate samples, the substrate samples having a value of d in the range of 0.5 to 20 $\mu$m were selected. For each of the selected substrate samples, there was examined an average length l of the second linear irregularities arranged in a direction perpendicular to first irregularities in the irregular surface pattern. As a result, these selected substrate samples were found to be in the range of measurement limit to 25 $\mu$m for the average length l.

2. For the substrate product samples respectively based on the substrate sample of measurement limit to 25 $\mu$m in the average length l, evaluation was conducted with respect to total reflectance and diffuse reflectance. The evaluated results are collectively shown in Table 8-2. The values shown in Table 8-2 are values relative to the corresponding values in the case of 7.5 $\mu$m in the average length l, which are set at 1.0.

Based on the results shown in Table 8-2, the following facts are understood. In the case where the length l is 20 $\mu$m or less, both the total reflectance and the diffuse reflectance are high enough. In the case where the length l is beyond 20 $\mu$m, the total reflectance is inferior and because of this, the diffuse reflectance is also inferior accordingly.

3. For the resultant photovoltaic device samples respectively based on the substrate product sample of measurement limit to 25 $\mu$m in the length l, evaluation was conducted with respect to (a) yield, (b) adhesion strength, (c) degradation in HHRB test, and (d) degradation in temperature and humidity cycle test in the same manner as in Example 1.

3-(1). The evaluated results with respect to the yield (a) are collectively shown in Table 8-3. The values shown in Table 8-3 are values relative to the yield in the case of 7.5 $\mu$m in the length l, which is set at 1.0.

Based on the results shown in Table 8-3, the following facts are understood. In the case where the length l is 20 $\mu$m or less, the yield of a desirable photovoltaic device is quite satisfactory.

On the other hand, in the case where the length l is beyond 20 $\mu$m, the yield of a practically usable photovoltaic device is inferior. The reason for this was found to be due to a decrease in the open circuit voltage (Voc) and also in the fill factor (F.F.).

3-(2). The evaluated results with respect to the degradation in HHRB test (c) and the degradation in temperature and humidity cycle test (d) are collectively shown in Table 8-4. The values shown in Table 8-4 are values relative to the corresponding values in the case of 7.5 $\mu$m in length l, which are set at 1.0.

Based on the results shown in Table 8-4, the following facts are understood. In the case where the length l is 20 $\mu$m or less, any of the resultant photovoltaic device samples is quite satisfactory in the evaluation items (c) and (d).

On the other hand, in the case where the length (is beyond 20 $\mu$m, any of the resultant photovoltaic device samples was found to have an apparent decrease particularly in not only the open circuit voltage (Voc) but also in the fill factor (F.F.) after the endurance in the evaluation of the evaluation item (c) or (d).

Hence, any of them is understood to be inferior in photovoltaic characteristics.

Table 1-1

SUS treatment: rolling treatment/bright annealing skin-pass rolling: done surface polishing: none surface treatment: fluorine-nitric acid ($HF:HNO_3:H_2O=1:3:15$) with ultrasonic vibration, for 30 sec. back reflection layer: Al: 50 nm, substrate temperature: RT transparent and electronically conductive layer: ZnO: 1 $\mu$m, substrate temperature: 200° C.

n-type layer: $SiH_4$: 1 sccm, $H_2$: 45 sccm, $PH_3$(diluted to 1% by H2): 0.5 sccm, inner pressure: 1.2 Torr, RF power: 2 W, substrate temperature: 330° C., layer thickness: 20 nm RFi-type layer: $Si_2H_6$: 4 sccm, $H_2$: 90 sccm, inner pressure: 0.5 Torr, RF power: 1.7 W, substrate temperature: 300° C., layer thickness: 10 nm MWi-type layer: $SiH_4$: 40 sccm, $GeH_4$: 40 sccm, $H_2$: 150 sccm, inner pressure: 8 mTorr, MW power: 200 W, RF bias power: 700 W, substrate temperature: 380° C., layer thickness: 70 nm RFi-type layer: $Si_2H_6$: 4 sccm, $H_2$: 90 sccm, inner pressure: 0.5 Torr, RF power: 1.7 W, substrate temperature: 300° C., layer thickness: 20 nm Hydrogen plasma treatment: $H_2$: 80 sccm, inner pressure: –2.0 Torr, RF power: 30 W, substrate temperature: 200° C.

p-type layer: $SiH_4$(diluted to 10% by $H_2$): 0.25 sccm, $H_2$: 35 sccm, $BF_3$(diluted to 2% by $H_2$): 2 sccm, inner pressure: 2 Torr, RF power: 30 W, substrate temperature: 200° C.

transparent electrode: $In_2O_3$, reactive evaporation, layer thickness: 70 nm collecting electrode: Cr(100 nm)/Ag(1 $\mu$m)/Cr(100 nm)

TABLE 1-2

| Sample No. | linear irregularities | surface pattern (schematic configuration) | |
|---|---|---|---|
| Substrate Sample Ex. 1-1 | present |  | cross sectional view in a direction perpendicular to the linear irregularities |
| Substrate Sample Comp. 1-1 | none |  | substantially flat |
| Substrate Sample Comp. 1-2 | none | | substantially flat |
| Substrate Sample Comp. 1-3 | none |  | textured |

TABLE 1-3

| Sample No. | Average Mean Particular Size Ratio | Total Reflectance | Diffuse Reflectance |
|---|---|---|---|
| Substrate Sample Ex. 1-2 | 1.0 | 1.0 | 1.0 |
| Substrate Product Sample Comp. 1-4 | 0.87 | 0.98 | 0.72 |
| Substrate Product Sample Comp. 1-5 | 0.89 | 0.98 | 0.72 |
| substrate Product Sample Comp. 1-6 | 0.93 | 0.75 | 0.93 | n-type layer: $SiH_4$: 1 sccm, $H_2$: 45 sccm, $PH_3$(diluted to 1% by $H_2$): 0.5 sscm, inner pressure: 1.2 Torr, RF power: 2 W, substrate temperature: 330° C., layer thickness: 20 nm RFi-type layer: $Si_2H_6$: 4 sccm, $H_2$: 90 sccm, inner pressure: 0.5 Torr, RF power: 1.7 W, substrate temperature: 300° C., layer thickness: 10 nm MWi-type layer: $SiH_4$: 40 sccm, $GeH_4$: 40 sccm, $H_2$: 150 sccm, inner pressure: 8 mTorr, MW power: 200 W, RF bias power: 700 W, substrate temperature: 380° C., layer thickness: 70 nm RFi-type layer: $Si_2H_6$: 4 sccm, $H_2$: 90 sccm, inner pressure: 0.5 Torr, RF power: 1.7 W, substrate temperature: 300° C., layer thickness: 20 nm

TABLE 1-4

| device sample No. | yield | adhesion strength | initial photoelectric conversion efficiency | light degradation (photoelectric conversion efficiency after having endured) | HHRB test (photoelectric conversion efficiency after having endured) | temperature and humidity cycle test (photoelectric conversion efficiency after having endured) |
|---|---|---|---|---|---|---|
| element sample No. Ex. 1-1 | 1.0 | 1.0 | 1.0 | 1.0 | 1.0 | 1.0 |
| element sample comp. 1-1 | 0.87 | 0.84 | 0.91 | 0.92 | 0.88 | 0.87 |
| element sample comp. 1-2 | 0.81 | 0.81 | 0.89 | 0.89 | 0.90 | 0.90 |
| element sample comp. 1-3 | 0.91 | 0.91 | 0.83 | 0.81 | 0.83 | 0.85 |

Table 2-1

SUS treatment: rolling treatment/bright annealing/ annealing/acid-washing skinpass rolling: done/none surface polishing: selected from mechanical polishing (belt polishing/buff polishing/barrel polishing), electrolytic polishing, none polishing surface treatment: RF sputtering with Ar plasma, RF 100 W–600 W, for 2–80 min., substrate temperature: RT-200° C.

Hydrogen plasma treatment: $H_2$: 80 sccm, inner pressure: 2.0 Torr, RF power: 30 W, substrate temperature: 200° C.

p-type layer: $SiH_4$(diluted to 10% by $H_2$): 0.25 sccm, $H_2$: 35 sccm, $BF_3$(diluted to 2% by $H_2$): 2 sccm, inner pressure: 2 Torr, RF power: 30 W, substrate temperature: 200° C.

transparent electrode: $In_2O_3$, reactive evaporation, layer thickness: 70 nm collecting electrode: Cr(100 nm)/ Ag(4 μm)/Cr(100 nm)

TABLE 2-2

| Period Time For The Surface Polishing Treatment[1] (Min.) | Period Of Time For The RF Power Applied In The Surface Etching Treatment | | | | | | | | |
|---|---|---|---|---|---|---|---|---|---|
| | 2 | 5 | 10 | 15 | 20 | 30 | 50 | 70 | 80 |
| 2 | ●56 | | | | | | | ●51 | |
| 5 | | Δ55 | ○49 | ○48 | Δ54 | Δ53 | Δ52 | | |
| 10 | | ○50 | | | ○46 | | ○47 | ●45 | |
| 15 | Δ41 | ○44 | | ○39 | ○38 | | ○42 | ●21 | ●36 |
| 20 | ●19 | ○43 | ○31 | ○30 | ⊙22 | | ○37 | ●20 | ●28 |
| 30 | | ○40 | ○26 | ⊙25 | ⊙23 | ○29 | ○33 | ●11 | |
| 40 | | ○34 | ○18 | ○17 | ○16 | ○24 | ○12 | ●9 | |
| 50 | | Δ35 | Δ32 | Δ27 | ○13 | Δ6 | ○10 | ●2 | |
| 60 | | | | | Δ15 | Δ14 | ○5 | ●1 | |
| 70 | | | | ●4 | Δ7 | ●3 | Δ8 | | |

[1]belt polishing treatment using extra fine abrasive grains.

Table 3-1

SUS treatment: rolling treatment/bright annealing/annealing/acid-washing skinpass rolling: done/none surface polishing: selected from mechanical polishing (belt polishing/buff polishing/barrel polishing), electrolytic polishing, none polishing surface treatment: RF sputtering, RF 100 W~600 W, for 2~80 min., substrate temperature: RT~200° back reflection layer: AlSi: 100 nm, substrate temperature: RT

Hydrogen plasma treatment: $H_2$: 80 sccm, inner pressure: 2.0 Torr, RF power: 30 W, substrate temperature: 200° C.

p-type layer: $SiH_4$(diluted to 10% by $H_2$): 0.25 sccm, $H_2$: 35 sccm, $BF_3$(diluted to 2% by $H_2$): 2 sccm, inner pressure: 2 Torr, RF power: 30 W, substrate temperature: 200° C.

transparent electrode: $In_2O_3$, reactive evaporation, layer thickness: 70 nm collecting electrode: Cr(100 nm)/Ag(1 μm)/Cr(100 nm)

TABLE 3-2

| Period Time For The Surface Polishing Treatment:[2/] (min.) | Period Of Time For The RF Power Applied In The Surface Etching Treatment | | | | | | | | |
|---|---|---|---|---|---|---|---|---|---|
| | 2 | 5 | 10 | 15 | 20 | 30 | 50 | 70 | 80 |
| 2 | ●49 | | | | | | Δ47 | ●41 | ●46 |
| 5 | | | ○45 | | Δ48 | ○43 | ○42 | ●31 | |
| 10 | | Δ40 | | ○44 | ○34 | ○38 | ○32 | ●27 | |
| 15 | | | ○37 | | ○39 | ○26 | ○33 | ○28 | ●25 |
| 20 | ●19 | Δ36 | ○35 | | | ○21 | ○17 | ●20 | |
| 30 | | Δ30 | ○29 | ○23 | ○22 | | ○14 | ●13 | |
| 40 | | Δ24 | | | ○18 | ○15 | ○10 | ●7 | |
| 50 | | | Δ12 | Δ16 | Δ11 | ○8 | ●3 | | |
| 60 | | | | | | ●5 | ●6 | ●2 | |
| 70 | | | ●9 | | ●4 | | | | ●1 |

[1]belt polishing treatment using extra fine abrasive grains transparent and electronically conductive layer: ZnO: 1 μm, substrate temperature: 300° C.

n-type layer: $SiH_4$: 1 sccm, $H_2$: 50 sccm $PH_3$(diluted to 1% by $H_2$): 0.5 sccm, inner pressure: 1.2 Torr, RF power: 2 W substrate temperature: 330° C., layer thickness: 20 nm RFi-type layer: $Si_2H_6$: 4 sccm, $H_2$: 90 sccm, inner pressure: 0.5 Torr, RF power: 1.7 W, substrate temperature: 300° C., layer thickness: 10 nm MWi-type layer: $SiH_4$: 50 sccm, $GeH_4$: 50 sccm, $H_2$: 200 sccm inner pressure: 8 mTorr, MW power: 200 W, RF bias power: 700 W, Substrate temperature: 380° C., layer thickness: 70 nm RFi-type layer: $Si_2H_6$: 4 sccm, $H_2$: 90 sccm, inner pressure: 0.5 Torr, RF power: 1.7 W, substrate temperature: 300° C., layer thickness: 20 nm Table 4-1

SUS treatment: rolling treatment/bright annealing/acid-washing skinpass rolling: done/none surface polishing: none polishing surface treatment: annealing: 600° C.

back reflection layer: AlTi: 50 nm, substrate temperature: RT transparent and electronically conductive layer: ZnO: 1 μm, substrate temperature: 300° C.

n-type layer: $SiH_4$: 1 sccm, $H_2$: 50 sccm, $PH_3$(diluted to 1% by $H_2$): 0.5 sccm, inner pressure: 1.2 Torr, RF power: 1.5 W, substrate temperature: 330° C., layer thickness: 10 nm RFi-type layer: $Si_2H_6$: 4 sccm, $H_2$: 90 sccm, inner pressure: 0.5 Torr, RF power: 2.0 W, substrate temperature: 300° C., layer thickness: 10 nm MWi-type layer: $SiH_4$: 45 sccm, $GeH_4$: 45 sccm, $H_2$: 250 sccm, inner pressure: 8 MTorr, MW power: 250 W, RF bias power: 700 W, substrate temperature: 380° C., layer thickness: 70 nm RFi-type layer: $Si_2H_6$ : 4 sccm, $H_2$: 90 sccm, inner pressure: 0.5 Torr, RF power: 1.7 W substrate temperature: 300° C., layer thickness: 20 nm Hydrogen plasma treatment: $H_2$: 100 sccm, inner pressure: 2.0 Torr, RF power: 30 W, substrate temperature: 200° C.

p-type layer: $SiH_4$(diluted to 10% by $H_2$): 0.25 sccm, $H_2$: 35 sccm, $BF_3$(diluted to 2% by $H_2$): 2 sccm, inner pressure: 2 Torr, RF power: 30 W, substrate temperature: 200° C.

transparent electrode: $In_2O_3$, reactive evaporation, layer thickness: 70 nm collecting electrode: Cr(100 nm)/Ag(1 μm)/Cr(100 nm)

TABLE 4-2

| Pitch (D) (μM) | 0.2 | 0.4 | 0.5 | 0.9 | 5.0 | 10 | 20 | 21 | 25 | 30 |
|---|---|---|---|---|---|---|---|---|---|---|
| Total Reflectance | 0.87 | 0.90 | 0.98 | 0.99 | 1.0 | 1.01 | 0.98 | 0.96 | 0.95 | 0.96 |
| Diffuse Reflectance | 0.95 | 0.94 | 0.98 | 0.98 | 1.0 | 0.97 | 0.98 | 0.89 | 0.86 | 0.81 |

TABLE 4-3

| Pitch (D) (μM) | 0.2 | 0.4 | 0.5 | 0.9 | 5.0 | 10 | 20 | 21 | 25 | 30 |
|---|---|---|---|---|---|---|---|---|---|---|
| Yield | 0.85 | 0.89 | 0.98 | 1.01 | 1.0 | 0.99 | 0.98 | 0.85 | 0.82 | 0.80 |

TABLE 4-4

| Pitch (D) (μM) | 0.2 | 0.4 | 0.5 | 0.9 | 5.0 | 10 | 20 | 21 | 25 | 30 |
|---|---|---|---|---|---|---|---|---|---|---|
| HHRB Test | 0.92 | 0.94 | 0.99 | 1.01 | 1.0 | 1.0 | 0.99 | 0.86 | 0.85 | 0.85 |
| Temperature And Humidity Cycle Test | 0.94 | 0.94 | 0.98 | 0.99 | 1.0 | 0.98 | 0.99 | 0.88 | 0.86 | 0.84 |

Table 5-1

SUS treatment: rolling treatment/annealing/acid-washing
skinpass rolling: done/none
surface polishing: none polishing
surface treatment: annealing: 650° C.
back reflection layer: Cu: 50 nm, substrate temperature: RT
transparent and electronically conductive layer: ZnO: 1 μm, substrate temperature: 350° C.

TABLE 5-2

| Length l (μM) | 0 | 0.5 | 1.2 | 3.0 | 5.0 | 15 | 20 | 21 | 23 | 25 |
|---|---|---|---|---|---|---|---|---|---|---|
| Total Reflectance | 0.97 | 0.96 | 1.0 | 0.98 | 1.0 | 1.0 | 0.97 | 0.85 | 0.82 | 0.81 |
| Diffuse Reflectance | 0.97 | 0.97 | 0.98 | 0.99 | 1.0 | 0.98 | 0.93 | 0.93 | 0.91 | 0.92 |

TABLE 5-3

| Length l (μM) | 0 | 0.5 | 1.2 | 3.0 | 5.0 | 15 | 20 | 21 | 23 | 25 |
|---|---|---|---|---|---|---|---|---|---|---|
| Yield | 0.97 | 1.0 | 1.0 | 0.98 | 1.0 | 0.98 | 0.99 | 0.85 | 0.83 | 0.81 |

TABLE 5-4

| Length l (μM) | 0 | 0.5 | 1.2 | 3.0 | 5.0 | 15 | 20 | 21 | 23 | 25 |
|---|---|---|---|---|---|---|---|---|---|---|
| HHRB Test | 0.97 | 0.98 | 1.0 | 0.99 | 1.0 | 0.99 | 0.98 | 0.85 | 0.83 | 0.82 |
| Temperature And Humidity Cycle Test | 1.0 | 1.0 | 0.98 | 0.97 | 1.0 | 0.99 | 0.98 | 0.93 | 0.90 | 0.91 |

TABLE 6-1

| SUS treatment: | | rolling treatment/annealing/acid-washing | |
| skinpass rolling: | | done/none | |
| surface polishing: | | none | |
| surface treatment: | | annealing: 550–650° C. | |
| back reflection layer: | | AlMg: 80 nm, substrate temperature: RT | |
| transparent and electronically conductive layer: | | ZnO: 0.75 μm, substrate temperature: 200° C. | |
| bottom cell | n-type layer: | a-Si layer, thickness: | 20 nm |
| | RFi-type layer: | a-Si layer, thickness: | 10 nm |
| | MWi-type layer: | a-SiGe layer, thickness: | 60 nm |

TABLE 6-1-continued

| | RFi-type layer: | a-Si layer, thickness: | 18 nm |
|---|---|---|---|
| | p-type layer: | μc-Si layer, thickness: | 15 mn |
| middle cell | n-type layer: | a-Si layer, thickness: | 10 nm |
| | RFi-type layer: | a-Si layer, thickness: | 10 nm |
| | MWi-type layer: | a-SiGe layer, thickness: | 50 nm |
| | RFi-type layer: | a-Si layer, thickness: | 18 nm |
| | p-type layer: | μc-Si layer, thickness: | 15 nm |
| top cell | n-type layer: | a-Si layer, thickness: | 10 nm |
| | RFi-type layer: | a-Si layer, thickness: | 90 nm |
| | p-type layer: | μc-Si layer, thickness: | 20 nm |
| transparent electrode: | | ITO layer, thickness: | 75 nm |
| collecting electrode: | | Cu wire, thickness: | 50 μm |

TABLE 6-2

| Length l (μM) | 0 | 0.2 | 1.0 | 2.5 | 5.0 | 13 | 20 | 22 | 24 | 25 |
|---|---|---|---|---|---|---|---|---|---|---|
| Total Reflectance | 0.98 | 0.97 | 0.99 | 0.97 | 1.0 | 0.99 | 1.0 | 0.82 | 0.81 | 0.84 |
| Diffuse Reflectance | 0.98 | 0.98 | 0.99 | 0.99 | 1.0 | 0.97 | 0.99 | 0.89 | 0.86 | 0.87 |

TABLE 6-3

| Length l (μM) | 0 | 0.2 | 1.0 | 2.5 | 5.0 | 13 | 20 | 22 | 24 | 25 |
|---|---|---|---|---|---|---|---|---|---|---|
| Yield | 0.98 | 0.99 | 1.0 | 0.98 | 1.0 | 1.0 | 1.0 | 0.83 | 0.82 | 0.82 |

TABLE 6-4

| Length l (μM) | 0 | 0.2 | 1.0 | 2.5 | 5.0 | 13 | 20 | 22 | 24 | 25 |
|---|---|---|---|---|---|---|---|---|---|---|
| HHRB Test | 0.98 | 0.99 | 0.98 | 1.0 | 1.0 | 0.98 | 0.97 | 0.85 | 0.83 | 0.83 |
| Temperature And Humidity Cycle Test | 0.99 | 1.0 | 0.99 | 0.97 | 1.0 | 0.98 | 0.98 | 0.92 | 0.90 | 0.90 |

Table 7-1

SUS treatment: rolling treatment/bright annealing
skinpass rolling: done
surface polishing: none
surface treatment: dry etching, RF: 200 W, for 5 min., substrate temperature: RT
back reflection layer: AlSiTi: 35 nm, substrate temperature: RT transparent and electronically conductive layer: ZnO: 1 μm,
substrate temperature: 200° C.

TABLE 7-2

| Sample No. | surface pattern (substrate) (schematic configuration) | surface pattern (element) (schematic configuration) |
|---|---|---|
| Substrate Sample Ex. 7-1 | [wavy line with sharp peaks and valleys] | [wavy line with rounded peaks] |
| Substrate Sample Comp. 7-1 | [wavy line with sharp peaks and valleys] | [smooth gentle wave] |

TABLE 7-3

| device sample No. | yield | adhesion strength | initial photoelectric conversion efficiency | light degradation (photoelectric conversion efficiency after having endured) | HHRB test (photoelectric conversion efficiency after having endured) | temperature and humidity cycle test (photoelectric conversion efficiency after having endured) |
|---|---|---|---|---|---|---|
| element sample No. Ex. 7-1 | 1.0 | 1.0 | 1.0 | 1.0 | 1.0 | 1.0 |
| element sample comp. 7-1 | 0.90 | 0.92 | 0.89 | 0.87 | 0.88 | 0.89 |

Table 8-1

SUS treatment: rolling treatment/annealing/acid-washing
skinpass rolling: done/none
surface polishing: none polishing
surface treatment: annealing: 600° C.
back reflection layer: AlSi: 100 nm, substrate temperature: RT
transparent and electronically conductive layer: ZnO: 1 μm,
substrate temperature: 150° C.

$n^+$-type layer: $SiH_4$: 1 sccm, $H_2$: 50 sccm, $PH_3$(diluted to 1% by $R_2$): 3 sccm, inner pressure: 1.2 Torr, RF power: 2 W, substrate temperature: 300° C.

i-type layer(polycrystalline): $SiF_4$: 85 sccm, $H_2$: 150 sccm, Ar: 150 sccm, inner pressure: 0.5 Torr, MW power: 600 W, substrate temperature: 300° C.

p-type layer: $SiH_4$(diluted to 10% by $H_2$): 0.5 sccm, $H_2$: 100 sccm, $BF_3$(diluted to 2% by H2): 0.5 sccm, inner pressure: 2 Torr, RF power: 40 W, substrate temperature: 150° C.

transparent electrode: $In_2O_3$, reactive evaporation, layer thickness: 70 nm collecting electrode: Cr(100 nm)/Ag(4 μm)/Cr(100 nm)

TABLE 8-2

| Length l (μM) | 0 | 0.3 | 1.5 | 5.5 | 7.5 | 18.5 | 20 | 20.5 | 21.5 | 22 |
|---|---|---|---|---|---|---|---|---|---|---|
| Total Reflectance | 0.98 | 0.98 | 0.99 | 1.07 | 1.0 | 0.97 | 0.98 | 0.86 | 0.84 | 0.85 |
| Diffuse Reflectance | 0.98 | 0.97 | 0.97 | 0.96 | 1.0 | 0.99 | 0.97 | 0.92 | 0.90 | 0.88 |

TABLE 8-3

| Length l (μM) | 0 | 0.3 | 1.5 | 5.5 | 7.5 | 18.5 | 20 | 20.5 | 21.5 | 22 |
|---|---|---|---|---|---|---|---|---|---|---|
| Yield | 0.98 | 0.99 | 0.99 | 0.97 | 1.0 | 1.0 | 0.98 | 0.84 | 0.82 | 0.83 |

TABLE 8-4

| Length l (μM) | 0 | 0.3 | 1.5 | 5.5 | 7.5 | 18.5 | 20 | 20.5 | 21.5 | 22 |
|---|---|---|---|---|---|---|---|---|---|---|
| HHRB Test | 0.98 | 0.99 | 0.99 | 1.0 | 1.0 | 0.97 | 0.98 | 0.89 | 0.90 | 0.91 |
| Temperature And Humidity Cycle Test | 0.99 | 0.97 | 0.98 | 0.97 | 1.0 | 1.0 | 0.97 | 0.90 | 0.91 | 0.89 |

What is claimed is:

1. A photovoltaic device comprising an opaque substrate having an irregular surface structure comprising a plurality of linear irregularities or recesses arranged therein and a photoelectric conversion layer formed on said irregular surface structure of said substrate, said plurality of linear irregularities or recesses having a center line average roughness Ra(X) in a range of 15 nm to 300 nm obtained when scanning is conducted in a direction parallel to the linear irregularities or recesses and a center line average roughness Ra(Y) in a range of 20 nm to 600 nm obtained when scanning is conducted in a direction perpendicular to the linear irregularities or recesses wherein a ratio of said Ra(X)/said Ra(Y) is 0.8 or less.

2. A photovoltaic device according to claim 1, wherein the plurality of linear irregularities or recesses are arranged in a linear form arrangement.

3. A photovoltaic device according to claim 2, wherein the plurality of linear irregularities or recesses have a pitch in the range of 0.5 to 20 μm.

4. A photovoltaic device according to claim 2, wherein the plurality of linear irregularities or recesses are arranged along a direction in which a collecting electrode provided over the photoelectric conversion layer is extended.

5. A photovoltaic device according to claim 4, wherein the collecting electrode is provided through a transparent and electrically conductive layer provided on the photoelectric conversion layer.

6. A photovoltaic device according to claim 2, wherein the plurality of linear irregularities or recesses have a pitch in a range of 1 to 15 μm.

7. A photovoltaic device according to claim 1, wherein the plurality of linear irregularities or recesses are arranged in a wave-like form arrangement.

8. A photovoltaic device according to claim 1, wherein the plurality of linear irregularities or recesses are arranged in a spiral form arrangement.

9. A photovoltaic device according to claim 1, wherein the irregular surface structure comprises a plurality of first linear irregularities or recesses arranged in a linear form arrangement and a plurality of second linear irregularities or recesses arranged in a direction perpendicular to said first linear irregularities or recesses.

10. A photovoltaic device according to claim 9, wherein the second linear irregularities or recesses are of 20 μm or less in length.

11. A photovoltaic device according to claim 1, wherein the opaque substrate is composed of a metallic material or an alloy material.

12. A photovoltaic device according to claim 1, wherein the opaque substrate has flexibility.

13. A photovoltaic device according to claim 1 which further comprises a back reflection layer interposed between the opaque substrate and the photoelectric conversion layer.

14. A photovoltaic device according to claim 13, wherein the back reflection layer contains at least an element selected from the group consisting of Au, Ag, Cu, Al and Mg.

15. A photovoltaic device according to claim 14 which further comprises a transparent and electrically conductive layer interposed between the back reflection layer and the photoelectric conversion layer.

16. A photovoltaic device according to claim 15, wherein the transparent and electrically conductive layer comprises a zinc oxide.

17. A photovoltaic device according to claim 14, wherein the back reflection layer further contains Si.

18. A photovoltaic device according to claim 13, wherein the back reflect ion layer has a multi-layered structure.

19. A photovoltaic device according to claim 1, wherein the photoelectric conversion layer has an irregular surface structure comprising a plurality of linear irregularities or recesses arranged therein.

20. A photovoltaic device according to claim 1, wherein the photoelectric conversion layer has a multi-layered structure.

21. A photovoltaic device according to claim 1, wherein the photoelectric conversion layer comprises a non-single crystalline semiconductor material.

22. A photovoltaic device according to claim 1, wherein the opaque substrate has a long length.

23. A photovoltaic device according to claim 1, wherein the plurality of linear irregularities or recesses are such that when a center line average roughness obtained when scanning is conducted in a direction parallel to the linear irregularities or recesses is represented by Ra(X) and a center line average roughness obtained when scanning is conducted in a direction perpendicular to the linear irregularities or recesses is represented by Ra(Y), said Ra(X) is in a range of 20 nm to 200 nm, and said Ra(Y) is in a range of 40 nm to 400 nm.

24. A photovoltaic device according to claim 1, wherein the plurality of linear irregularities or recesses are such that when a center line average roughness obtained when scanning is conducted in a direction parallel to the linear irregularities or recesses is represented by Ra(X) and a center line average roughness obtained when scanning is conducted in a direction perpendicular to the linear irregularities or recesses is represented by Ra(Y), said Ra(X) is in a range of 25 nm to 150 nm, and said Ra(Y) is in a range of 60 nm to 300 nm.

25. A process for producing a photovoltaic device, including the steps of:

accommodating a long opaque substrate having an irregular surface structure comprising a plurality of linear irregularities or recesses in a roll form, said plurality of linear irregularities or recesses having a center line average roughness Ra(X) in a range of 15 nm to 300 nm obtained when scanning is conducted in a direction parallel to the linear irregularities or recesses and a center line average roughness Ra(Y) in a range of 20 nm to 600 nm obtained when scanning is conducted in a direction perpendicular to the linear irregularities or recesses wherein a ratio of said Ra(X)/said Ra(Y) is 0.8 or less;

sequentially delivering said substrate to form a photoelectric conversion layer thereon; and accommodating said substrate having said photoelectric conversion layer formed thereon in a roll form.

26. The process according to claim 25, wherein the plurality of linear irregularities or recesses are arranged in a linear form arrangement.

27. The process according to claim 26, wherein the plurality of linear irregularities or recesses have a pitch in a range of 1 to 15 $\mu$m.

28. The process according to claim 25, wherein the plurality of linear irregularities or recesses are arranged in a wave-like form arrangement.

29. The process according to claim 25, wherein the plurality of linear irregularities or recesses are arranged in a spiral form arrangement.

30. The process according to claim 25, wherein the irregular surface structure comprises a plurality of first linear irregularities or recesses arranged in a linear form arrangement and a plurality of second linear irregularities or recesses arranged in a direction perpendicular to said first linear irregularities or recesses.

31. The process according to claim 30, wherein the second linear irregularities or recesses are of 20 $\mu$m or less in length.

32. The process according to claim 25, wherein the opaque substrate is composed of a metallic material or an alloy material.

33. The process according to claim 25, further comprising a step of forming a back reflection layer on the opaque substrate prior to forming the photoelectric conversion layer.

34. The process according to claim 33, wherein the back reflection layer formed contains at least an element selected from the group consisting of Au, Ag, Cu, Al and Mg.

35. The process according to claim 34, wherein the back reflection layer further contains Si.

36. The process according to claim 33, wherein a plurality of layers are formed as the back reflection layer.

37. The process according to claim 33, further comprising a step of forming a transparent and electrically conductive layer prior to forming the back reflection layer on the photoelectric conversion layer.

38. The process according to claim 37, wherein the transparent and electrically conductive layer formed comprises a zinc oxide.

39. The process according to claim 25, wherein the photoelectric conversion layer formed has an irregular surface structure comprising a plurality of linear irregularities or recesses arranged therein.

40. The process according to claim 39, further comprising a step of forming a collecting electrode on the photoelectric conversion layer, said collecting electrode being arranged to extend along a direction in which the plurality of linear irregularities or recesses are arranged on the surface of the photoelectric conversion layer.

41. The process according to claim 40, further comprising a step of forming a transparent and electrically conductive layer on the photoelectric conversion layer prior to forming the collecting electrode on the photoelectric conversion layer.

42. The process according to claim 25, wherein the photoelectric conversion layer is formed by passing the opaque substrate through a plurality of deposition chambers.

43. The process according to claim 25, wherein the photoelectric conversion layer formed comprises a non-single crystalline semiconductor material.

* * * * *

UNITED STATES PATENT AND TRADEMARK OFFICE
CERTIFICATE OF CORRECTION

PATENT NO.   :   6,072,117
DATED        :   June 6, 2000
INVENTOR(S)  :   JINSHO MATSUYAMA ET AL.

It is certified that error appears in the above-identified patent and that said Letters Patent is hereby corrected as shown below:

COLUMN 2:

Line 62, "rise" should read --raise--.

COLUMN 8:

Line 35, "an irregular" should read --¶ an irregular--.

COLUMN 11:

Line 27, "patten" should read --pattern--.

COLUMN 19:

Line 45, "may" should read --may be--.

COLUMN 22:

Line 37, "eletrode)" should read --electrode)--.

COLUMN 25:

Line 12, "the the" should read --the--.

COLUMN 26:

Line 5, "603such" should read --603 such--; and
   Line 26, "Mw" should read --MW--.

COLUMN 27:

Line 29, "evapoation" should read --evaporation
      process.--; and
   Line 54, "procedures," should read --procedures--.

UNITED STATES PATENT AND TRADEMARK OFFICE
CERTIFICATE OF CORRECTION

PATENT NO. : 6,072,117
DATED : June 6, 2000
INVENTOR(S) : JINSHO MATSUYAMA ET AL.

It is certified that error appears in the above-identified patent and that said Letters Patent is hereby corrected as shown below:

COLUMN 34:

Line 30, "300=m," should read --300 nm--.

COLUMN 39:

Line 44, "3-1" should read --3-(1)--.

COLUMN 40:

Line 33, "FIGS. 3(a)" should read --FIG. 3(a)--.

COLUMN 41:

Line 33, "made" should read --be made--.

COLUMN 43:

Line 13, "were" should read --was--; and
    Line 14, "were" should read --was--.

COLUMN 46:

Line 15, "resistance" should read --resistance caused--.

COLUMN 47:

Line 24, "RAM" should read --RA(X)--.

UNITED STATES PATENT AND TRADEMARK OFFICE
CERTIFICATE OF CORRECTION

PATENT NO.   : 6,072,117
DATED        : June 6, 2000
INVENTOR(S)  : JINSHO MATSUYAMA ET AL.

It is certified that error appears in the above-identified patent and that said Letters Patent is hereby corrected as shown below:

COLUMN 48:

Line 22, "length (is" should read --length 1 is--;
    Line 33, "annealing skin" should read --annealing
        ¶ skin--;
    Line 34, "done surface" should read --done ¶ surface--;
    Line 34, and "none surface" should read --none
        ¶ surface--;
    Line 36, "sec. back" should read --sec. ¶ back--;
    Line 41, "H2):" should read --$H_2$):--; and
    Line 55, "-2.0 Torr," should read --2.0 Torr,--.

COLUMN 49:

Table 1-3, "substrate" should read --Substrate--; and
    Line 66, "W-600W, for 2-80 min.," should read --W~600W,
        for 2~80 min.,--; and
    Line 67, "RT-200°C." should read --RT~200°C--.

COLUMN 50:

Table 1-2, "cress sectional" should read --cross-
        sectional--; and
    Line 67, "Ag(4μm)" should read --Ag (1μm)--.

COLUMN 51:

Line 27, "RT~200°" should read --RT~200°C--;
    Line 53, "2W" should read --2 W,--;
    Line 61, "sccm inner" should read --sccm ¶ inner--; and
    Line 62, "Substrate" should read --substrate--.

UNITED STATES PATENT AND TRADEMARK OFFICE
CERTIFICATE OF CORRECTION

PATENT NO.   : 6,072,117
DATED        : June 6, 2000
INVENTOR(S)  : JINSHO MATSUYAMA ET AL.

It is certified that error appears in the above-identified patent and that said Letters Patent is hereby corrected as shown below:

COLUMN 52:

Table 3-2, "021" should read --⊙21--, "022" should read --⊙-- and "1/belt" should read --2/belt--.

COLUMN 53:

Line 6, "1.7W" should read --1.7W,--.

COLUMN 54:

Table 4-2, "(D)" should read --(d)--;
Table 4-3, "(D)" should read --(d)--;
Table 4-4, "(D)" should read --(d)--;
Table 4-2, "(μM)" should read --(μm)--;
Table 4-3, "(μM)" should read --(μm)--;
Table 4-4, "(μM)" should read --(μm)--; and
Table 5-2, "(μM)" should read --(μm)--.

UNITED STATES PATENT AND TRADEMARK OFFICE
CERTIFICATE OF CORRECTION

PATENT NO. : 6,072,117
DATED : June 6, 2000
INVENTOR(S) : JINSHO MATSUYAMA ET AL.

It is certified that error appears in the above-identified patent and that said Letters Patent is hereby corrected as shown below:

COLUMN 55:

Table 5-3, "($\mu$M)" should read --($\mu$m)--;
Table 5-4, "($\mu$M)" should read --($\mu$m)--;
Line 26, "550-650°C"should read --550-650°C--;
Line 27, "substrate" should read --substrate temperature: RT--;
Line 28, "temperature: RT" --should be deleted--;
Line 29, "transparent and electronically" should read --transparent and electronically conductive layer:--; and "temperature:" should read --temperature: 200°C.--;
Line 30, "conductive layer: 200°C." should be deleted
Table 6-2, "($\mu$M)" should read --($\mu$m)--;
Table 6-3, "($\mu$M)" should read --($\mu$m)--; and
Table 6-4, "($\mu$M)" should read --($\mu$m)--.

COLUMN 57:

Line 9, "RT transparent" should read --RT ¶ transparent--;
Line 10, "1$\mu$m" should read --1$\mu$m, substrate temperature: 200°C.--;
Line 11, "substrate temperature:200°C." should be deleted;
Line 65, "$\mu$m," should read --$\mu$m, substrate temperature:150°C.--; and
Line 66, "substrate temperature:150°C" should be deleted.

UNITED STATES PATENT AND TRADEMARK OFFICE
CERTIFICATE OF CORRECTION

PATENT NO. : 6,072,117
DATED : June 6, 2000
INVENTOR(S) : JINSHO MATSUYAMA ET AL.

It is certified that error appears in the above-identified patent and that said Letters Patent is hereby corrected as shown below:

<u>COLUMN 58</u>:

Line 66, "Ag(4μum)" should read --Ag(1μm)--.

<u>COLUMN 59</u>:

Table 8-2,"(μM)" should read --(μm)--;
    Table 8-3,"(μM)" should read --(μm)--; and
    Table 8-4,"(μM)" should read --(μm)--.

<u>Column 60</u>:

Line 55, "reflect ion" should read --reflection--.

Signed and Sealed this

Twenty-second Day of May, 2001

*Attest:*

NICHOLAS P. GODICI

*Attesting Officer*    *Acting Director of the United States Patent and Trademark Office*